(12) United States Patent
Yamazaki et al.

(10) Patent No.: US 9,559,316 B2
(45) Date of Patent: Jan. 31, 2017

(54) DISPLAY DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Masakatsu Ohno, Utsunomiya (JP); Hiroki Adachi, Tochigi (JP); Satoru Idojiri, Tochigi (JP); Koichi Takeshima, Sano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/145,246

(22) Filed: May 3, 2016

(65) Prior Publication Data

US 2016/0247868 A1    Aug. 25, 2016

Related U.S. Application Data

(63) Continuation of application No. 14/553,251, filed on Nov. 25, 2014, now Pat. No. 9,437,831.

(30) Foreign Application Priority Data

Dec. 2, 2013  (JP) .................................. 2013-249631
Dec. 12, 2013 (JP) .................................. 2013-256872

(Continued)

(51) Int. Cl.
*H01L 21/00* (2006.01)
*H01L 51/00* (2006.01)
(Continued)

(52) U.S. Cl.
CPC ........... *H01L 51/0097* (2013.01); *B23K 26/04* (2013.01); *B23K 26/0617* (2013.01);
(Continued)

(58) Field of Classification Search
CPC ............ H01L 51/0097; H01L 27/1266; H01L 27/1225
(Continued)

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

CN   001199507 A   11/1998
CN   001397984 A   2/2003
(Continued)

OTHER PUBLICATIONS

Japanese Office Action (Application No. 2016-088081) Dated Oct. 11, 2016.
(Continued)

*Primary Examiner* — Anthony Ho
(74) *Attorney, Agent, or Firm* — Robinson Intellectual Property Law Office; Eric J. Robinson

(57) ABSTRACT

A first organic resin layer is formed over a first substrate; a first insulating film is formed over the first organic resin layer; a first element layer is formed over the first insulating film; a second organic resin layer is formed over a second substrate; a second insulating film is formed over the second organic resin layer; a second element layer is formed over the second insulating film; the first substrate and the second substrate are bonded; a first separation step in which adhesion between the first organic resin layer and the first substrate is reduced; the first organic resin layer and a first flexible substrate are bonded with a first bonding layer; a second separation step in which adhesion between the second organic resin layer and the second substrate is
(Continued)

reduced; and the second organic resin layer and a second flexible substrate are bonded with a second bonding layer.

56 Claims, 44 Drawing Sheets

(30) Foreign Application Priority Data

Dec. 27, 2013 (JP) .................. 2013-272176
Mar. 11, 2014 (JP) .................. 2014-047348

(51) Int. Cl.
| | |
|---|---|
| H01L 51/56 | (2006.01) |
| H01L 51/52 | (2006.01) |
| H01L 29/24 | (2006.01) |
| H01L 29/66 | (2006.01) |
| H01L 29/786 | (2006.01) |
| B23K 26/04 | (2014.01) |
| B23K 26/06 | (2014.01) |
| B23K 26/08 | (2014.01) |
| H01L 27/12 | (2006.01) |
| H01L 51/50 | (2006.01) |
| H01L 41/314 | (2013.01) |
| H01L 27/32 | (2006.01) |

(52) U.S. Cl.
CPC ...... *B23K 26/0622* (2015.10); *B23K 26/0643* (2013.01); *B23K 26/0648* (2013.01); *B23K 26/083* (2013.01); *H01L 27/1225* (2013.01); *H01L 27/1266* (2013.01); *H01L 27/3258* (2013.01); *H01L 27/3262* (2013.01); *H01L 29/24* (2013.01); *H01L 29/66969* (2013.01); *H01L 29/7869* (2013.01); *H01L 29/78603* (2013.01); *H01L 51/003* (2013.01); *H01L 51/0027* (2013.01); *H01L 51/5246* (2013.01); *H01L 51/5253* (2013.01); *H01L 51/56* (2013.01); *H01L 27/322* (2013.01); *H01L 27/3244* (2013.01); *H01L 41/314* (2013.01); *H01L 51/0024* (2013.01); *H01L 51/5096* (2013.01); *H01L 51/5284* (2013.01); *H01L 2227/323* (2013.01); *H01L 2227/326* (2013.01); *H01L 2251/5338* (2013.01); *H01L 2251/558* (2013.01); *Y02E 10/549* (2013.01); *Y02P 70/521* (2015.11)

(58) Field of Classification Search
USPC .......................................................... 438/23
See application file for complete search history.

(56) References Cited

U.S. PATENT DOCUMENTS

| | | | |
|---|---|---|---|
| 5,952,708 | A | 9/1999 | Yamazaki |
| 5,969,463 | A | 10/1999 | Tomita et al. |
| 5,990,542 | A | 11/1999 | Yamazaki |
| 6,127,199 | A | 10/2000 | Inoue et al. |
| 6,294,274 | B1 | 9/2001 | Kawazoe et al. |
| 6,372,608 | B1 | 4/2002 | Shimoda et al. |
| 6,521,511 | B1 | 2/2003 | Inoue et al. |
| 6,563,174 | B2 | 5/2003 | Kawasaki et al. |
| 6,645,830 | B2 | 11/2003 | Shimoda et al. |
| RE38,466 | E | 3/2004 | Inoue et al. |
| 6,707,614 | B2 | 3/2004 | Tanaka |
| 6,727,522 | B1 | 4/2004 | Kawasaki et al. |
| 6,818,530 | B2 | 11/2004 | Shimoda et al. |
| 6,870,125 | B2 | 3/2005 | Doi et al. |
| 6,946,361 | B2 | 9/2005 | Takayama et al. |
| 7,049,190 | B2 | 5/2006 | Takeda et al. |
| 7,050,835 | B2 | 5/2006 | Hack et al. |
| 7,061,014 | B2 | 6/2006 | Hosono et al. |
| 7,064,346 | B2 | 6/2006 | Kawasaki et al. |
| 7,094,665 | B2 | 8/2006 | Shimoda et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,285,476 | B2 | 10/2007 | Shimoda et al. |
| 7,297,977 | B2 | 11/2007 | Hoffman et al. |
| 7,323,356 | B2 | 1/2008 | Hosono et al. |
| 7,335,573 | B2 | 2/2008 | Takayama et al. |
| 7,361,573 | B2 | 4/2008 | Takayama et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| RE40,601 | E | 12/2008 | Inoue et al. |
| 7,462,862 | B2 | 12/2008 | Hoffman et al. |
| 7,468,304 | B2 | 12/2008 | Kaji et al. |
| 7,468,308 | B2 | 12/2008 | Shimoda |
| 7,473,928 | B1 | 1/2009 | Yamazaki et al. |
| 7,501,293 | B2 | 3/2009 | Ito et al. |
| 7,591,863 | B2 | 9/2009 | Watanabe et al. |
| 7,655,881 | B2 | 2/2010 | Tanaka |
| 7,674,650 | B2 | 3/2010 | Akimoto et al. |
| 7,709,309 | B2 | 5/2010 | Moriwaka |
| 7,726,013 | B2 | 6/2010 | Kimura |
| 7,732,819 | B2 | 6/2010 | Akimoto et al. |
| 7,791,072 | B2 | 9/2010 | Kumomi et al. |
| 7,833,871 | B2 | 11/2010 | Kawakami et al. |
| 7,968,388 | B2 | 6/2011 | Komatsu |
| 8,043,936 | B2 | 10/2011 | Eguchi et al. |
| 8,048,770 | B2 | 11/2011 | Eguchi et al. |
| 8,048,777 | B2 | 11/2011 | Eguchi et al. |
| 8,058,709 | B2 | 11/2011 | Moriwaka |
| 8,110,442 | B2 | 2/2012 | Jinbo |
| 8,123,896 | B2 | 2/2012 | Watanabe et al. |
| 8,199,269 | B2 | 6/2012 | Hattori et al. |
| 8,202,365 | B2 | 6/2012 | Umeda et al. |
| 8,211,725 | B2 | 7/2012 | Park et al. |
| 8,222,092 | B2 | 7/2012 | Yamazaki et al. |
| 8,237,166 | B2 | 8/2012 | Kumomi et al. |
| 8,274,079 | B2 | 9/2012 | Yamazaki |
| 8,299,553 | B2 | 10/2012 | Kawakami et al. |
| 8,367,440 | B2 | 2/2013 | Takayama et al. |
| 8,415,208 | B2 | 4/2013 | Takayama et al. |
| 8,597,965 | B2 | 12/2013 | Hatano et al. |
| 8,629,522 | B2 | 1/2014 | Kawakami et al. |
| 8,674,354 | B2 | 3/2014 | Yamazaki |
| 8,698,156 | B2 | 4/2014 | Watanabe et al. |
| 8,816,349 | B2 | 8/2014 | Yamazaki et al. |
| 8,878,180 | B2 | 11/2014 | Yamazaki |
| 8,969,128 | B2 | 3/2015 | Cho et al. |
| 9,054,141 | B2 | 6/2015 | Eguchi et al. |
| 9,268,162 | B2 | 2/2016 | Haskal |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2002/0146893 | A1 | 10/2002 | Shimoda et al. |
| 2003/0032210 | A1 | 2/2003 | Takayama et al. |
| 2003/0144034 | A1 | 7/2003 | Hack et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0209442 | A1 | 10/2004 | Takakuwa et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |

(56) References Cited

U.S. PATENT DOCUMENTS

| | | |
|---|---|---|
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042168 A1 | 2/2008 | Watanabe et al. |
| 2008/0049437 A1 | 2/2008 | Takayama et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0132033 A1 | 6/2008 | Eguchi et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0023251 A1 | 1/2009 | Eguchi et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239320 A1 | 9/2009 | Takayama et al. |
| 2009/0269621 A1 | 10/2009 | Lifka et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0073615 A1 | 3/2010 | Yaguchi et al. |
| 2010/0092800 A1 | 4/2010 | Itagaki et al. |
| 2010/0109002 A1 | 5/2010 | Itagaki et al. |
| 2010/0163868 A1 | 7/2010 | Yamazaki et al. |
| 2011/0084267 A1 | 4/2011 | Yamazaki et al. |
| 2011/0156062 A1 | 6/2011 | Kim et al. |
| 2011/0193077 A1 | 8/2011 | Yamazaki |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2011/0294244 A1 | 12/2011 | Hattori et al. |
| 2012/0034451 A1 | 2/2012 | Seo et al. |
| 2012/0045861 A1 | 2/2012 | Eguchi et al. |
| 2012/0228617 A1 | 9/2012 | Ko et al. |
| 2012/0280229 A1 | 11/2012 | Suzuki et al. |
| 2013/0069059 A1 | 3/2013 | Yamazaki |
| 2013/0214324 A1 | 8/2013 | Takayama et al. |
| 2013/0341629 A1 | 12/2013 | Seo et al. |
| 2014/0113440 A1 | 4/2014 | Tanaka et al. |
| 2014/0213071 A1 | 7/2014 | Kawakami et al. |
| 2014/0220745 A1 | 8/2014 | Watanabe et al. |
| 2014/0234664 A1 | 8/2014 | Yasumoto et al. |
| 2014/0339517 A1 | 11/2014 | Park et al. |
| 2014/0347490 A1 | 11/2014 | Takayama et al. |
| 2014/0370706 A1 | 12/2014 | Yamazaki et al. |
| 2015/0017751 A1 | 1/2015 | Eguchi et al. |
| 2015/0060778 A1 | 3/2015 | Kim et al. |
| 2015/0151514 A1 | 6/2015 | Kikuchi et al. |
| 2015/0210048 A1 | 7/2015 | Jeong et al. |
| 2015/0303408 A1 | 10/2015 | Lee et al. |

FOREIGN PATENT DOCUMENTS

| | | |
|---|---|---|
| CN | 101097867 A | 1/2008 |
| CN | 101154562 A | 4/2008 |
| CN | 101794737 A | 8/2010 |
| DE | 69737086 | 5/2007 |
| EP | 0858110 A | 8/1998 |
| EP | 1351308 A | 10/2003 |
| EP | 1655633 A | 5/2006 |
| EP | 1737044 A | 12/2006 |
| EP | 1744365 A | 1/2007 |
| EP | 1758169 A | 2/2007 |
| EP | 2226847 A | 9/2010 |
| EP | 2262205 A | 12/2010 |
| EP | 2571043 A | 3/2013 |
| EP | 2928162 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-125929 A | 5/1998 |
| JP | 11-505377 | 5/1999 |
| JP | 2000-044236 A | 2/2000 |
| JP | 2000-150900 A | 5/2000 |
| JP | 2002-033464 A | 1/2002 |
| JP | 2002-041220 A | 2/2002 |
| JP | 2002-076356 A | 3/2002 |
| JP | 2002-289859 A | 10/2002 |
| JP | 2003-068668 A | 3/2003 |
| JP | 2003-086000 A | 3/2003 |
| JP | 2003-086808 A | 3/2003 |
| JP | 2003-168820 A | 6/2003 |
| JP | 2003-174153 A | 6/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-287068 A | 10/2006 |
| JP | 2007-288127 A | 11/2007 |
| JP | 2008-145173 A | 6/2008 |
| JP | 2008-294379 A | 12/2008 |
| JP | 2009-021322 A | 1/2009 |
| JP | 2009-043962 A | 2/2009 |
| JP | 2009-167087 A | 7/2009 |
| JP | 2009-186916 A | 8/2009 |
| JP | 2009-252796 A | 10/2009 |
| JP | 2009-278124 A | 11/2009 |
| JP | 2010-072529 A | 4/2010 |
| JP | 2010-105012 A | 5/2010 |
| JP | 2010-129403 A | 6/2010 |
| JP | 2010-252356 A | 11/2010 |
| JP | 2011-228715 A | 11/2011 |
| JP | 2011-248072 A | 12/2011 |
| JP | 2012-027177 A | 2/2012 |
| JP | 2012-119703 A | 6/2012 |
| JP | 2012-186482 A | 9/2012 |
| JP | 2012-253014 A | 12/2012 |
| JP | 2013-038229 A | 2/2013 |
| JP | 2013-058758 A | 3/2013 |
| JP | 2013-122598 A | 6/2013 |

(56) References Cited

FOREIGN PATENT DOCUMENTS

| JP | 2013-232657 A | 11/2013 |
|---|---|---|
| KR | 2003-0007208 A | 1/2003 |
| KR | 10-0500520 | 7/2005 |
| KR | 2008-0029887 A | 4/2008 |
| KR | 2010-0076894 A | 7/2010 |
| KR | 2012-0117914 A | 10/2012 |
| TW | 564471 | 12/2003 |
| TW | 200913236 | 3/2009 |
| TW | 201041050 | 11/2010 |
| TW | 201131779 | 9/2011 |
| TW | 201203544 | 1/2012 |
| WO | WO-98/09333 | 3/1998 |
| WO | WO-03/050963 | 6/2003 |
| WO | WO-2004/114391 | 12/2004 |
| WO | WO-2007/046290 | 4/2007 |
| WO | WO-2011/043194 | 4/2011 |
| WO | WO-2011/096263 | 8/2011 |
| WO | WO-2011/142089 | 11/2011 |
| WO | WO-2013/035298 | 3/2013 |

OTHER PUBLICATIONS

Japanese Office Action (Application No. 2016-088690) Dated Oct. 11, 2016.
Japanese Office Action (Application No. 2016-172446) Dated Oct. 11, 2016.
Japanese Office Action (Application No. 2016-172447) Dated Oct. 11, 2016.
Japanese Office Action (Application No. 2016-172449) Dated Oct. 11, 2016.
Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using Castep", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In-Ga-Zn-Oxide-TFT", SID Digest '09 : SID International Symposium Digest of Technical Papers, May 31, 2009, pp. 1110-1112.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3-Ga2ZnO4-ZnO system at 1350°C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B) Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-202106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2014/066220) Dated May 19, 2015.
Written Opinion (Application No. PCT/IB2014/066220) Dated May 19, 2015.
French.I et al., "54.2: Thin Plastic Electrophoretic Displays Fabricated by a Novel Process", SID Digest '05 : SID International Symposium Digest of Technical Papers, May 24, 2005, vol. 36, pp. 1634-1637.
Lifka.H et al., "53.4: Ultra-Thin Flexible OLED Device Herbert Lifka, Cristina Tanase, Dave McCulloch, and Peter van de Weijer", SID Digest '07 : SID International Symposium Digest of Technical Papers, May 22, 2007, vol. 38, pp. 1599-1602.

(56) References Cited

OTHER PUBLICATIONS

French.I et al., "58.4: Invited Paper: Flexible Displays and Electronics Made in AM-LCD Facilities by the EPLaRTM Process", SID Digest '07 : SID International Symposium Digest of Technical Papers, May 22, 2007, vol. 38, pp. 1680-1683.

Delmdahl.R et al., "Large-area laser-lift-off processing in microelectronics", Physics Procedia, Apr. 9, 2013, vol. 41, pp. 241-248, Elsevier.

Japanese Office Action (Application No. 2016-084926) Dated Nov. 1, 2016.

Japanese Office Action (Application No. 2016-087198) Dated Nov. 1, 2016.

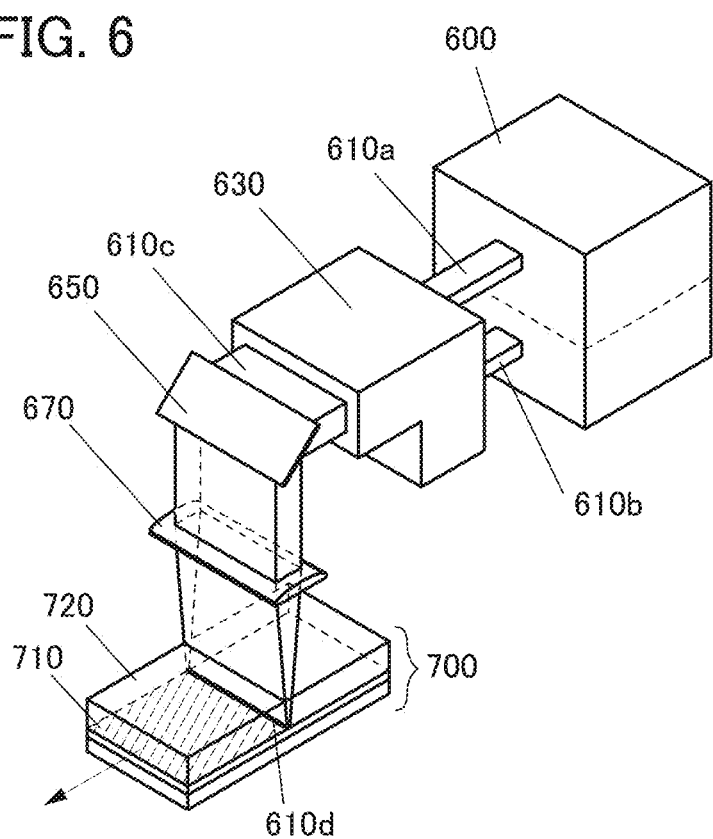

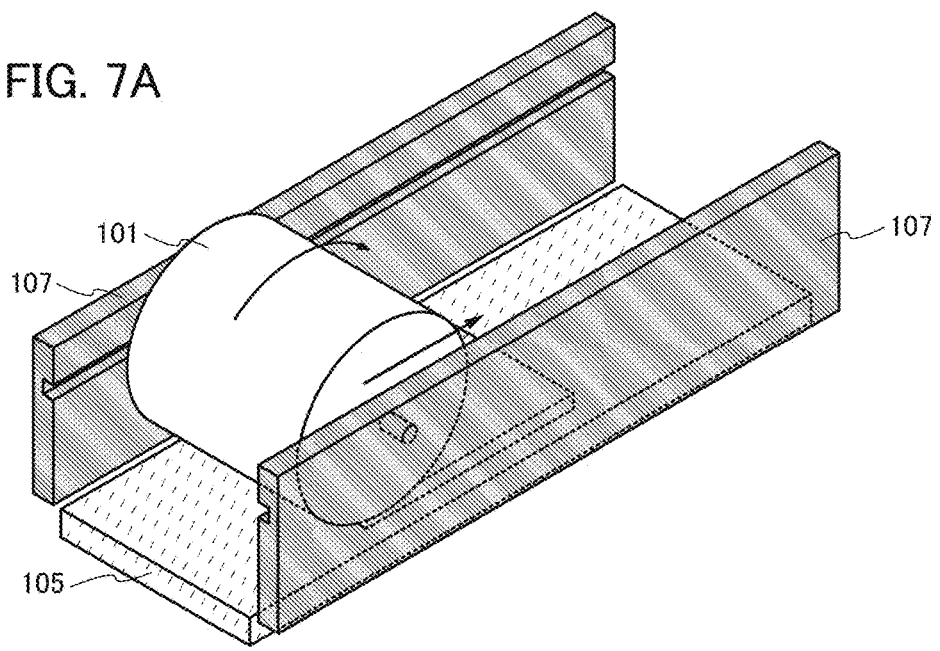
FIG. 7A
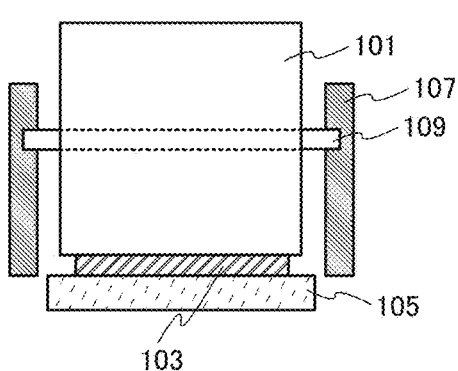
FIG. 7B
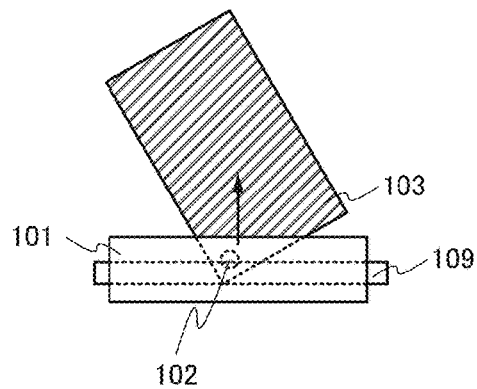
FIG. 7C
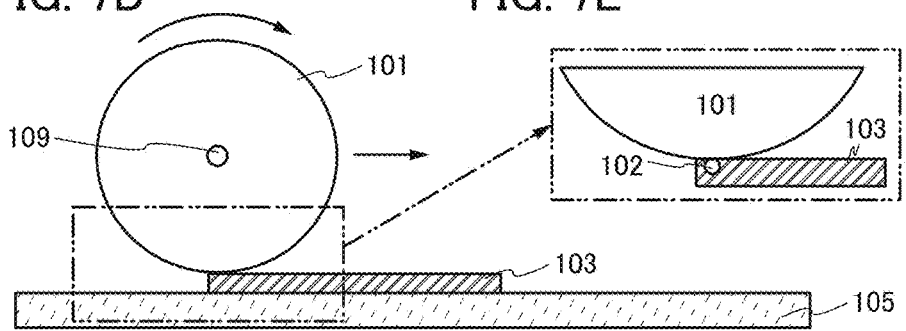
FIG. 7D
FIG. 7E FIG. 12A
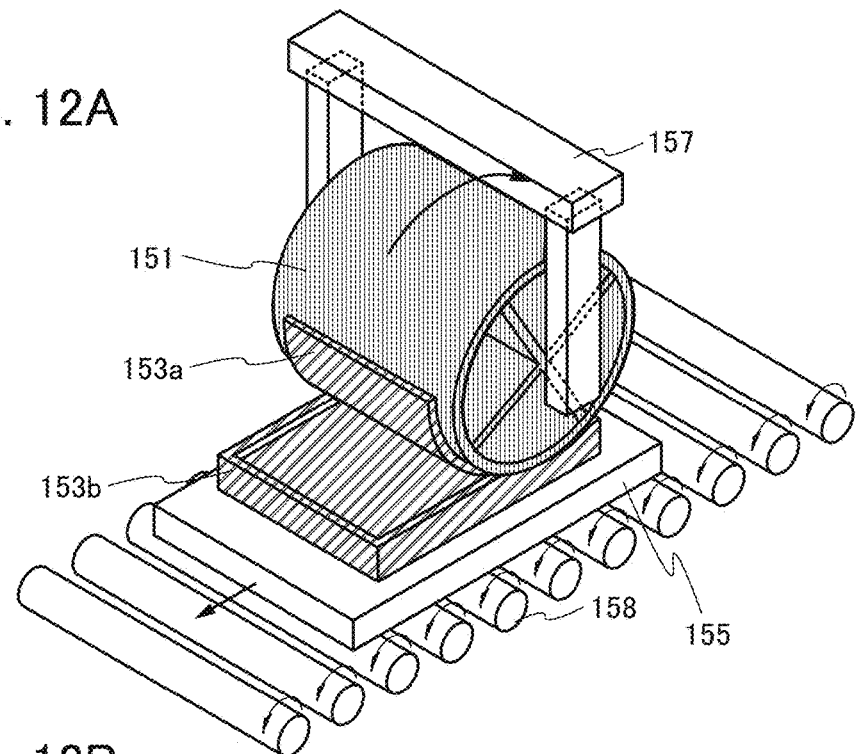
FIG. 12B
FIG. 12C
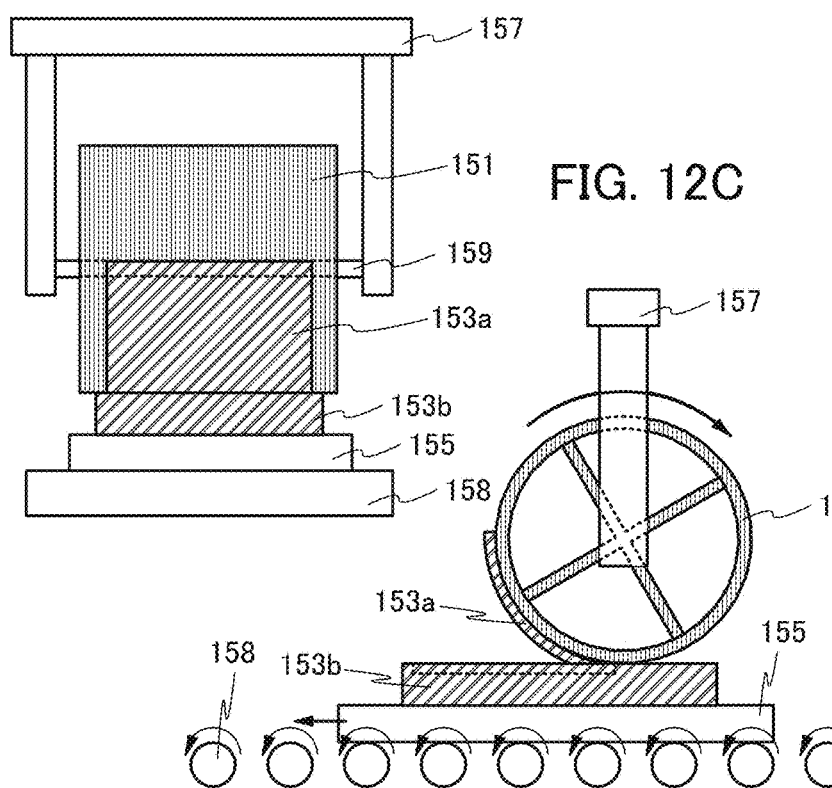

FIG. 15A1 FIG. 15A2
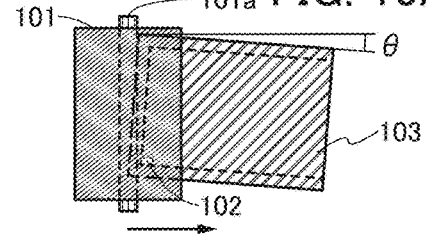
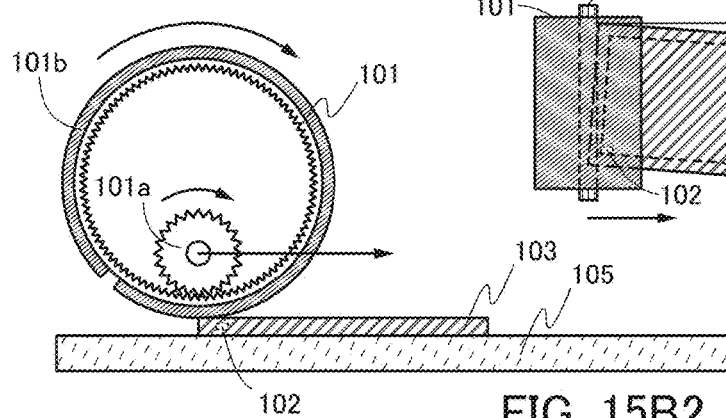
FIG. 15B1 FIG. 15B2
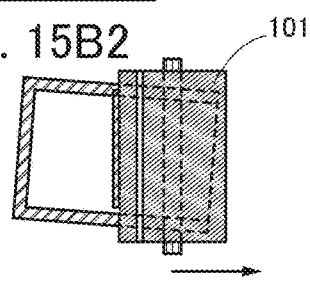
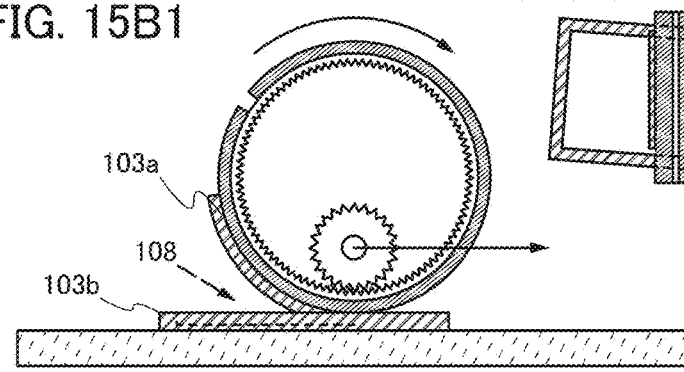
FIG. 15C2
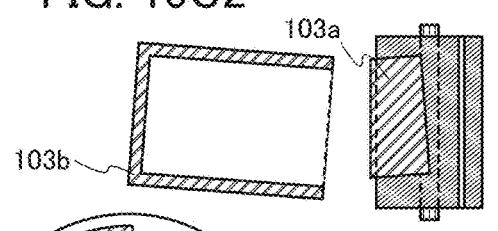
FIG. 15C1
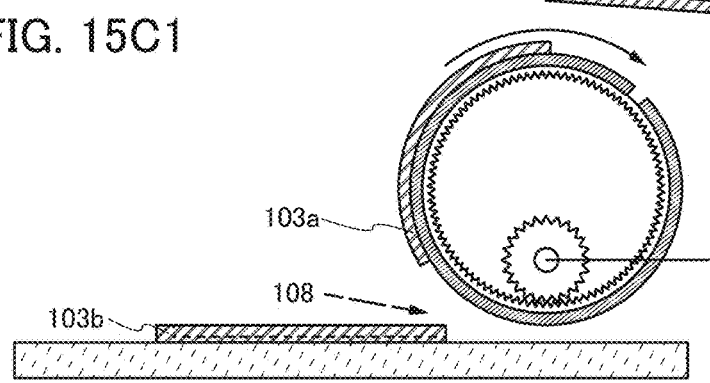

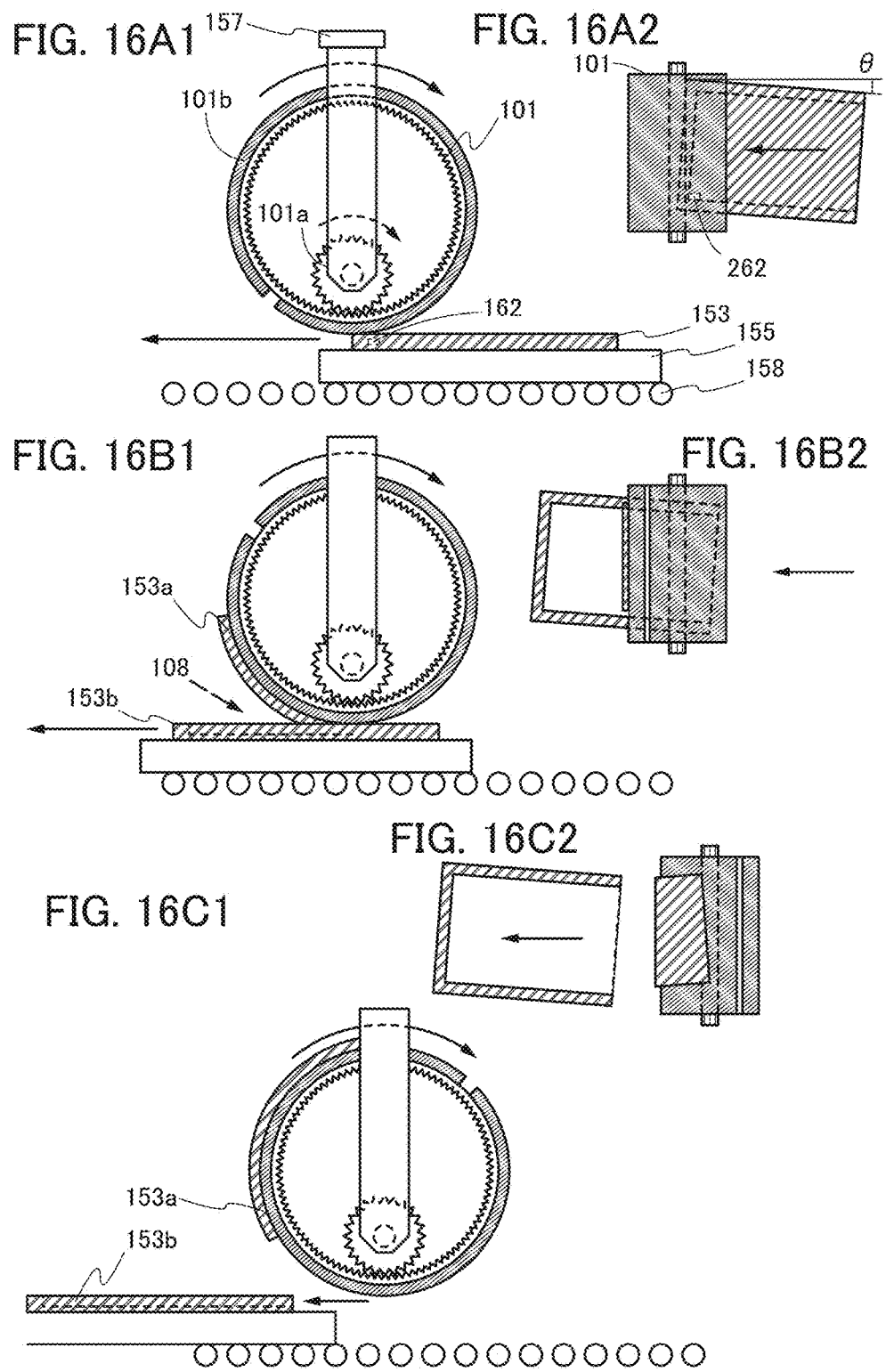

FIG. 22A
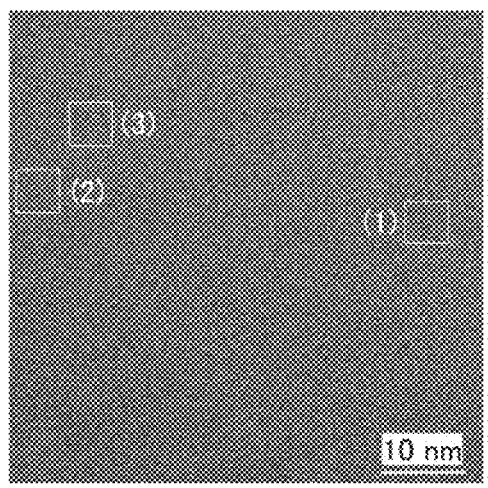
FIG. 22B          FIG. 22C          FIG. 22D
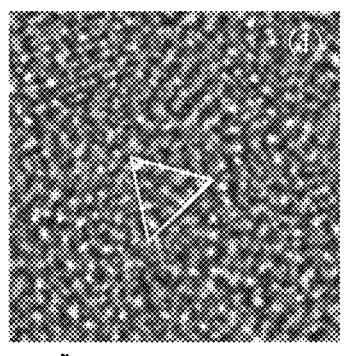 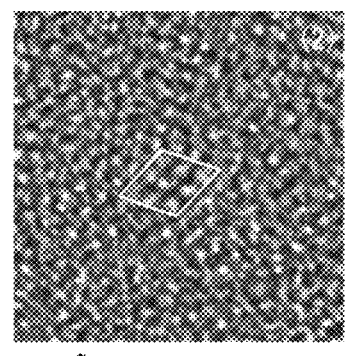 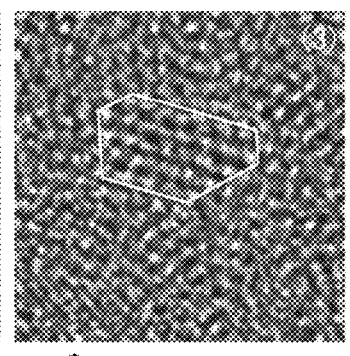

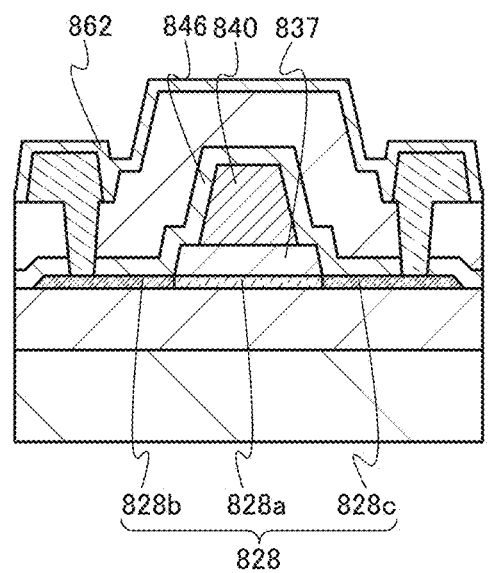
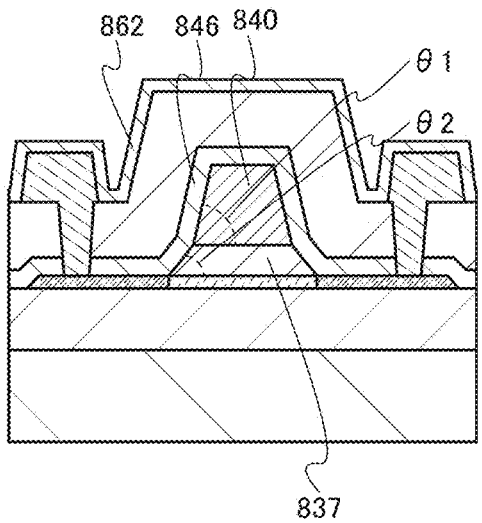
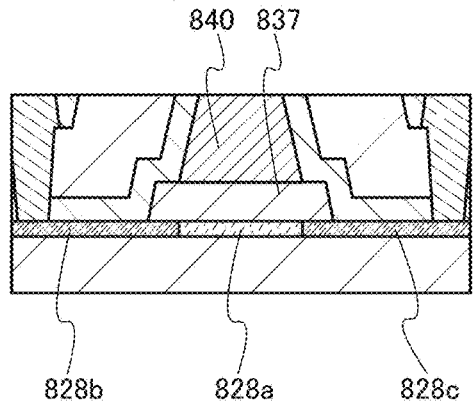
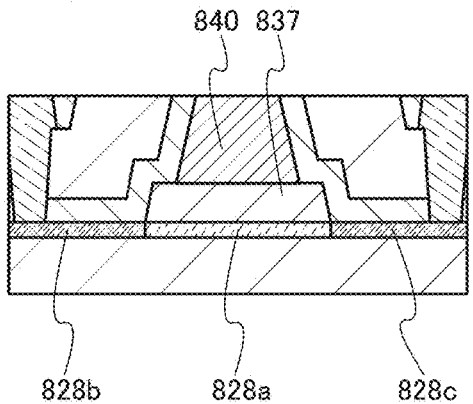
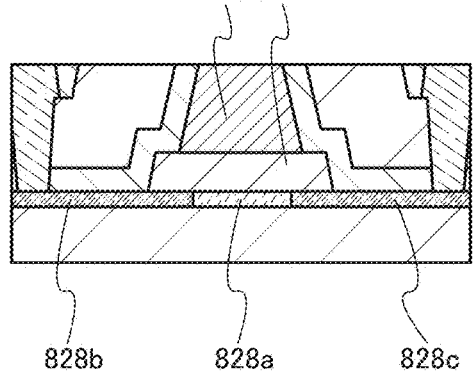
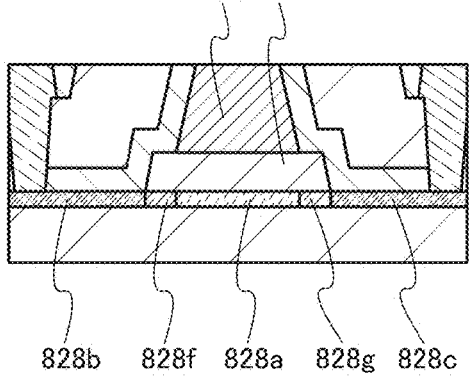

FIG. 42A Heated Substrate
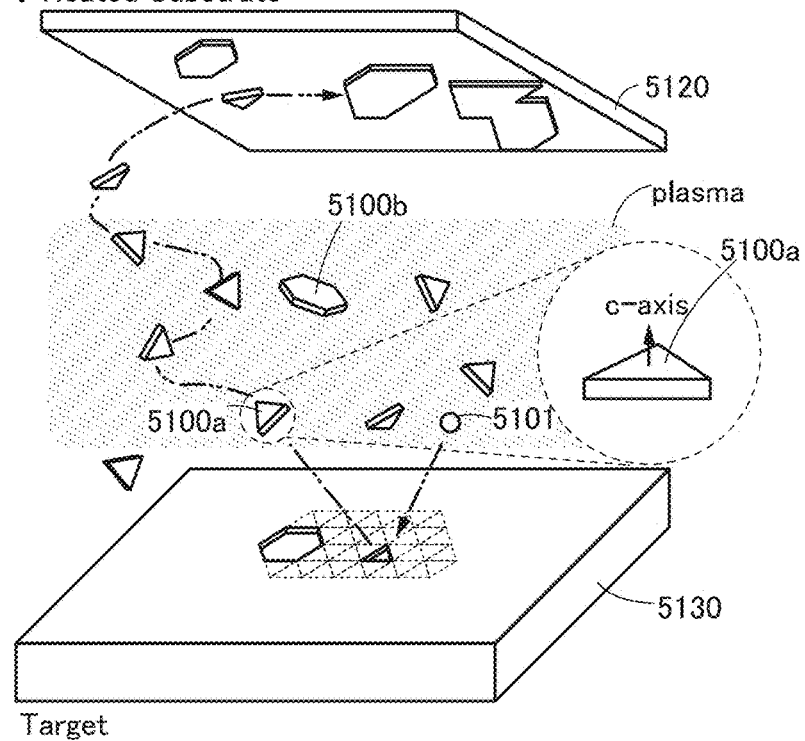
FIG. 42B Room-temperature Substrate
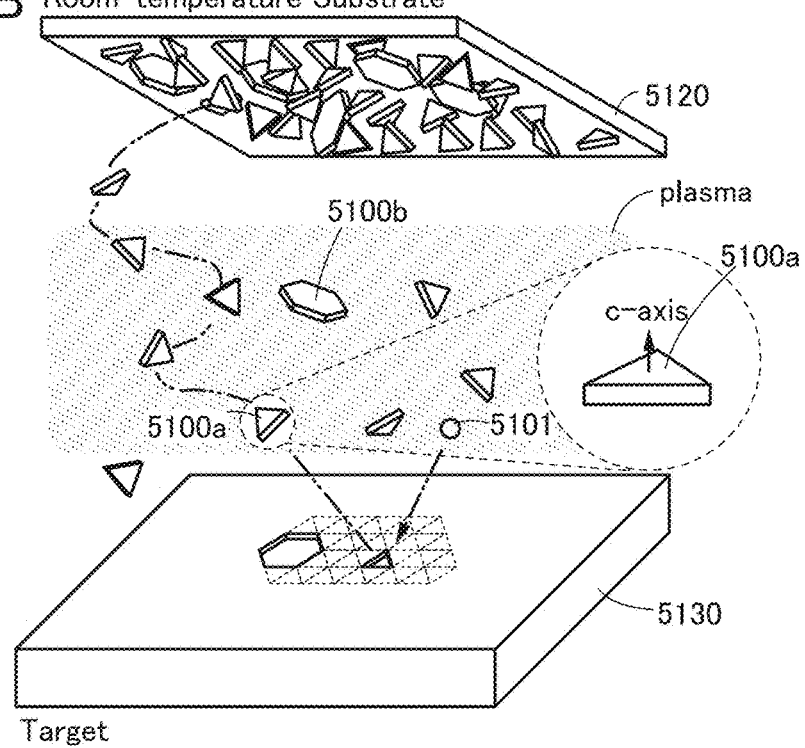

cross section of pellet upper surface of pellet

DISPLAY DEVICE AND METHOD FOR MANUFACTURING THE SAME

TECHNICAL FIELD

One embodiment of the present invention relates to a semiconductor device including an oxide semiconductor, a display device including the semiconductor device, and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, or an electronic device includes a semiconductor device.

BACKGROUND ART

A technique by which a transistor is formed using a semiconductor film formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide semiconductor containing indium (In), gallium (Ga), and zinc (Zn) is disclosed in Patent Document 1.

For a display device, it is required to improve the flexibility or impact resistance besides a reduction in the thickness and weight. For example, Patent Document 2 discloses a flexible active matrix light-emitting device in which an organic EL element and a transistor serving as a switching element are provided over a film substrate.

REFERENCE

Patent Document

[Patent Document 1] Japanese Published Patent Application No. 2006-165528
[Patent Document 2] Japanese Published Patent Application No. 2003-174153

DISCLOSURE OF INVENTION

In a process of manufacturing a flexible display device, a minute defective portion that is not a problematic part when a rigid substrate is used may increase, which may reduce the manufacturing yield. Furthermore, the defective portion may increase due to warp or bend after the display device is completed, which may reduce the display quality and reliability.

Thus, in a method for manufacturing a flexible display device, an appropriate combination of materials or processing method is desirably used so as not to generate a minute defective part in a product that is in a manufacturing process.

It is an object of one embodiment of the present invention to provide a display device having high display quality. Another object is to provide a display device with high reliability. Another object is to provide a novel display device. Furthermore, another object is to provide a novel semiconductor device or the like. Another object is to provide a method for manufacturing the display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems

One embodiment of the present invention relates to a flexible display device including a transistor using an oxide semiconductor layer and a method for manufacturing the flexible display device.

One embodiment of the present invention is a method for manufacturing a display device that includes a first element layer and a second element layer one of which includes a pixel portion and a circuit portion and the other of which includes a coloring layer and a light-blocking layer. The pixel portion includes a first transistor including an oxide semiconductor layer and a display element, and the circuit portion includes a second transistor including an oxide semiconductor layer. The method includes the following steps: a step of forming a first organic resin layer over a first substrate; a step of forming a first insulating film over the first organic resin layer; a step of forming the first element layer over the first insulating film; a step for forming a second organic resin layer over a second substrate; a step of forming a second insulating film over the second organic resin layer; a step of forming the second element layer over the second insulating film; a step of bonding the first substrate and the second substrate so as to enclose the first element layer and the second element layer; a step of reducing the adhesion between the first organic resin layer and the first substrate, thereby separating the first substrate (a first separation step); a step of bonding the first organic resin layer and a first flexible substrate with a first bonding layer; a step of reducing the adhesion between the second organic resin layer and the second substrate, thereby separating the second substrate (a second separation step); and a step of bonding the second organic resin layer and a second flexible substrate with a second bonding layer.

In this specification, ordinal numbers such as "first", "second", and the like are used in order to avoid confusion among components, and the terms do not limit the components numerically.

The first organic resin layer and the second organic resin layer can be formed using a material selected from an epoxy resin, an acrylic resin, a polyimide resin, a polyamide resin, or a polyamide-imide resin.

It is preferable to perform the irradiation with a linear excimer laser to reduce the adhesion between the first organic resin layer and the first substrate and the adhesion between the second organic resin layer and the second substrate.

The above excimer laser is preferably a laser light obtained by synthesizing lasers outputted from a plurality of oscillators.

The second separation step is preferably performed in such a manner that the first flexible substrate is in contact with a curved surface of a roller.

Each of the first insulating film and the second insulating film preferably include a silicon oxide film, a silicon oxynitride film, a silicon nitride film, or a silicon nitride oxide film.

For the oxide semiconductor layer, an In-M-Zn oxide (M is Al, Ti, Ga, Y, Zr, La, Ce, Nd, Sn, or Hf) can be used. The oxide semiconductor layer preferably includes a c-axis aligned crystal.

As the display element, an organic EL element can be used.

Another embodiment of the present invention is a display device including the following components: a first flexible substrate; a first bonding layer; a first organic resin layer; a first insulating film; a first element layer that includes a pixel portion including a first transistor including an oxide semiconductor layer and a display element and that includes a circuit portion including a second transistor; a second element layer including a coloring layer and a light-blocking layer; a second insulating film; a second organic resin layer; a second bonding layer; and a second flexible substrate, where the above components are stacked in this order.

The oxide semiconductor layer included in the first transistor may be a single layer, and the oxide semiconductor layer included in the second transistor may be a multilayer.

The oxide semiconductor layer included in the first transistor preferably has the same composition as a layer in contact with a gate insulating film of the second transistor including an oxide semiconductor layer.

According to one embodiment of the present invention, a display device with favorable display quality can be provided. Alternatively, according to one embodiment of the present invention, a highly reliable display device can be provided. Alternatively, according to one embodiment of the present invention, a novel display device or the like can be provided. Alternatively, according to one embodiment of the present invention, a method for manufacturing the display device can be provided. Alternatively, according to one embodiment of the present invention, a method for manufacturing the display device with a high manufacturing yield can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 6 illustrates an example of a processing apparatus using an excimer laser.
FIGS. 7A to 7E illustrate an example of a separation apparatus.
FIGS. 12A to 12C illustrate an example of a separation apparatus.
FIGS. 15A1, 15A2, 15B1, 15B2, 15C1, and 15C2 illustrate an example of a separation apparatus.
FIGS. 16A1, 16A2, 16B1, 16B2, 16C1, and 16C2 illustrate an example of a separation apparatus.
FIGS. 22A to 22D are Cs-corrected high-resolution TEM images of a plane of a CAAC-OS.
FIGS. 38A to 38F are each a cross-sectional view illustrating a transistor.

FIGS. 42A and 42B are schematic diagrams illustrating deposition models of a CAAC-OS layer and an nc-OS layer.

BEST MODE FOR CARRYING OUT THE INVENTION

Figure 1:
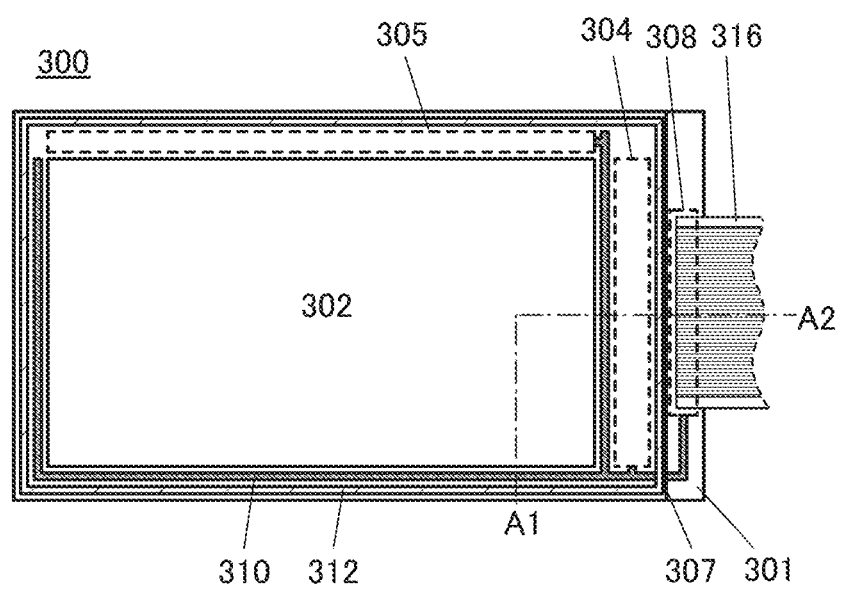
FIG. 1 is a top view illustrating a display device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a display device that is one embodiment of the present invention and a manufacturing method thereof will be described with reference to drawings.

The "display device" in this specification means an image display device or a light source (including a lighting device). Further, the display device includes any of the following modules in its category: a module including a connector such as a flexible printed circuit (FPC), or tape carrier package (TCP); a module including TCP which is provided with a printed wiring board at the end thereof; and a module including a driver circuit which is directly mounted on a display element by a chip on glass (COG) method.

The display device that is one embodiment of the present invention has flexibility (flexible display device). Note that "flexible device" means that a device that can be bent or warped. The flexibility can be utilized in an end product in some cases and utilized in a manufacturing process in some cases. In the latter case, the end product has no flexibility in some cases.

FIG. 1 is a top view of a display that is one embodiment of the present invention. In FIG. 1, some components are enlarged, reduced in size, made to be visible, or omitted for easy understanding.

The display device 300 includes a pixel portion 302 over a first flexible substrate 301, a first circuit portion 304 and a second circuit portion 305 configured to drive the pixel portion, a sealant 312 provided to surround the pixel portion 302, the first circuit portion 304, and the second circuit portion 305, and a second flexible substrate 307 provided to face the first flexible substrate 301. Note that a signal line driver circuit (source driver) and a scan line driver circuit (gate driver) can be used, for example, as the first circuit portion 304 and the second circuit portion 305, respectively.

The first flexible substrate 301 and the second flexible substrate 307 are bonded to each other with the sealant 312. Although not shown in FIG. 1, a display element is provided between the first flexible substrate 301 and the second flexible substrate 307. In other words, the pixel portion 302, the first circuit portion 304, the second circuit portion 305, and the display element are sealed with the first flexible substrate 301, the sealant 312, and the second flexible substrate 307.

Furthermore, in the display device 300, an FPC terminal portion 308 (FPC: flexible printed circuit) that is electrically connected to the pixel portion 302, the first circuit portion 304, and the second circuit portion 305 is provided over the first flexible substrate 301 in a region different from a region surrounded by the sealant 312.

The FPC terminal portion 308 is connected to an FPC 316, and a variety of signals are supplied to the pixel portion 302, the first circuit portion 304, and the second circuit portion 305 with the FPC 316. In addition, signal lines 310 are connected to the pixel portion 302, the first circuit portion 304, the second circuit portion 305, and the FPC terminal portion 308. The variety of signals supplied from the FPC 316 are given to the pixel portion 302, the first circuit portion 304, and the second circuit portion 305 through the signal lines 310.

In FIG. 1, the circuits for driving the pixel circuit portion 302 are positioned in two regions; however, the structure of the circuit is not limited thereto. For example, the circuit may be positioned in one region. Alternatively, the circuit may be divided into three or more parts. Further alternatively, only one of the first circuit portion 304 and the second circuit portion 305 may be provided over the first flexible substrate 301, and the other circuit may be externally provided.

Further, the circuit for driving the pixel portion 302 may be formed directly on the first flexible substrate 301 like a transistor included in pixel portion 302, or may be formed by mounting an IC chip on the first flexible substrate 301 by chip on glass (COG) or the like. Alternatively, the circuit may be connected to a TCP or the like.

The pixel portion 302, the first circuit portion 304, and the second circuit portion 305 in the display device 300 include a plurality of transistors in which a channel formation region is formed using an oxide semiconductor layer.

Since the transistor using an oxide semiconductor layer has high mobility, an area occupied by transistors can be made small, and the aperture ratio can be increased. With use of the transistor, the first circuit portion 304 and the second circuit portion 305 can be formed over the substrate provided with the pixel portion 302. In addition, the transistor has extremely low off-state current and can hold a video signal or the like for a longer period; thus, the frame frequency can be lowered, and the power consumption of the display device can be reduced.

The oxide semiconductor layer preferably includes a c-axis aligned crystal. In the case where the oxide semiconductor layer including the crystal is used for a channel formation region of the transistor, a crack or the like is less likely to occur in the oxide semiconductor layer when the display device 300 is bent, for example. As a result, the reliability can be improved.

Thus, with use of the transistor using an oxide semiconductor layer, a display device that is superior to a display device including an amorphous silicon layer or a polycrystalline silicon layer can be formed, for example.

As a display element included in the display device 300, a liquid crystal element or a light-emitting element can be typically used.

Figure 2:
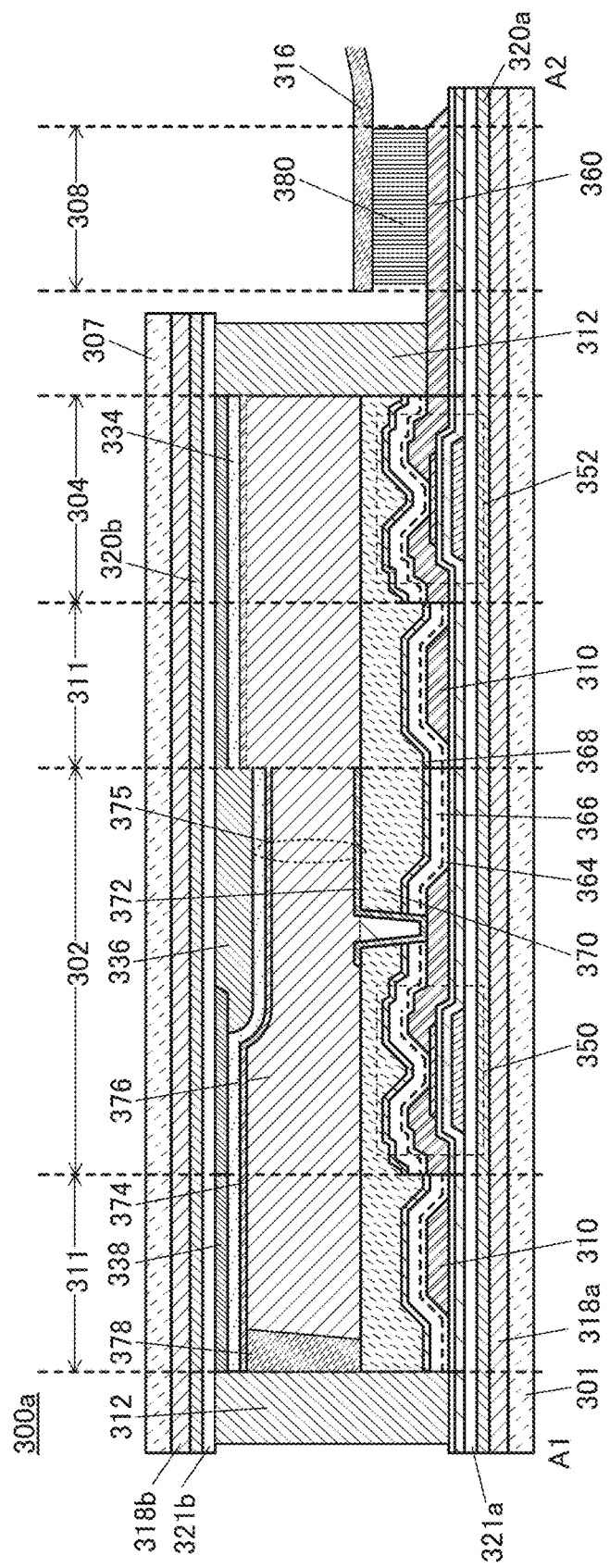
FIG. 2 is a cross-sectional view illustrating a display device.

Next, a display device 300a including a liquid crystal element is described. FIG. 2 is a cross-sectional view along dashed-dotted line A1-A2 in FIG. 1 in the case where a liquid crystal element is used for the display device 300.

The display device 300a includes the first flexible substrate 301, a first bonding layer 318a, a first organic resin layer 320a, a first insulating film 321a, a first element layer, a second element layer, a second insulating film 321b, a second organic resin layer 320b, a second bonding layer 318b, and the second flexible substrate 307, which are stacked in this order.

In FIG. 2, the first element layer includes transistors 350 and 352, insulating films 364, 366, and 368, a planarization insulating film 370, a connection electrode 360, a conductive film 372, and the like. The second element layer includes a conductive film 374, an insulating film 334, a coloring layer 336 (color filter), a light-blocking layer 338 (black matrix), and the like. There is a case where some of the above components is not included or a component other than the above components is included in the first element layer and the second element layer.

The first element layer and the second element layer are sealed with a liquid crystal layer 376 and the sealant 312 to form a liquid crystal element 375.

Examples of the material of the first flexible substrate 301 and the second flexible substrate 307 include glass thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polyether ether ketone (PEEK) resin. In particular, a material whose coefficient of thermal expansion is low is preferable, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

For the bonding layers 318a and 318b, for example, a resin that is curable at room temperature such as a two-component type resin, a light-curable resin, a heat-curable resin, or the like can be used. The examples include an epoxy resin, an acrylic resin, a silicone resin, a phenol resin, and the like. In particular, a material with low moisture permeability, such as an epoxy resin, is preferred.

The first organic resin layer 320a and the second organic resin layer 320b can be formed using a material selected from an epoxy resin, an aramid resin, an acrylic resin, a polyimide resin, a polyamide resin, or a polyamide-imide resin, for example.

As the first insulating film 321a and the second insulating film 321b, a single layer of a silicon oxide film, a silicon oxynitride film, a silicon nitride film, or a silicon nitride oxide film, or a stacked layer including any of the films can be used. In particular, a film containing nitrogen with high blocking properties against impurities is preferably used to prevent impurities contained in the first flexible substrate 301, the first bonding layer 318a, or the like from diffusing into the transistor or the like.

The display device 300a includes a lead wiring portion 311, the pixel portion 302, the first circuit portion 304, and the FPC terminal portion 308. Note that the lead wiring portion 311 includes the signal line 310.

The display device 300a has a structure in which the transistor 350 and the transistor 352 are included in the pixel portion 302 and the first circuit portion 304, respectively.

In FIG. 2, the sizes of the transistor 350 and the transistor 352 are the same; however, the sizes of the transistors are not limited thereto. The sizes of the transistor 350 and the transistor 352 can be changed (in the channel length, the channel width, and the like) as appropriate, or the number of transistors can be changed. In addition, the second circuit portion 305 (not shown in FIG. 2) can have a structure similar to that of the first circuit portion 304 when a portion to be connected, a connecting method, or the like is changed.

The signal line 310 included in the lead wiring portion 311 can be formed in a step of forming a source electrode layer and a drain electrode layer of the transistor 350.

The FPC terminal portion 308 includes the connection electrode 360, an anisotropic conductive film 380, and the FPC 316. The connection electrode 360 can be formed in a step of forming the source electrode layer and the drain electrode layer of the transistor 350. In addition, the connection electrode 360 is electrically connected to a terminal of the FPC 316 through the anisotropic conductive film 380.

A wiring containing a copper element is preferably used for the signal line connected to the transistor in the pixel portion and the transistor in the driver circuit portion. When the wiring containing a copper element is used, the signal delay due to the wiring resistance and the like can be suppressed.

Further, in FIG. 2, the insulating films 364, 366, and 368 and the planarization insulating film 370 are provided over the transistor 350 and the transistor 352.

The insulating films 364 and 366 can be formed using the same material, and for example, silicon oxide, silicon oxynitride, or the like can be used. The insulating film 364 is preferably formed using an oxide insulating film with few defects, and the insulating film 366 is preferably formed using an oxide insulating film containing oxygen in excess of the stoichiometric composition. Note that the insulating films 364 and 366 can be a single layer formed using the same material. The insulating film 368 has a function of blocking oxygen, hydrogen, water, an alkali metal, an alkaline earth metal, or the like. For example, a nitride insulating film is preferably used.

The planarization insulating film 370 can be formed using a heat-resistant organic material, such as a polyimide resin, an acrylic resin, a polyimide amide resin, a benzocyclobutene resin, a polyamide resin, or an epoxy resin. Note that the planarization insulating film 370 may be formed by stacking a plurality of insulating films formed from these materials. Alternatively, a structure without the planarization insulating film 370 may be employed.

The conductive film 372 is electrically connected to one of the source electrode layer and the drain electrode layer of the transistor 350. The conductive film 372 functions as a pixel electrode formed over the planarization insulating film 370, i.e., one electrode of the liquid crystal element. As the conductive film 372, a conductive film having properties of transmitting visible light is preferably used. For example, a material including one of indium (In), zinc (Zn), and tin (Sn) is preferably used for the conductive film.

The liquid crystal element 375 includes the conductive film 372, the conductive film 374, and the liquid crystal layer 376. The conductive film 374 is provided on the second flexible substrate 307 side and functions as a counter electrode. In the display device 300a illustrated in FIG. 2, an orientation state of the liquid crystal layer 376 is changed by the voltage applied to the conductive film 372 and the conductive film 374, so that transmission or non-transmission of light is changed and thus an image can be displayed.

Although not shown in FIG. 2, alignment films may be formed between the conductive film 372 and the liquid crystal layer 376 and between the conductive film 374 and the liquid crystal layer 376. An optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

A spacer 378 is provided between the first flexible substrate 301 and the second flexible substrate 307. The spacer 378 is a columnar spacer obtained by selective etching of an insulating film and is provided in order to adjust the thickness (cell gap) of the liquid crystal layer 376. Note that as the spacer 378, a spherical spacer may be used.

For the liquid crystal layer 376, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal showing a blue phase and a chiral material has a short response time and optical isotropy, which makes the alignment process unneeded and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the liquid crystal element is used as a display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. There are some examples of a vertical alignment mode; for example, a multi-domain vertical alignment (MVA) mode, a patterned vertical alignment (PVA) mode, an ASV mode, or the like can be employed.

As a display method in the pixel portion 302, a progressive method, an interlace method, or the like can be employed. Further, color elements controlled in a pixel at the time of color display are not limited to three colors: R, G, and B (R, G, and B correspond to red, green, and blue, respectively). For example, a display unit may be composed of four pixels of the R pixel, the G pixel, the B pixel, and a W (white) pixel. Alternatively, a display unit may be composed of two of color elements among R, G, and B as in PenTile layout. The two colors may differ among display units. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

Figure 3:
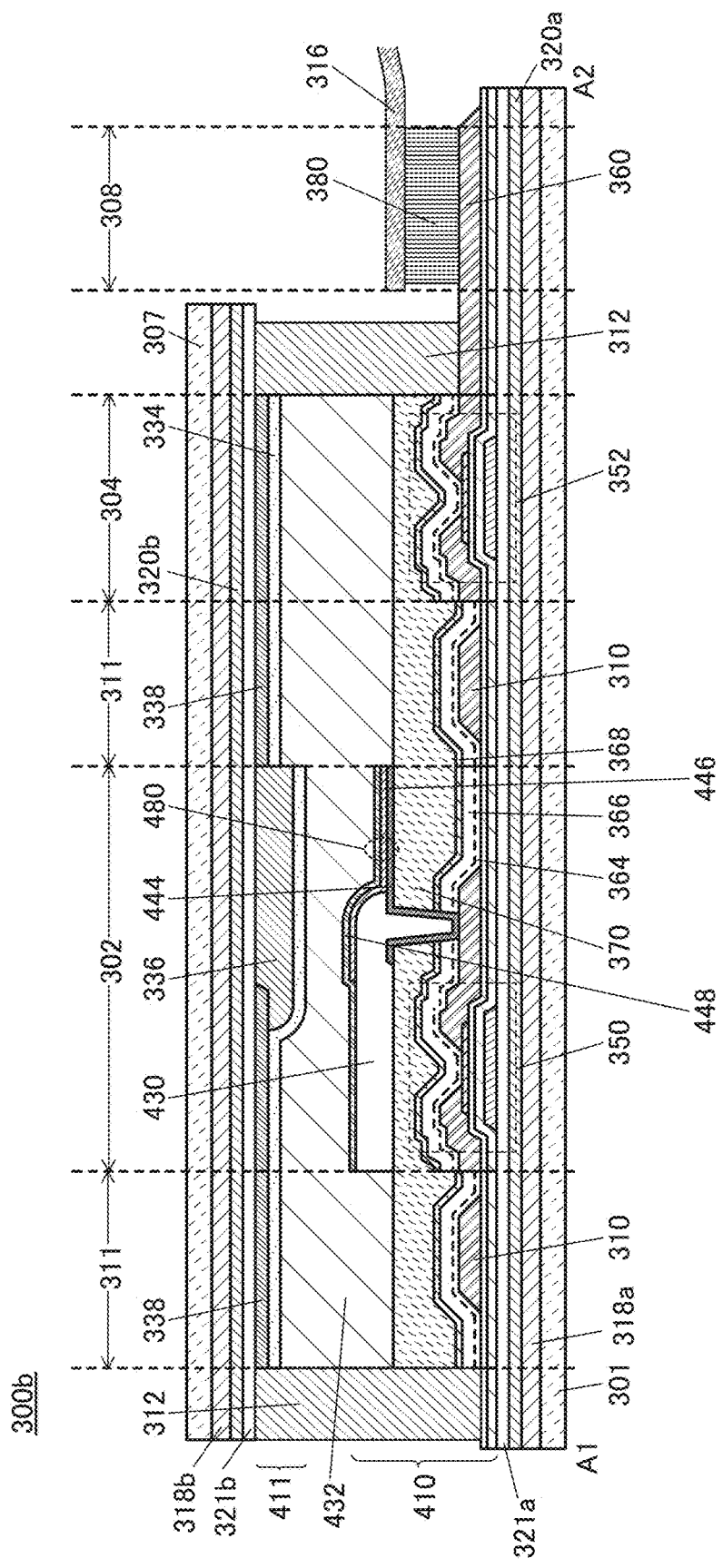
FIG. 3 is a cross-sectional view illustrating a display device.

Next, a display device 300b including a light-emitting element is described. FIG. 3 is a cross-sectional view along dashed-dotted line A1-A2 in FIG. 1 in the case where a light-emitting element is used for the display device 300. Note that the same description as that of the display device 300a including the liquid crystal element is omitted.

The display device 300b includes the first flexible substrate 301, the first bonding layer 318a, the first organic resin layer 320a, the first insulating film 321a, a first element layer 410, a second element layer 411, the second insulating film 321b, the second organic resin layer 320b, the second bonding layer 318b, and the second flexible substrate 307, which are stacked in this order.

In FIG. 3, the first element layer 410 includes the transistors 350 and 352, the insulating films 364, 366, and 368, the planarization insulating film 370, a light-emitting element 480, an insulating film 430, the signal line 310, and the connection electrode 360. The second element layer 411 includes the insulating film 334, the coloring layer 336, and the light-blocking layer 338. The first element layer 410 and the second element layer 411 are sealed with a sealing layer 432 and the sealant 312. Note that there is a case where part of the above components is not included or a component other than the above components is included in the first element layer 410 and the second element layer 411.

The light-emitting element 480 includes a conductive film 444, an EL layer 446, and a conductive film 448. The display device 300b enables an image to be displayed when the EL layer 446 in the light-emitting element 480 emits light.

The insulating film 430 is provided over the conductive film 444 over the planarization insulating film 370. The insulating film 430 partly covers the conductive film 444. A conductive film with high properties of reflecting light emitted from the EL layer is used for the conductive film 444, and a conductive film with high properties of transmitting light emitted from the EL layer is used for the conductive film 448, whereby the light-emitting element 480 can have a top emission structure. Alternatively, a conductive film with high properties of transmitting the light is used for the conductive film 444, and a conductive film with high properties of reflecting light is used for the conductive film 448, whereby the light-emitting element 480 can have a bottom emission structure. Further alternatively, a conductive film with high properties of transmitting the light is used for both the conductive film 444 and the conductive film 448, whereby a dual emission structure can be obtained.

The coloring layer 336 is provided to overlap with the light-emitting element 480, and the light-blocking layer 338 is provided to overlap with the insulating film 430 and to be included in the lead wiring portion 311 and in the first circuit portion 304. The coloring layer 336 and the light-blocking layer 338 are covered with a third insulating film 334. A space between the light-emitting element 480 and the third insulating film 334 is filled with the sealing layer 432. Although a structure with the coloring layer 336 is described as the display device 300b, the structure is not limited thereto. In the case where the EL layer 446 is formed by a separate coloring method, the coloring layer 336 is not necessarily provided.

In the display device 300b, a dry agent may be included in the bonding layers 318a and 318b. For example, a substance that absorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because entry of an impurity such as moisture into the light-emitting element 480 can be suppressed, thereby improving the reliability of the display device.

In addition, it is preferable to mix a filler with a high refractive index (e.g., titanium oxide) into the sealing layer 432, in which case the efficiency of light extraction from the light-emitting element 480 can be improved.

The bonding layers 318a and 318b may also include a scattering member for scattering light. For example, the bonding layers 318a and 318b can be a mixture of the sealing layer 432 and particles having a refractive index different from that of the sealing layer 432. The particles function as the scattering member for scattering light. The difference in refractive index between the sealing layer 432 and the particles is preferably 0.1 or more, further preferably 0.3 or more. As the particles, titanium oxide, barium oxide, zeolite, or the like can be used. Particles of titanium oxide or barium oxide are preferable because they scatter light excellently. When zeolite is used, it can adsorb water contained in the sealing layer 432 and the like, thereby improving the reliability of the light-emitting element.

Each of the first flexible substrate 301 and the second flexible substrate 307 are preferably formed using a material with high toughness. Thus, a light-emitting device with high impact resistance that is less likely to be broken can be provided. For example, when the first flexible substrate 301 and the second flexible substrate 307 are each an organic resin substrate, it is possible to manufacture a display device that is light and less likely to be broken as compared with the case where a glass substrate is used.

Furthermore, when a material with high thermal emissivity is used for the first flexible substrate 301, the surface temperature of the display device can be prevented from rising, leading to prevention of breakage or a decrease in reliability of the display device. For example, the first flexible substrate 301 may have a stacked structure of a metal substrate and a layer with high thermal emissivity (e.g., the layer can be formed using a metal oxide or a ceramic material).

Next, a method for manufacturing the display device 300b illustrated in FIG. 3 is described with reference to FIGS. 4A to 4D and FIGS. 5A to 5C. Note that to avoid complexity of the drawings, the first element layer 410 and the second element layer 411 illustrated in FIG. 3 are simplified in FIGS. 4A to 4D and FIGS. 5A to 5C.

Figure 4A:
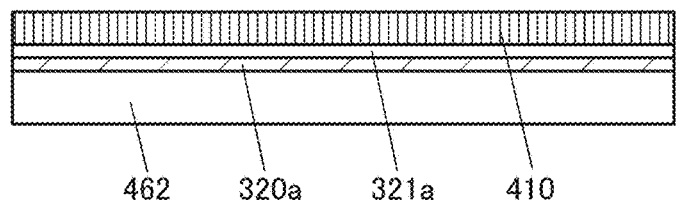
FIGS. 4A to 4D are cross-sectional views illustrating a method for manufacturing a display device.

First, over a first substrate 462, the first organic resin layer 320a, the first insulating film 321a, and the first element layer 410 are stacked in this order to form a stacked layer (see FIG. 4A).

Figure 4B:
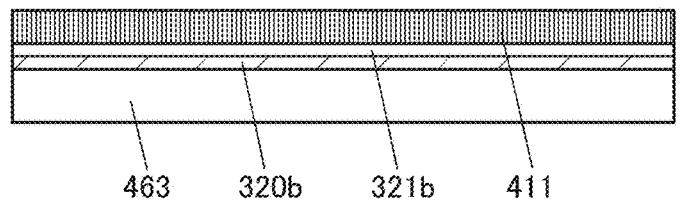

Over a second substrate 463, the second organic resin layer 320b, the second insulating film 321b, and the second element layer 411 are stacked to form a stacked layer (see FIG. 4B).

The first substrate 462 and the second substrate 463 are necessary to have at least heat resistance high enough to withstand heat treatment performed later. For example, a glass substrate, a ceramic substrate, a quartz substrate, a sapphire substrate, or the like can be used.

The first organic resin layer 320a and the second organic resin layer 320b can be formed using an organic resin such as an epoxy resin, an aramid resin, an acrylic resin, a polyimide resin, a polyamide resin, or a polyamide-imide resin. In particular, a polyimide resin is preferably used because it has high heat resistance. In the case where a polyimide resin is used, the thickness of the polyimide resin is greater than or equal to 3 nm and less than or equal to 20 μm, preferably greater than or equal to 500 nm and less than or equal to 2 μm. The polyimide resin can be formed using a spin coating method, a dip coating method, a doctor blade method, or the like.

The first insulating film 321a and the second insulating film 321b can be formed using a silicon oxide film, a silicon oxynitride film, a silicon nitride film, a silicon nitride oxide film, or the like, by a sputtering method, a CVD method, or the like. With the first insulating film 321a, diffusion of impurities from the first substrate 462 or the first organic resin layer 320a to the first element layer 410 can be suppressed, for example.

In formation of the first element layer 410, the temperature at which all of the components included in the transistor 350 is formed is preferably higher than or equal to room temperature and lower than or equal to 300° C. For example, an insulating film or a conductive film formed using an inorganic material included in the first element layer 410 is formed at the temperature higher than or equal to 150° C. and lower than or equal to 300° C., preferably higher than or equal to 200° C. and lower than or equal to 270° C. An insulating film or the like formed using an organic resin material included in the first element layer 410 is preferably formed at the temperature higher than or equal to room temperature and lower than or equal to 100° C. In formation of the transistor 350, for example, a heating step can be skipped.

The insulating film 430, the conductive film 444, the EL layer 446, and the conductive film 448 included in the first element layer 410 can be formed by the following method.

For the insulating film 430, an organic resin or an inorganic insulating material can be used, for example. As the organic resin, for example, a polyimide resin, a polyamide resin, an acrylic resin, a siloxane resin, an epoxy resin, a phenol resin, or the like can be used. As the inorganic insulating material, silicon oxide, silicon oxynitride, or the like can be used, for example. There is no particular limitation on the method for forming the insulating film 430. A photolithography method, a sputtering method, an evaporation method, a droplet discharging method (e.g., an inkjet method), a printing method (e.g., a screen printing method or an offset printing method), or the like can be used. When the insulating film 430 is formed using a photosensitive resin by a photolithography method, a formation step can be simplified.

As the conductive film 444, a metal film with high reflectance of visible light is preferably used. As the metal film, for example, aluminum, silver, an alloy thereof, or the like can be used. The conductive film 444 can be formed by a sputtering method, for example.

For the EL layer 446, a light-emitting material that can emit light by recombining holes and electron injected from the conductive film 444 and the conductive film 448 may be used. In addition to the light-emitting material, a functional layer such as a hole injection layer, a hole transport layer, an electron transport layer, or an electron injection layer may be formed as needed. Furthermore, the EL layer 446 can be formed, for example, by an evaporation method, a coating method, or the like.

As the conductive film 448, a conductive film having properties of transmitting visible light is preferably used. For example, a material including one of indium (In), zinc (Zn), and tin (Sn) is preferably used for the conductive film. For the conductive film 448, a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added can be used. In the display device according to one embodiment of the present invention, indium tin oxide to which silicon is added is preferably used for the conductive film 448. When the indium tin oxide to which silicon is added is used, the resistance to bending of the conductive film 448 is improved, crack or the like is less likely to occur. The conductive film 448 can be formed by a sputtering method, for example.

The coloring layer 336 in the second element layer 411 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Alternatively, a yellow (Y) color filter or a white (W) color filter may be used. Each color filter is formed in a desired position with any of various materials by a printing method, an inkjet method, an etching method using a photolithography technique, or the like.

The light-blocking layer 338 in the second element layer 411 has a function of blocking light in a particular wavelength range, and can be formed using a metal film, an organic insulating film including a black pigment, or the like.

As the third insulating film 434 in the second element layer 411, an organic insulating film including an acrylic resin or the like can be used, for example. Note that the third insulating film 434 is not necessarily formed, and a structure without the third insulating film 434 may be used.

Figure 4C:
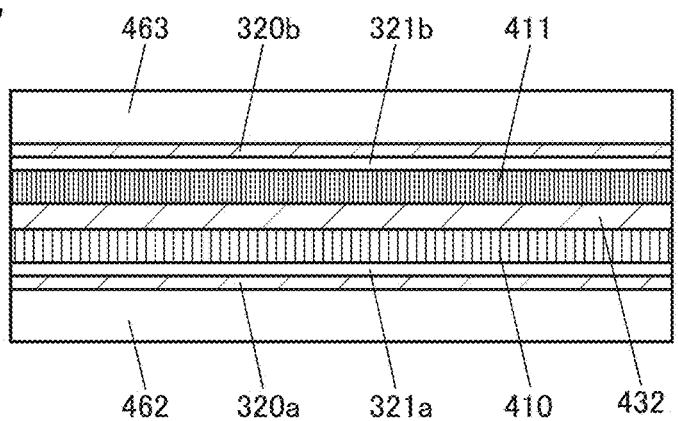

Next, the first element layer 410 and the second element layer 411 are bonded with the sealing layer 432 provided therebetween (see FIG. 4C). Note that the sealant 312 is not shown.

For the sealing layer 432, a solid sealing material with flexibility can be used. For example, a glass material such as a glass frit, or a resin material such as a two-component-mixture-type resin which is curable at room temperature, a light curable resin, a thermosetting resin, and the like can be used.

Figure 4D:
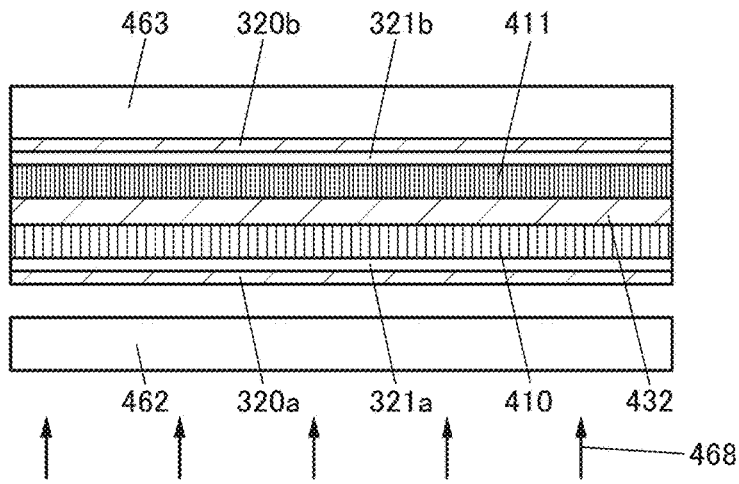

Next, the first substrate 462 is separated from the structure illustrated in FIG. 4C (see FIG. 4D). Note that a step of separating the second substrate 463 may be performed prior to the separation of the first substrate 462.

For the separation step, a variety of methods can be employed as appropriate. For example, the first substrate 462 can be separated in the following manner: by irradiating the first organic resin layer 320a with ultraviolet light 468 through the first substrate 462, the first organic resin layer 320a is weakened; or the adhesion between the first organic resin layer 320a and the first substrate 462 is lowered. Alternatively, the irradiation with the ultraviolet light 468 may be performed under such a condition that the irradiation energy density is adjusted, so that a region with a high adhesion between the first substrate 462 and the first organic resin layer 320a and a region with a low adhesion between the first substrate 462 and the first organic resin layer 320a are formed, and then, the first substrate 462 may be separated. As a light source of ultraviolet light, for example, an excimer laser that emits ultraviolet light with a wavelength of 308 nm can be used. Alternatively, a high-pressure mercury lamp, an UV-LED, or the like may be used.

The excimer laser is a pulsed laser with high output, which can shape a beam into a linear form with an optical system. The substrate is moved within a range that is irradiated with a linear laser bean, so that the whole or necessary portion of the substrate can be irradiated with laser light. Note that when the length of linear beam is longer than or equal to one side of the substrate, the substrate is moved only in one direction, so that the whole substrate can be irradiated with laser light.

For an excimer laser device, besides a device on which one laser oscillator is mounted, a device on which two or more laser oscillators are mounted may be used. In the device including a plurality of laser oscillators, laser beams that are outputted in synchronization from the laser oscillators are synthesized (superimposed) with an optical system, so that laser light with high energy density can be obtained. Thus, in the application according to this embodiment, a substrate whose size is larger than or equal to the 8th generation glass substrate (2160 mm×2460 mm) can be processed. In the device including a plurality of laser oscillators, the output variation of laser light emitted from the laser oscillators is compensated, so that a variation in intensity per pulse is reduced, and a high yield process can be performed. Instead of a device including a plurality of laser oscillators, a plurality of excimer laser devices can be used.

FIG. 6 illustrates an example of a processing device using an excimer laser. Laser light 610a and 610b emitted from an excimer laser device 600 having two laser oscillators is synthesized by an optical system 630. Laser light 610c that is extended horizontally by the optical system 630 is incident on a lens 670 via a mirror 650 and condensed into a linear beam 610d. At this time, a processing region 710 in a processing object 700 is irradiated with the linear beam 610d through a substrate 720.

Figure 5A:
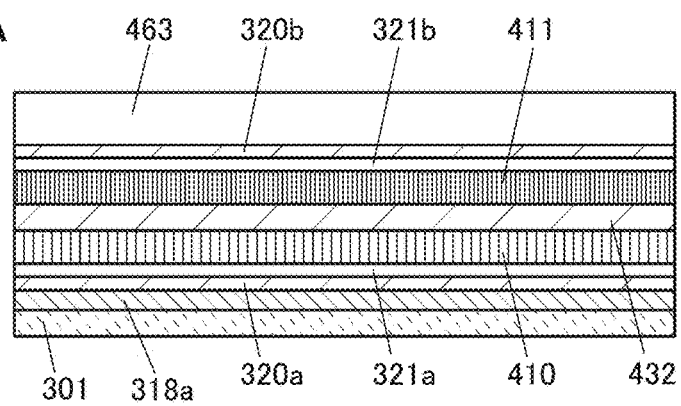
FIGS. 5A to 5C are cross-sectional views illustrating a method for manufacturing a display device.

In this embodiment, the processing object 700 corresponds to a structure illustrated in FIG. 4C or FIG. 5A, the processing region 710 corresponds to the first organic resin layer 320a or the second organic resin layer 320b, and the substrate 720 corresponds to the first substrate 462 or the second substrate 463.

The processing object 700 is moved in the direction of an arrow in the drawing, whereby the whole of processing region 710 can be irradiated with the linear beam 610d. As the excimer laser, a laser whose wavelength is 308 nm or longer is preferably used. With a laser with a wavelength of 308 nm or longer, the sufficient amount of laser light that is necessary for processing can be transmitted through the substrate 720 even when a glass substrate is used for the substrate 720.

In this embodiment, a method for performing separation at an interface between the first substrate 462 and the first organic resin layer 320a is described; however, a separation method is not limited thereto. For example, separation may be performed so that part of the first organic resin layer 320a is left on the first substrate 462 after separation. Alternatively, separation may be performed at an interface between the first organic resin layer 320a and the first element layer 410.

Further alternatively, the first organic resin layer 320a may be separated from the first substrate 462 by injecting a liquid into the interface between the first substrate 462 and the organic resin layer 320a. Further alternatively, the first element layer 410 may be separated from the first organic resin layer 320a by injecting a liquid into the interface between the first organic resin layer 320a and the first element layer 410. As the liquid, water, a polar solvent, or the like can be used, for example. With the liquid, static electricity that is caused by separation can be suppressed, and the electrostatic breakdown of the transistor in the first element layer 410 or the like can be suppressed.

Next, the first organic resin layer 320a and the first flexible substrate 301 are bonded with the first bonding layer 318a (see FIG. 5A).

Figure 5B:
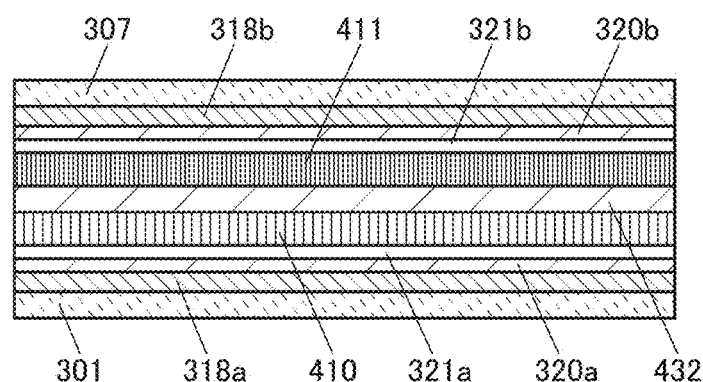

Next, the second substrate 463 is separated by a method similar to the above method, and the second organic resin layer 320b and the second flexible substrate 307 are bonded with the second bonding layer 318b (see FIG. 5B).

Then, the FPC 316 is bonded to the connection electrode 360 with the anisotropic conductive film 380. An IC chip or the like may be mounted if necessary.

According to the above steps, the display device 300b illustrated in FIG. 3 can be manufactured.

Figure 5C:
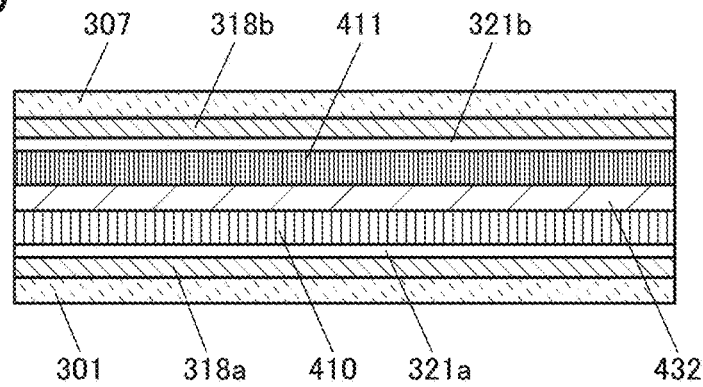

In the case where separation is performed at the interface between the first organic resin layer 320a and the first element layer 410, the structure illustrated in FIG. 5C is obtained. In this case, in the display devices 300a and 300b illustrated in FIG. 2 and FIG. 3, the organic resin layer 320a does not exist.

In one embodiment of the present invention, an element layer including a transistor using an oxide semiconductor layer and the like is formed over an organic resin layer, and the organic resin layer is weakened or the adhesion between the organic resin layer and the substrate is reduced, whereby the element layer is separated. In the case where the transistor includes polycrystalline silicon, a laser irradiation step is performed to crystallize amorphous silicon. In the laser irradiation step, a region at which the temperature becomes so high that silicon is melted is instantaneously generated. Thus, in the case where an organic resin layer is used like one embodiment of the present invention, heat is conducted to the organic resin layer, and a crack or peeling may occur, due to degassing or thermal expansion, in an inorganic film formed between the transistor and the substrate. In the case of the irradiation with a laser whose energy density is made low to suppress the occurrence of crack or peeling, polycrystalline silicon having sufficient crystallinity cannot be obtained.

In contrast, in a process of manufacturing a transistor using an oxide semiconductor layer, a high temperature step is not needed, and the process up to completion of the transistor or the like can be performed stably without weakening of the organic resin layer; thus, a transistor with high yield and reliability can be formed.

The structure described in this embodiment can be used in appropriate combination with structure described in any of the other embodiments.

Embodiment 2

In this embodiment, a separation apparatus of one embodiment of the present invention will be described with reference to FIGS. 7A to 7D, FIGS. 8A to 8C, FIGS. 9A to 9C, FIGS. 10A to 10E, FIGS. 11A to 11C, FIGS. 12A to 12C, FIGS. 13A to 13C, and FIGS. 14A and 14B. One embodiment of the present invention is a separation apparatus including a structure body that can hold a first member of a processed member, and a stage that can hold a second member of the processed member. With the separation apparatus, the processed member between the structure body and the stage is separated into the first member and the second member while the first member is rolled up. For example, the first member corresponds to the stacked body other than the second substrate 463 illustrated in FIG. 5A, and the second member corresponds to the second substrate 463.

With the separation apparatus of one embodiment of the present invention, the processed member can be separated into the first member and the second member efficiently. The separation apparatus of one embodiment of the present invention has no complicated structure and can be applied to separation of processed members that have a variety of sizes.

A structure and operation of a separation apparatus and a separation method with use of the separation apparatus are described below.

Structure Example 1

With reference to FIGS. 7A to 7D, FIGS. 8A to 8C, and FIGS. 9A to 9C, an example in which a first member 103a is peeled from a processed member 103 to separate the first member 103a and a second member 103b is shown.

FIG. 7A is a perspective view of a separation apparatus just before the peeling is performed, FIG. 7B is a front view thereof, and FIG. 7D is a side view thereof.

The separation apparatus illustrated in FIGS. 7A to 7D includes a structure body 101 and a stage 105. The structure body 101 has a convex surface. The stage 105 has a supporting surface facing the convex surface.

In FIGS. 7A to 7D, the processed member 103 is arranged between the convex surface and the supporting surface of the separation apparatus.

FIG. 7C is a top view showing a case where a position of the processed member 103 with respect to the structure body 101 is different from that in FIG. 7A, FIG. 7B, and FIG. 7D. FIG. 7A shows the case where the peeling starts at a side portion of the processed member 103. Alternatively, the peeling may start at the corner portion of the processed member 103 as shown in the top view of FIG. 7C. In the case where the peeling starts at the side portion of the processed member 103, the short side is peeled, and the peeling preferably proceeds in the long side direction. Thus, the condition of rotation speed of the structure body is easily adjusted, and the separation yield can be increased.

The processed member 103 has a sheet-like shape, which includes the sheet-like first member 103a and the sheet-like second member 103b. Each of the first member 103a and the second member 103b may be a single layer or a stacked layer. In the processed member 103, a peeling trigger is preferably formed. With the trigger, the peeling is easily performed at the interface between the first member 103a and the second member 103b.

In the case where the separation apparatus includes a transfer unit, the processed member 103 may be provided over the stage 105 with use of the transfer unit.

As shown in an enlarged view corresponding to a portion surrounded by a dashed-two dotted line in FIG. 7D, the convex surface of the structure body 101 is overlapped with a peeling trigger 102 with a point-like shape or linear (including a solid line, a dashed line, or a frame shape) formed in the processed member 103. Then, force for peeling the first member 103a is applied to the processed member 103 by rotation of the structure body 101, and peeling of the first member 103a starts in the vicinity of the peeling trigger 102. After that, the processed member 103 is separated into the first member 103a and the second member 103b.

The structure body 101 preferably has a convex shape, for example, a cylindrical shape (including a columnar shape, a right cylinder shape, an elliptical cylinder shape, a parabolic cylinder shape, and the like), a spherical shape, a structure whose part is a cylinder shape, a structure whose part is a spherical shape, or the like. For example, a roller such as a drum roller can be used.

As a material of the structure body, a metal, an alloy, an organic resin, or the like can be given. The structure body may have a space or hole inside.

Figure 10A:
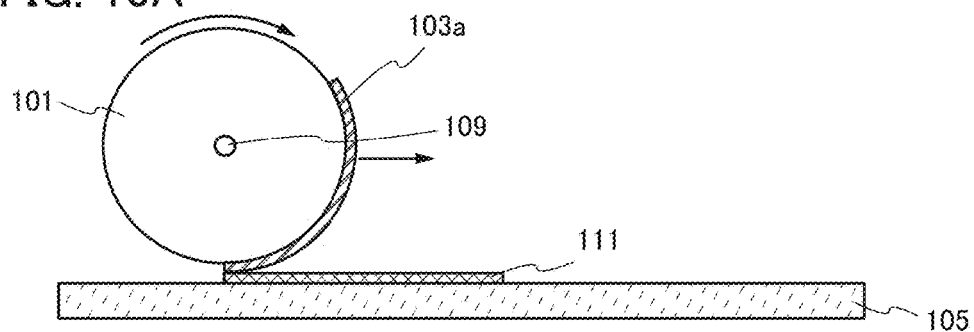
FIGS. 10A to 10E illustrate an example of a separation apparatus.
Figure 10B:
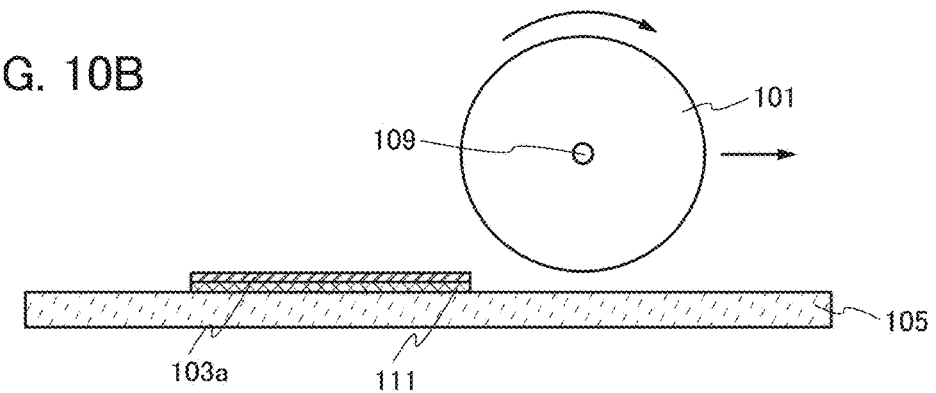
Figure 10C:
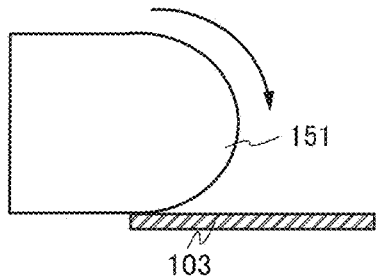
Figure 10D:
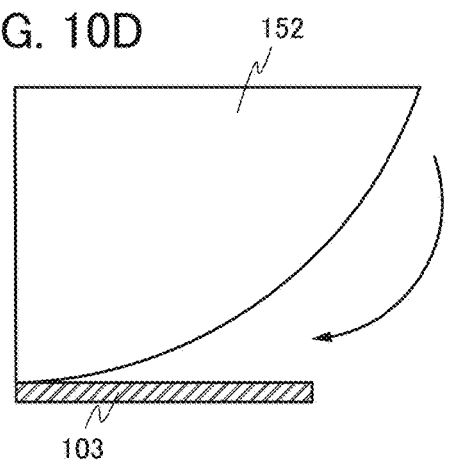

FIGS. 10C and 10D illustrate a structure body 151 and a structure body 152 each of which partly has a convex surface. Each of the structure body 151 and the structure body 152 partly has a cylindrical shape.

The curvature radius of the convex surface of the structure body is smaller than that of the supporting surface of the stage 105. The curvature radius of the convex surface can be, for example, greater than or equal to 0.5 mm and less than or equal to 1000 mm. For example, when the processed member is separated, the curvature radius of the convex surface may be greater than or equal to 0.5 mm and less than or equal to 500 mm, specifically 150 mm, 225 mm, 300 mm, or the like. Examples of structure bodies having such a convex surface include a roller whose diameter is 300 mm, 450 mm, or 600 mm. Note that the preferable range of the curvature radius of the convex surface varies depending on the thickness or size of the processed member. Thus, the curvature radius of the structure body is not limited to the above, and it is preferable that the curvature radius of the structure body be smaller than that of the supporting surface of the stage 105.

In the case where the processed member 103 has a stacked structure with low adhesion, separation occurs at the interface with low adhesion, and the yield of the separation may be reduced. For example, in the case where the processed member 103 includes an organic EL element, separation occurs at an interface between two layers included in an EL layer or an interface between the EL layer and an electrode, and accordingly, separation at an interface between the first member 103a and the second member 103b is difficult in some cases. Thus, the curvature radius of the convex surface is determined so as to cause the separation at the interface between the first member 103a and the second member 103b. Alternatively, the separation portion may be adjusted with the rotation speed of the structure body 101.

When the curvature radius of the convex surface is too small, an element included in the first member 103a rolled up on the convex surface may be broken. Thus, the curvature radius of the convex surface is preferably greater than or equal to 0.5 mm.

When the curvature radius of the convex surface is large, a substrate with low flexibility and high stiffness, such as a glass substrate, a sapphire substrate, a quartz substrate, or a silicon substrate, can be rolled up on the convex surface. Thus, the curvature radius of the convex surface is preferably greater than or equal to 300 mm.

Furthermore, when the curvature radius of the convex surface is large, a separation apparatus has a large size, and an installation site or the like may be restricted. Thus, the curvature radius of the convex surface is preferably less than or equal to 1000 mm, further preferably less than or equal to 500 mm, for example.

Figure 10E:
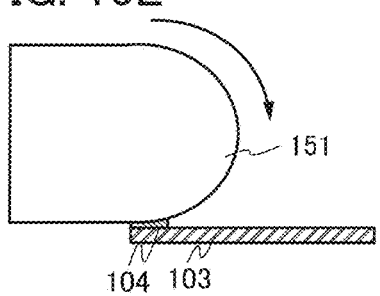

At least part of the convex surface may have viscosity. For example, an adhesive tape or the like may be put on part or the whole of the convex surface. As illustrated in FIG. 10E, at least part of the convex surface may be provided with a portion 104 having viscosity to stick to the first member 103a. Alternatively, the structure body 101 itself may have an adsorbing mechanism, so that the convex surface can be attached to the first member 103a.

The structure body 101 or the stage 105 may be movable in at least any of the following directions: forward and backward; right and left; and up and down. It is preferable that the distance between the convex surface of the structure body 101 and the supporting surface of the stage 105 be adjustable for the separation of the processed members with varied thicknesses. In Structure Example 1, the structure body 101 can be moved in the longitudinal direction of the stage 105.

As a holding unit for holding a member or the like (e.g., the processed member 103 or the second member 103b) placed over the stage 105, a chuck such as a suction chuck, an electrostatic chuck, or a mechanical chuck can be given. For example, a porous chuck may be used. Alternatively, a member may be fixed to a suction table, a heater table, a spinner table, or the like.

Figure 8A:
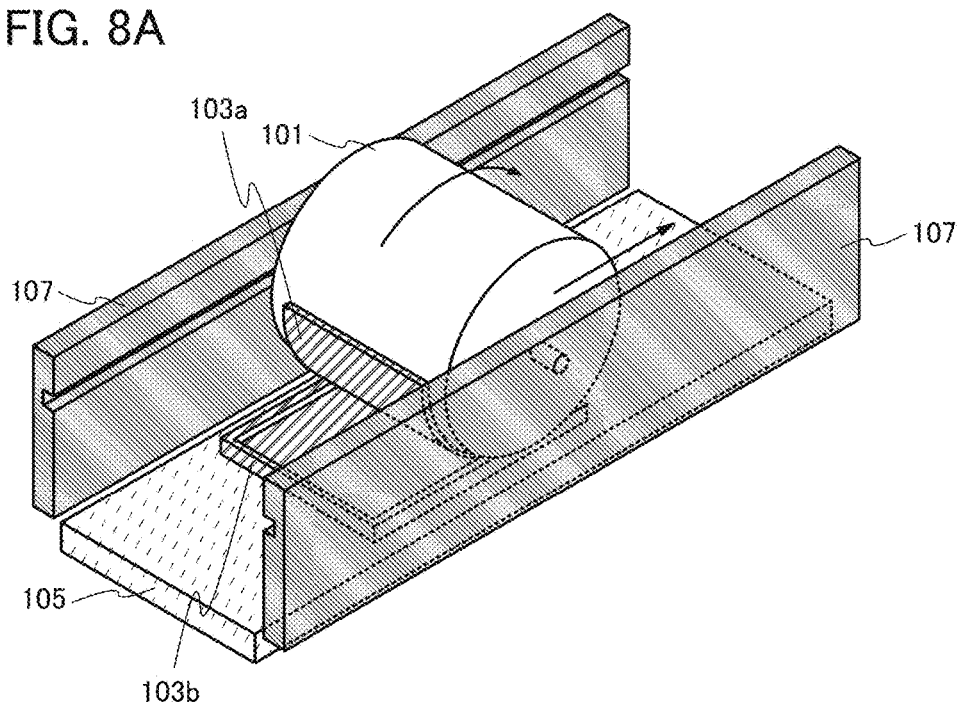
FIGS. 8A to 8C illustrate an example of a separation apparatus.
Figure 8B:
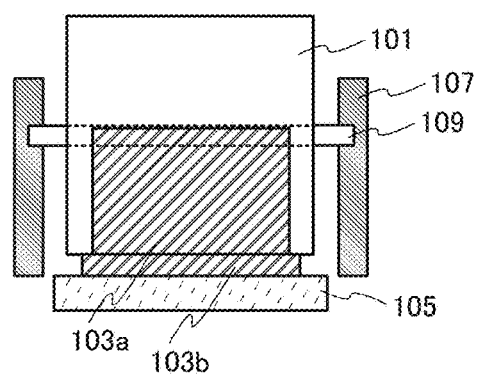
Figure 8C:
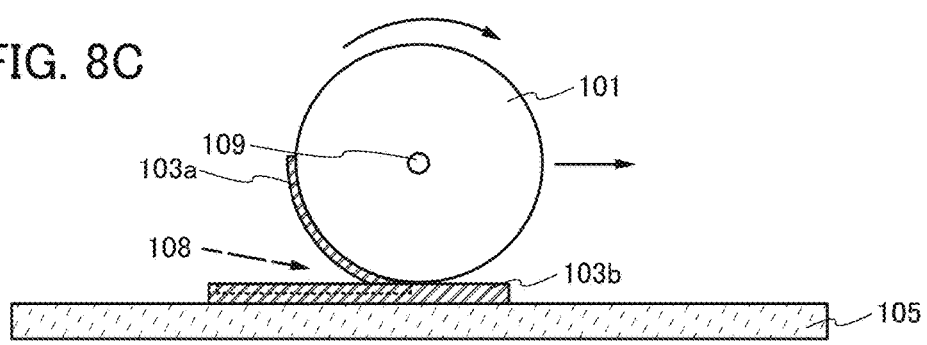
Figure 9A:
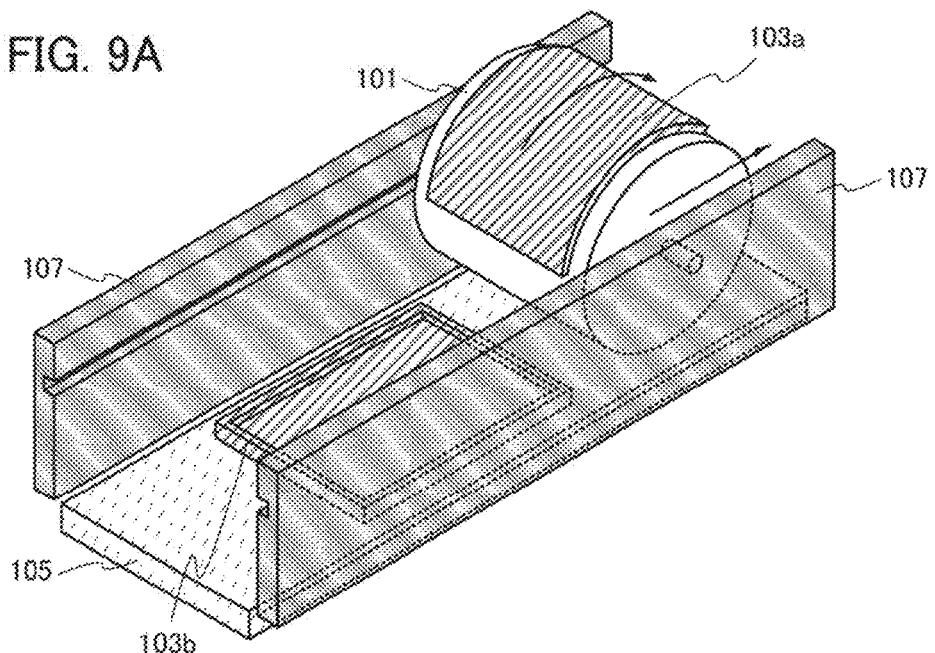
FIGS. 9A to 9C illustrate an example of a separation apparatus.
Figure 9B:
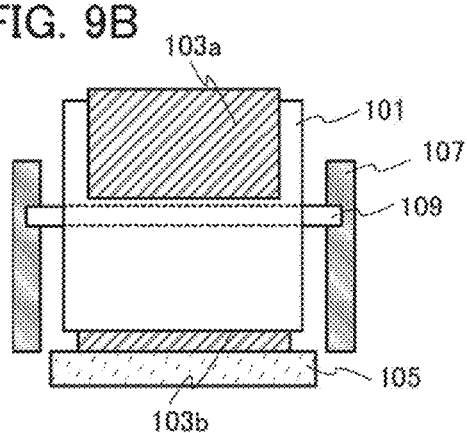
Figure 9C:
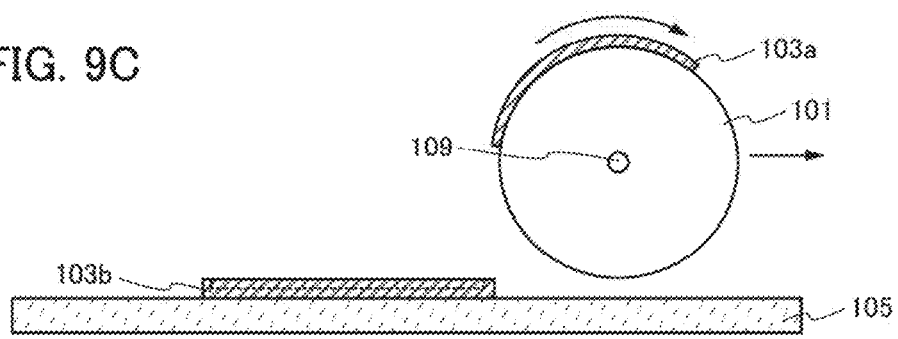

FIG. 8A is a perspective view of a separation apparatus in a state where the peeling is being conducted, FIG. 8B is a front view thereof, and FIG. 8C is a side view thereof. FIG. 9A is a perspective view of the separation apparatus after the peeling step, FIG. 9B is a front view thereof, and FIG. 9C is a side view thereof.

A rotation axis 109 is provided at the center of the structure body 101. Although the direction in which the structure body 101 is rotated is shown in FIGS. 8A, 8C, and the like, the structure body 101 may be rotated in the reverse direction as well as the direction shown in FIGS. 8A, 8C, and the like. In addition, the rotation axis 109 is moved along a groove of a guide 107, whereby the structure body 101 can be moved in the longitudinal direction of the stage 105 (sideways in FIG. 8C and FIG. 9C)

By rotation of the structure body 101, the peeling of the first member 103a overlapping with the convex surface of the structure body 101 from the processed member 103 starts in the vicinity of the peeling trigger, and the first member 103a is separated from the second member 103b while being rolled up on the convex surface. The first member 103a is held on the convex surface of the structure body 101, and the second member 103b is held over the stage 105.

In the separation apparatus of one embodiment of the present invention, a position of the rotation center of the structure body 101 with respect to the stage 105 may be changed by moving at least one of the stage 105 and the structure body 101. In Structure Example 1, an example in which the rotation center of the structure body 101 is moved is shown. Specifically, shown is an example in which the structure body 101 can be moved (rotated) from one of end portions of the processed member 103 toward the opposite end portion while the structure body 101 is rolling up the first member 103a in a state where the stage 105 is stationary (or fixed).

The linear speed of the convex surface of the structure body 101 is higher than or equal to the moving speed of the rotation center of the structure body 101 with respect to the stage 105.

The first member 103a and the second member 103b may be separated from each other while the tension is applied to the first member 103a or the second member 103b.

As indicated by an arrow 108 in FIG. 8C, a liquid supplying unit that can supply a liquid to a surface where the first member 103a and the second member 103b are separated from each other may be provided.

Furthermore, an adverse effect on an element or the like included in the first member 103a due to static electricity caused at peeling (e.g., a phenomenon in which a semiconductor element is damaged by static electricity) can be suppressed. Note that a liquid may be sprayed in an atomized form or in a vaporized form. As the liquid, pure water or an organic solvent may be used. A neutral, alkaline, or acid aqueous solution or an aqueous solution in which salt is dissolved may be used.

In the case where the separation apparatus includes a transfer unit, the second member 103b over the stage 105 or the first member 103a rolled up on the structure body 101 may be transferred with the transfer unit after the separation.

As illustrated in FIGS. 10A and 10B, by further rotating the structure body 101, a sheet-like member 111 provided over the stage 105 and the first member 103a may be bonded.

The member 111 may have a single-layer structure or a stacked structure. At least part of a surface of the member 111 that is in contact with the first member 103a preferably has adhesiveness to the first member 103a. For example, a bonding layer may be formed.

While the structure body 101 rotates one turn, the first member 103a may be wholly rolled up on the convex surface. This is a preferable step, which can prevent the first member 103a from being in contact with the stage 105 and being pressed by the structure body 101.

Furthermore, it is preferable that the first member 103a rolled up be bonded to the member 111 without being in contact with the stage 105.

For example, a rotation step may be performed in the following manner. First, the structure body 101 is one-fourth rotated so that the whole of the first member 103a is rolled up on the convex surface. Next, the structure body 101 is three-fourth rotated so that the structure body 101 is moved to the vicinity of the end portion of the member 111. Then, the structure body 101 is one-fourth rotated so that the first member 103a is bonded on the member 111.

Alternatively, after the separation, the distance between the structure body 101 and the stage 105 may be adjusted so that the first member 103a rolled up on the structure body 101 is not in contact with the stage 105.

Structure Example 2

In Structure Example 2, an example in which a position of the rotation center of a structure body with respect to a stage is changed by moving the stage is shown. Specifically, shown is an example in which the position of the rotation center of the structure body is not moved but the stage is moved from one end portion of a processed member toward the opposite end portion.

With reference to FIGS. 11A to 11C, FIGS. 12A to 12C, and FIGS. 13A to 13C, an example in which a first member 153a and a second member 153b are separated from each other by peeling the first member 153a from a processed member 153 is shown.

Figure 11A:
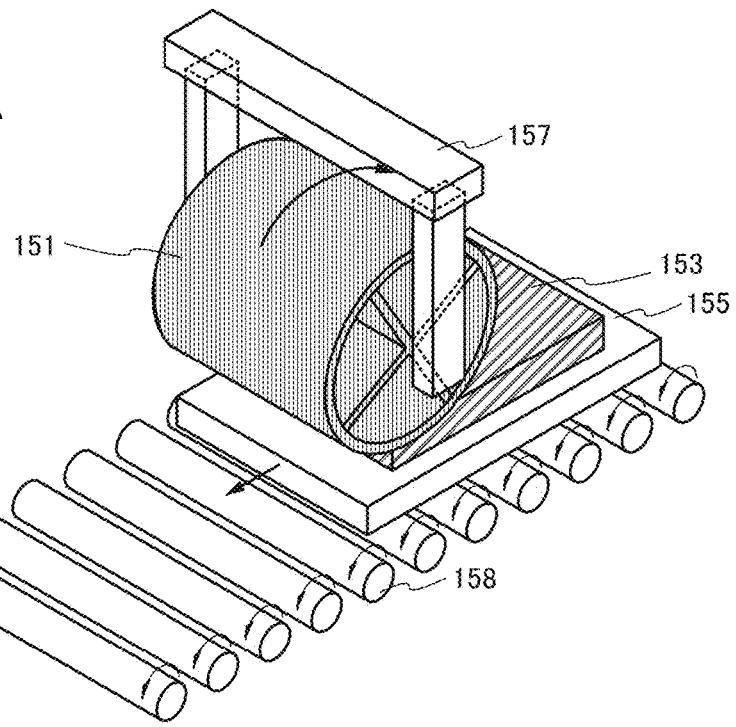
FIGS. 11A to 11C illustrate an example of a separation apparatus.
Figure 11B:
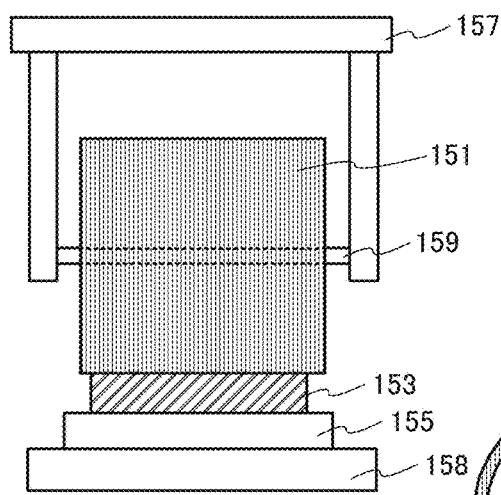
Figure 11C:
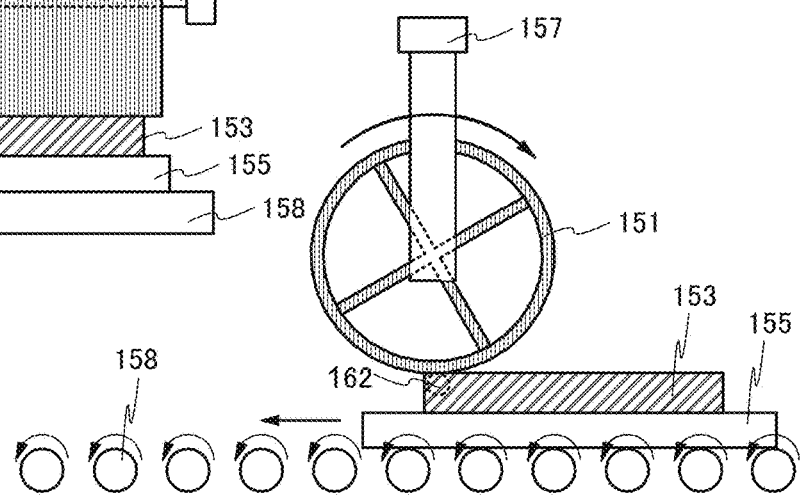

FIG. 11A is a perspective view of a separation apparatus just before the peeling is performed, FIG. 11B is a front view thereof, and FIG. 11C is a side view thereof.

The separation apparatus illustrated in FIGS. 11A to 11C includes the structure body 151, a stage 155, a support 157, and a transfer roller 158. The structure body 151 has a convex surface. The stage 155 has a supporting surface facing the convex surface. The support 157 supports the structure body 151.

In FIGS. 11A to 11C, the processed member 153 is provided between the convex surface and the supporting surface of the separation apparatus.

Although FIG. 11A shows an example in which the peeling starts at the side portion of the processed member 153, the peeling may start at the corner portion of the processed member 153, which is similar to the case in Structure Example 1.

The structure body 151, the processed member 153, and the stage 155 can have structures similar to those of the structure body 101, the processed member 103, and the stage 105 in Structure Example 1, respectively; thus, the description thereof is omitted. In the processed member 153, a peeling trigger 162 is provided.

The support 157 supports a rotation axis 159 of the structure body 151. The support 157 has a function of adjusting the vertical position of the structure body 151. Thus, the distance between the convex surface of the structure body 151 and the supporting surface of the stage 155 can be adjustable.

The transfer roller 158 enables the stage 155 to be moved. There is no particular limitation on a unit for moving the stage 155, and a conveyor belt or a transfer robot may be used.

In the case where the separation apparatus includes a transfer unit, the processed member 153 may be provided over the stage 155 with the transfer unit.

Figure 13A:
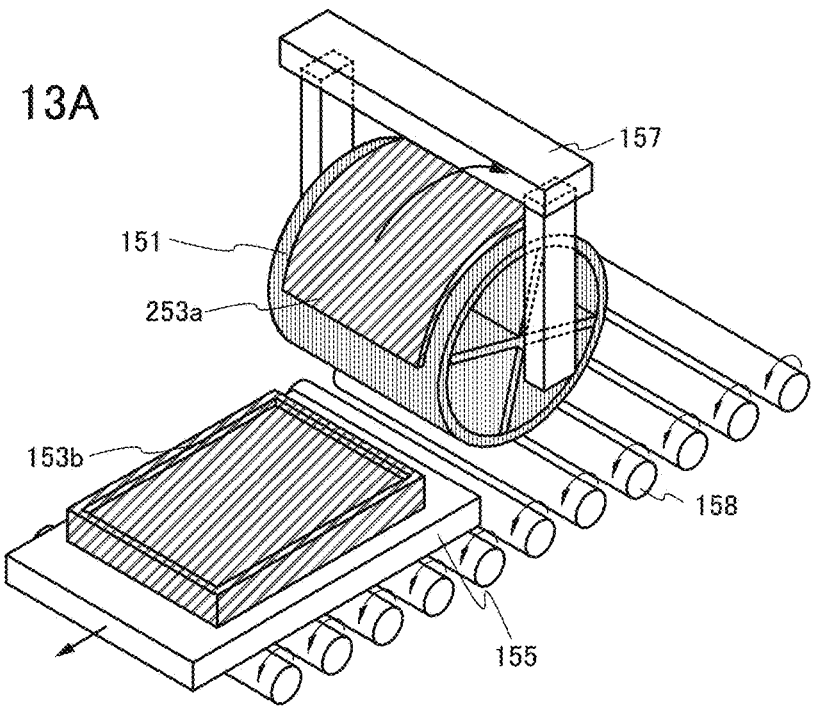
FIGS. 13A to 13C illustrate an example of a separation apparatus.
Figure 13B:
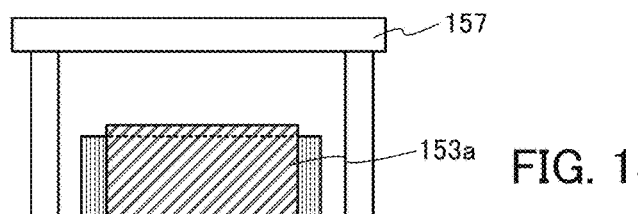
Figure 13C:
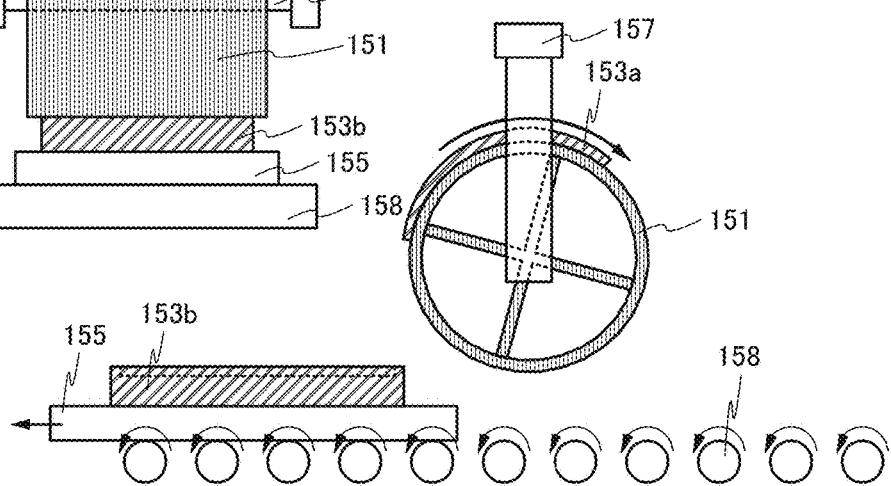

FIG. 12A is a perspective view of the separation apparatus in a state where the peeling is being conducted, FIG. 12B is a front view thereof, and FIG. 12C is a side view thereof. FIG. 13A is a perspective view of the separation apparatus after the peeling, FIG. 13B is a front view thereof, and FIG. 13C is a side view thereof.

The rotation axis 159 is provided at the center of the structure body 151. Although the direction in which the structure body 151 or the transfer roller 158 is rotated is shown in FIGS. 12A, 12C, and the like, the structure body 151 or the transfer roller 158 may be rotated in the reverse direction as well as the direction shown in FIGS. 12A, 12C, and the like. By rotating the transfer roller 158, the positions of the stage 155 and the processed member 153 over the stage 155 with respect to the rotation center of the structure body 151 can be moved (specifically, moved sideways in FIG. 12C or FIG. 13C).

The first member 153a held on the structure body 151 is peeled from the processed member 153, rolled up on the convex surface, and separated from the second member 153b. Over the stage 155, the second member 153b is held.

The convex surface of the structure body 151 is overlapped with the peeling trigger 162 in the processed member 153. Then, the structure body 151 is rotated, whereby a force for peeling the first member 153a is applied to the processed member 153, and the first member 153a in the vicinity of the peeling trigger 162 is peeled. The first member 153a peeled from the processed member 103 is rolled up on the convex surface and separated from the second member 103b. The first member 153a is held on the convex surface of the structure body 151, and the second member 153b is held over the stage 155.

In the case where the separation apparatus includes a transfer unit, the second member 153b over the stage 155 or the first member 153a rolled up on the structure body 151 may be transferred with the transfer unit after the separation.

Figure 14A:
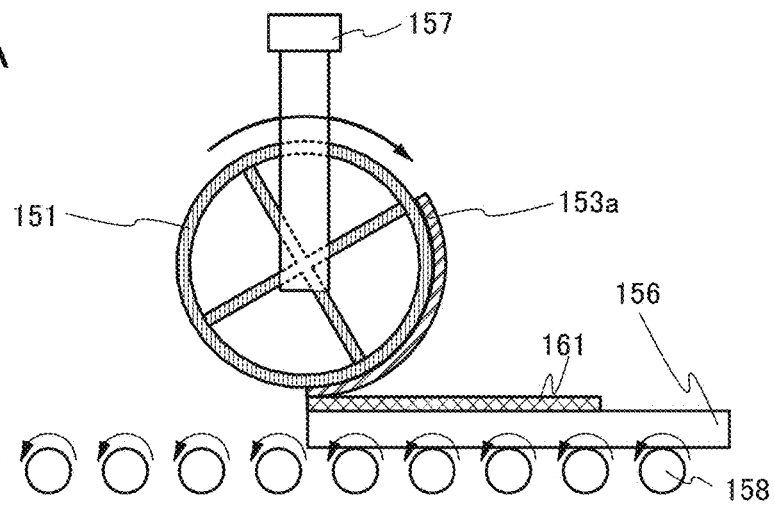
FIGS. 14A and 14B illustrate an example of a separation apparatus.
Figure 14B:
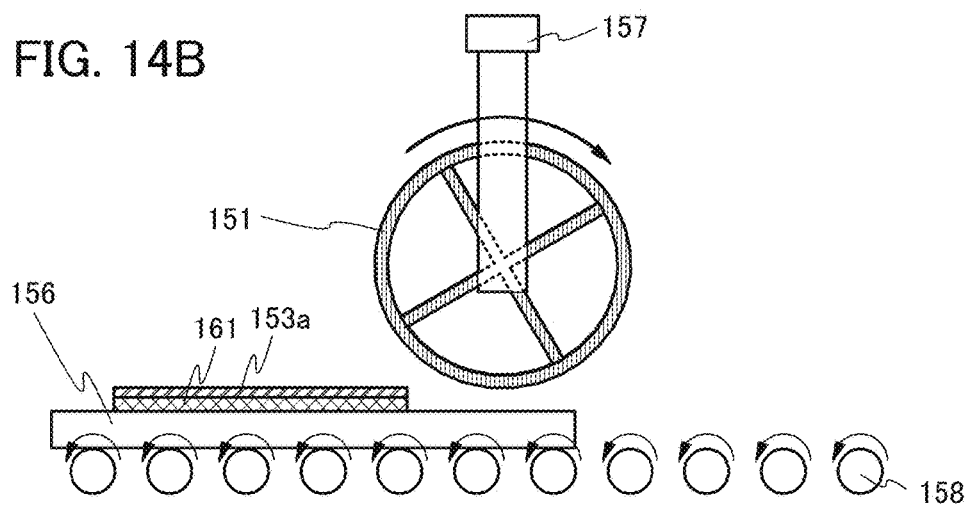

As illustrated in FIGS. 14A and 14B, the structure body 151 and the transfer roller 158 are rotated, whereby a sheet-like member 161 provided over a stage 156 and the first member 153a may be bonded. Note that the member 161 may be provided over the stage 155 where the processed member 153 has been provided.

Structure Example 3

Another structure of a separation apparatus of one embodiment of the present invention is described with reference to FIGS. 15A1, 15A2, 15B1, 15B2, 15C1, and 15C2. FIGS. 15A1, 15A2, 15B1, 15B2, 15C1, and 15C2 illustrate a structure and operation of the separation apparatus of one embodiment of the present invention.

FIG. 15A1, FIG. 15B1, and FIG. 15C1 are schematic views each illustrating a side surface of the separation apparatus of one embodiment of the present invention.

FIG. 15A2, FIG. 15B2, and FIG. 15C2 are schematic views each illustrating a top surface of the separation apparatus.

FIG. 15A1 and FIG. 15A2 illustrate the separation apparatus of one embodiment of the present invention in a state where a step of peeling the first member 103a from the processed member 103 starts.

FIG. 15B1 and FIG. 15B2 illustrate the separation apparatus of one embodiment of the present invention in a state where the first member 103a is being peeled from the processed member 103.

FIG. 15C1 and FIG. 15C2 illustrate the separation apparatus of one embodiment of the present invention in a state where the peeling of the first member 103a from the processed member 103 is finished.

The separation apparatus described in Structure Example 3 of one embodiment includes the cylindrical structure body 101 and a rotator 101a that is in contact with an inner wall of the cylindrical structure body 101 and can rotate in synchronization with the rotation of the structure body 101, which is a difference from the separation apparatus described with reference to FIGS. 7A to 7D, FIGS. 8A to 8C, FIGS. 9A to 9C, FIGS. 10A to 10E, FIGS. 11A to 11C, FIGS. 12A to 12C, FIGS. 13A to 13C, and FIGS. 14A and 14B. A different component will be described in detail below, and the above description is referred to for the other similar components.

The structure body 101 has a cylindrical shape. Note that the structure body 101 may be provided with a member 101b on its outer surface (see FIG. 15A1 and FIG. 15A2).

The member 101b can modify physical properties of the surface of the structure body 101. For example, the member 101b allows the surface of the structure body 101 to have viscosity. Alternatively, the member 101b allows the surface of the structure body 101 to have elasticity that can disperse stress concentrated on the convex and concave portions.

For example, rubber, silicone rubber, a resin, a natural material, or the like can be used for the member 101b.

In the case where the member 101b provided on the structure body 101 has a joint portion, the processed member is provided between the stage 105 and the structure body 101 so as to prevent the processed member 103 from being in contact with the joint portion.

The rotator 101a is in contact with the inner periphery of the cylindrical structure body 101, and the processed member 103 is sandwiched between the outer periphery of the structure body 101 and the stage 105.

The rotator 101a is provided rotatably around the center axis. For example, the rotator 101a may be provided with a cylindrical roller or a gear on its outer surface.

In the case where the rotator 101a provided with a gear on its outer periphery is used, a gear that meshes the gear provided with the rotator 101a is provided on an inner surface of the structure body 101. In this structure, for example, the rotator 101a is driven to rotate with use of a driver unit, and the rotation can influence the structure body 101.

As a first step, the processed member 103 in which the peeling trigger 102 is provided is inserted between the stage 105 and the structure body 101 (see FIG. 15A1 and FIG. 15A2). In the case where the processed member 103 has a short side and a long side, the peeling trigger 102 is preferably provided at a corner portion, and the processed member 103 may be inserted from the corner portion in a state of being inclined at a θ degree angle with respect to the direction perpendicular to the center axis of the rotator 101a seen from above. As a result, the peeling of the first member 103a from the second member 103b can gradually proceed from the peeling trigger 102.

As a second step, the further peeling of the first member 103a from the second member 103b makes progress (see FIG. 15B1 and FIG. 15B2).

With use of the liquid supply unit indicated by the arrow 108, a liquid is supplied to a surface where the first member 103a and the second member 103b are separated (separation surface) (see FIG. 15B1). For example, the liquid is injected into the separation surface. Alternatively, the liquid may be sprayed.

For example, as the liquid injected or sprayed, water, a polar solvent, or the like can be used. By injecting the liquid, an influence of static electricity and the like caused by the peeling can be reduced. Alternatively, the peeling may proceed while the peeling layer is dissolved with a liquid.

As a third step, the first member 103a and the second member 103b are separated (see FIG. 15C1 and FIG. 15C2).

Structure Example 4

Another structure of a separation apparatus of one embodiment of the present invention is described with reference to FIGS. 16A1, 16A2, 16B1, 16B2, 16C1, and 16C2. FIGS. 16A1, 16A2, 16B1, 16B2, 16C1, and 16C2 illustrate a structure and operation of the separation apparatus of one embodiment of the present invention.

FIG. 16A1, FIG. 16B1, and FIG. 16C1 are schematic views each illustrating a side surface of the separation apparatus of one embodiment of the present invention. FIG. 16A2, FIG. 16B2, and FIG. 16C2 are schematic views each illustrating a top surface thereof.

FIG. 16A1 and FIG. 16A2 illustrate the separation apparatus of one embodiment of the present invention in a state where the peeling of the first member 153a from the processed member 153 starts.

FIG. 16B1 and FIG. 16B2 illustrate the separation apparatus of one embodiment of the present invention in a state where the first member 153a is being peeled from the processed member 153.

FIG. 16C1 and FIG. 16C2 illustrate the separation apparatus of one embodiment of the present invention in a state where the peeling of the first member 153a from the processed member 153 is finished.

The separation apparatus described in Structure Example 4 in this embodiment includes the cylindrical structure body 101, instead of the cylindrical structure body 151, and the rotator 101a that is in contact with an inner wall of the cylindrical structure body 101 and can rotate in synchronization with the rotation of the structure body 101, which is a difference from the separation apparatus described with reference to FIGS. 11A to 11C, FIGS. 12A to 12C, and FIGS. 13A to 13C.

In addition, in the separation apparatus described in Structure Example 4, the structure body 151 is fixed instead of the structure body 101, and the stage 155 is moved, which is a difference from the case of the separation apparatus described with reference to FIGS. 15A1, 15A2, 15B1, 15B2, 15C1, and 15C2.

This embodiment can be combined with any of the other embodiments in this specification as appropriate.

Embodiment 3

In this embodiment, a structure of a display device and a display element of one embodiment of the present invention will be described.

The display device illustrated in FIG. 17A includes a region including pixels of display elements (hereinafter, the region is referred to as pixel portion 502), a circuit portion being provided outside the pixel portion 502 and including a circuit for driving the pixels (hereinafter, the portion is referred to as driver circuit portion 504), circuits each having a function of protecting an element (hereinafter, the circuits are referred to as protection circuits 506), and a terminal portion 507. Note that the protection circuits 506 are not necessarily provided.

Part or all of the driver circuit portion 504 is preferably formed over the same substrate as the pixel portion 502. Thus, the number of components and the number of terminals can be reduced. In the case where a part or the whole of the driver circuit portion 504 is not provided over the same substrate as the pixel portion 502, an IC chip may be mounted with COG or tape automated bonding (TAB).

The pixel portion 502 includes circuits for driving the plurality of display elements in X (X is a natural number of 2 or more) rows and Y columns (Y is a natural number of 2 or more) (hereinafter, such circuits are referred to as pixel circuit 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shifter register or the like. The gate driver 504a receives a signal for driving the shift register and outputs a signal through a terminal portion 507. For example, the gate driver 504a receives a start pulse signal, a clock signal, or the like and outputs a pulse signal. The gate driver 504a has a function of controlling potentials of wirings supplied with scan signals (hereinafter, such wirings are referred to as scan lines GL_1 to GL_X). Note that the plurality of gate drivers 504a may be provided to separately control the scan lines GL_1 to GL_X. Alternatively, the gate driver 504a has, but is not limited to, a function of supplying an initialization signal. The gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating data signals written in the pixel circuits 501 based on the video signals. In addition, the source driver 504b has a function of controlling output of a data signal in response to a pulse signal produced by input of a start pulse, a clock signal, or the like. Further, the source driver 504b has a function of controlling the potentials of wirings supplied with data signals (hereinafter, such wirings are referred to as data lines DL_1 to DL_Y). Alternatively, the source driver 504b has, but is not limited to, a function of supplying an initialization signal. The source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may be formed using a shift register or the like.

A pulse signal and a data signal are input to each of the plurality of pixel circuit portions 501 through one of the plurality of scan lines GL supplied with scan signals and one of the plurality of data lines DL supplied with data signals, respectively. Writing and holding of the data signal in each of the plurality of pixel circuits 501 are performed by the gate driver 504a. For example, to the pixel circuit 501 in m-th row and n-th column (m is a natural number of less than or equal to X, and n is a natural number of less than or equal to Y), a pulse signal is input from the gate driver 504a through the scan line GL_m, and a data signal is input from the source driver 504b through the data line DL_n depending on the potential of the scan line GL_m.

Figure 17A:
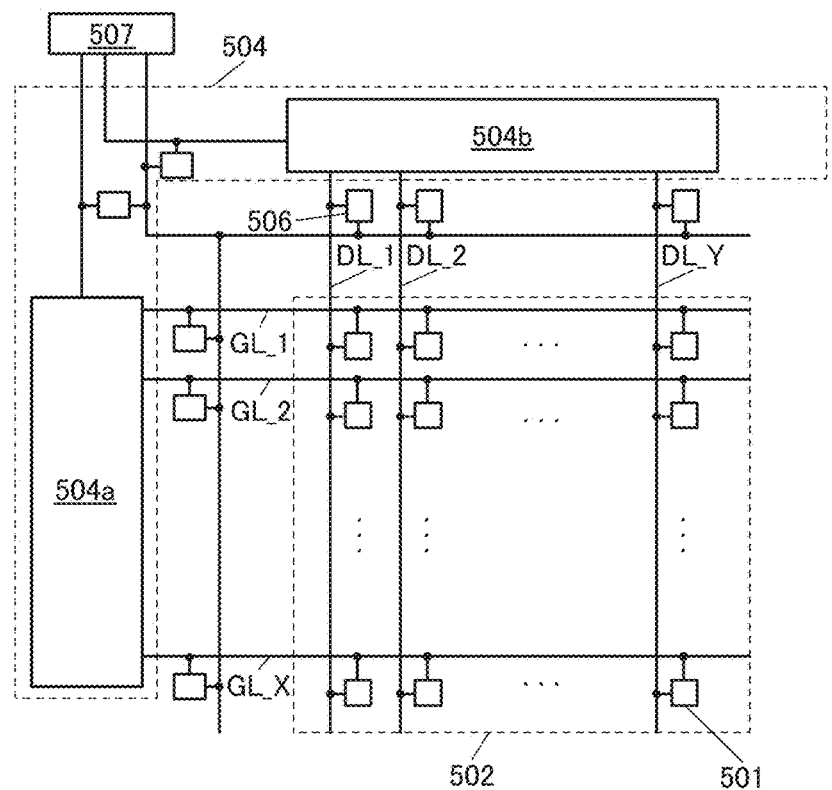
FIGS. 17A to 17C are a block diagram and circuit diagrams showing a display device.

The protection circuit 506 shown in FIG. 17A is connected to, for example, the scan line GL between the gate driver 504a and the pixel circuit 501. Alternatively, the protection circuit 506 is connected to the data line DL making the connection between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit which electrically connects a wiring connected to the protection circuit to another wiring when a potential out of a certain range is applied to the wiring connected to the protection circuit.

As illustrated in FIG. 17A, the protection circuit portions 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, a configuration in which the protection circuits 506 are connected to the gate driver 504a or a configuration in which the protection circuits 506 are connected to the source driver 504b may be employed. Alternatively, the protection circuit 506 may be configured to be connected to the terminal portion 507.

In the non-limiting example illustrated in FIG. 17A, the driver circuit portion 504 includes the gate driver 504a and the source driver 504b. For example, only the gate driver 504a is formed, and a source driver circuit (e.g., IC chip or the like) which is separately prepared may be mounted.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a carbon nanotube. Note that examples of display devices having EL elements include an EL display. Display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink, electronic liquid powder, or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Figure 17B:
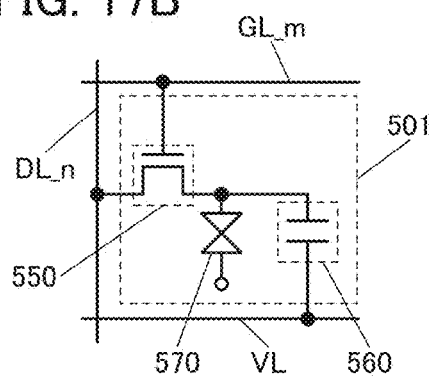

Each of the plurality of pixel circuits 501 in FIG. 17A can have a structure illustrated in FIG. 17B, for example.

The pixel circuit 501 illustrated in FIG. 17B includes the liquid crystal element 570, the transistor 550, and the capacitor 560.

The potential of one of a pair of electrodes of the liquid crystal element 570 is set according to the specifications of the pixel circuit 501 as appropriate. The alignment state of the liquid crystal element 570 depends on written data. A common potential may be applied to one of the pair of electrodes of the liquid crystal element 570 included in each of the plurality of pixel circuits 501. Further, the potential supplied to one of a pair of electrodes of the liquid crystal element 570 in the pixel circuit 501 in one row may be different from the potential supplied to one of a pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include electrically controlled birefringence (ECB) mode, polymer dispersed liquid crystal (PDLC) mode, polymer network liquid crystal (PNLC) mode, and a guest-host mode. Note that one embodiment of the present invention is not limited thereto, and various liquid crystal elements and driving methods can be used.

In the pixel circuit 501 in the m-th row and the n-th column, one of a source and a drain of the transistor 550 is electrically connected to the data line DL_n, and the other is electrically connected to the other of the pair of electrodes of the liquid crystal element 570. A gate electrode of the transistor 550 is electrically connected to a scan line GL_m. The transistor 550 has a function of controlling whether to write a data signal by being turned on or off.

One of a pair of electrodes of the capacitor 560 is electrically connected to a wiring to which a potential is supplied (hereinafter, referred to as a potential supply line VL), and the other is electrically connected to the other of the pair of electrodes of the liquid crystal element 570. The potential of the potential supply line VL is set according to the specifications of the pixel circuit 501 as appropriate. The capacitor 560 functions as a storage capacitor for storing written data.

For example, in the display device including the pixel circuit 501 in FIG. 17B, the pixel circuits 501 are sequentially selected row by row by the gate driver 504a shown in FIG. 17A, whereby the transistors 550 are turned on and a data signal is written.

When the transistors 550 are turned off, the pixel circuit 501 in which the data has been written are brought into a holding state. This operation is sequentially performed row by row; thus, an image is displayed.

Figure 17C:
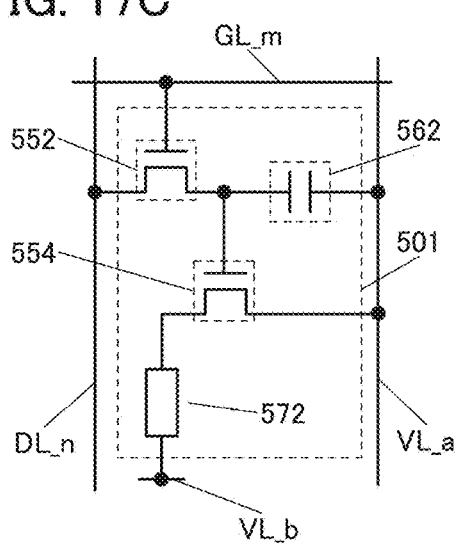

Each of the plurality of pixel circuits 501 in FIG. 17A can have the structure shown in FIG. 17C, for example.

The pixel circuit 501 shown in FIG. 17C includes transistors 552 and 554, a capacitor 562, and a light-emitting element 572.

One of a source electrode and a drain electrode of the transistor 552 is electrically connected to a wiring to which a data signal is supplied (hereinafter, referred to as a signal line DL_n). A gate electrode of the transistor 552 is electrically connected to a wiring to which a gate signal is supplied (hereinafter, referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter, referred to as a potential supply line VL_a), and the other is electrically connected to the other of the source electrode and the drain electrode of the transistor 552.

The capacitor 562 functions as a storage capacitor for retaining written data.

One of a source electrode and a drain electrode of the transistor 554 is electrically connected to a potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other of the potential supply line VL_a and the potential supply line VL_b.

For example, in the display device including the pixel circuit 501 in FIG. 17C, the pixel circuits 501 are sequentially selected row by row by the gate driver 504a shown in FIG. 17A, whereby the transistors 552 are turned on and a data signal is written.

When the transistors 552 are turned off, the pixel circuits 501 in which the data has been written are brought into a holding state. Further, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image is displayed.

For example, in this specification and the like, a transistor can employ a variety of structures. There is no limitation on the type of transistors. For example, a transistor including single-crystal silicon or a transistor including a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) whose semiconductor film is thinned can be used. In the case of using the TFT, there are various advantages. For example, since the TFT can be formed at temperature lower than that of the case of using single crystalline silicon, a reduction in manufacturing cost or an increase in size of a manufacturing apparatus can be achieved. Since the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Alternatively, transmission of light in a display element can be controlled by using the transistor formed using the light-transmitting substrate. Alternatively, part of a film included in the transistor can transmit light because the thickness of the transistor is small. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., scan line driver circuit), a source driver circuit (e.g., signal line driver circuit), and a signal processing circuit (e.g., signal generation circuit, gamma correction circuit, or DA converter circuit) can be formed over the same substrate as a pixel portion.

Note that when a catalyst (e.g., nickel) is used in the case of forming microcrystalline silicon, crystallinity can be further improved and a transistor having excellent electric characteristics can be formed. In this case, crystallinity can be improved by just performing heat treatment without performing laser irradiation. Accordingly, a gate driver circuit (e.g., a scan line driver circuit) and part of a source driver circuit (e.g., an analog switch) can be formed using the same substrate as a pixel portion. Note that when laser irradiation for crystallization is not performed, unevenness in crystallinity of silicon can be suppressed. Therefore, high-quality images can be displayed. Note that it is possible to manufacture polycrystalline silicon or microcrystalline silicon without a catalyst (e.g., nickel).

Note that it is preferable that crystallinity of silicon be improved to polycrystal, microcrystal, or the like in the whole panel; however, the present invention is not limited to this. Crystallinity of silicon may be improved only in part of the panel. Selective increase in crystallinity can be achieved by selective laser irradiation or the like. For example, laser light may be emitted only to a peripheral driver circuit region which is a region excluding pixel, a region such as a gate driver circuit and a source driver circuit, or part of a source driver circuit (e.g., an analog switch). Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Thus, a region whose crystallinity is improved is small, so that manufacturing steps can be decreased. Thus, throughput can be increased and manufacturing cost can be reduced. Alternatively, since the number of necessary manufacturing apparatuses is small, manufacturing cost can be reduced.

Note that for example, a transistor including a compound semiconductor (e.g., SiGe, GaAs, and the like), an oxide semiconductor (e.g., Zn—O, In—Ga—Zn—O, In—Zn—O (indium zinc oxide), In—Sn—O, Sn—O, Ti—O, and Al—Zn—Sn—O, In—Sn—Zn—O), or the like can be used as a transistor. Alternatively, a thin film transistor obtained by thinning any of the compound semiconductors or the oxide semiconductors cam be used. Since the manufacturing temperature can be lowered, such a transistor can be formed at room temperature, for example. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used for a wiring, a resistor, a pixel electrode, a light-transmitting electrode, or the like. Since such an element can be deposited or formed at the same time as the transistor, cost can be reduced.

Note that for example, a transistor or the like formed by an inkjet method or a printing method can be used as a transistor. Accordingly, a transistor can be formed at room temperature, can be formed at a low vacuum, or can be formed using a large substrate. Therefore, the transistor can be formed without use of a mask (reticle), so that the layout of the transistor can be easily changed. Alternatively, since the transistor can be formed without use of a resist, the material cost is reduced and the number of steps can be reduced. Further, since a film can be formed where needed, a material is not wasted as compared to a manufacturing method by which etching is performed after the film is formed over the entire surface; thus, costs can be reduced.

Note that for example, a transistor or the like including an organic semiconductor or a carbon nanotube can be used as a transistor. Accordingly, such a transistor can be formed using a substrate which can be bent. A device including a transistor which includes an organic semiconductor or a carbon nanotube can resist a shock.

Note that transistors with a variety of different structures can be used as a transistor. For example, a MOS transistor, a junction transistor, a bipolar transistor, or the like can be used as a transistor. By using a MOS transistor as a transistor, the size of the transistor can be reduced. Thus, a large number of transistors can be mounted. With use of a bipolar transistor as a transistor, a large amount of current can flow. Thus, a circuit can be operated at high speed. Note that a MOS transistor and a bipolar transistor may be formed over one substrate. Thus, a reduction in power consumption, reduction in size, high speed operation, and the like can be achieved.

The structure described in this embodiment can be used in appropriate combination with the structure described in any of the other embodiments.

Embodiment 4

In this embodiment, a display module which can be formed using a display device of one embodiment of the present invention will be described.

Figure 18:
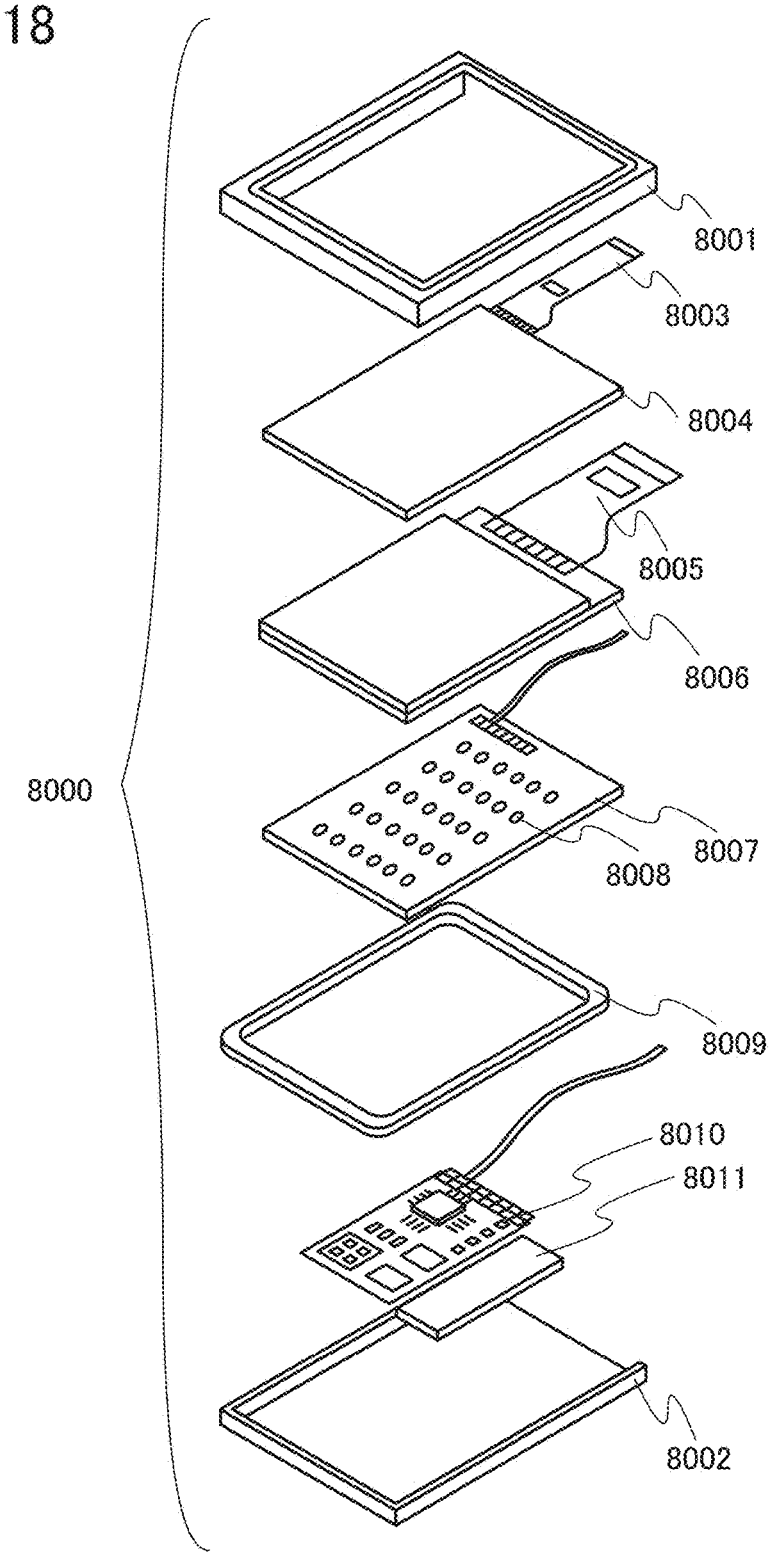
FIG. 18 illustrates a display module.

In a display module 8000 in FIG. 18, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006. The upper cover 8001 and the lower cover 8002 may have flexibility.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 so that the touch panel 8004 can function as an optical touch panel. The touch panel 8004 may have flexibility.

The backlight unit 8007 includes a light source 8008. Note that although a structure in which the light sources 8008 are provided over the backlight unit 8007 is illustrated in FIG. 18, one embodiment of the present invention is not limited to this structure. For example, a structure in which a light source 8008 is provided at an end portion of the backlight unit 8007 and a light diffusion plate is further provided may be employed. In the case where a self-luminous light-emitting element such as an organic EL element is used or the case where a reflective panel is used, the backlight unit 8007 is not necessarily provided. The backlight unit 8007 may have flexibility.

The frame 8009 protects the display panel 8006 and functions as an electromagnetic shield for blocking electromagnetic waves generated by the operation of the printed board 8010. The frame 8009 can function as a radiator plate. The frame 8009 may have flexibility.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source. The printed board 8010 may be an FPC.

The display module 8000 may be additionally provided with a member such as a polarizing plate, a retardation plate, or a prism sheet.

The structure described in this embodiment can be used in appropriate combination with the structure described in any of the other embodiments.

Embodiment 5

In this embodiment, a transistor that can be used for a display device of one embodiment of the present invention and a material included in the transistor will be described. The transistor described in this embodiment can be used for the transistors 350, 352, 550, 552, 554, and the like described in the above embodiment. Note that the transistor described in this embodiment has a structure in a state before being transferred to a flexible substrate.

Figure 19A:
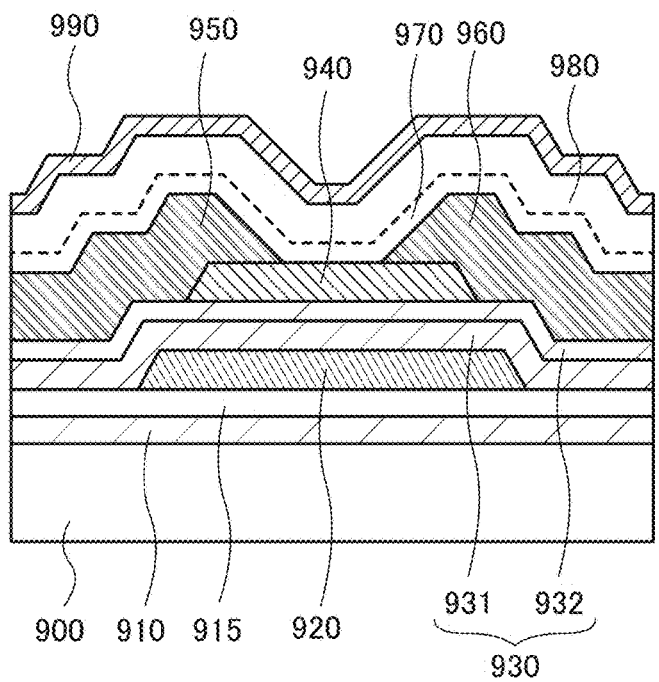
FIGS. 19A and 19B are each a cross-sectional view illustrating a transistor.

FIG. 19A is a cross-sectional view of an example of a transistor that can be used in a display device of one embodiment of the present invention. The transistor includes an organic resin layer 910 over a substrate 900, an insulating film 915, a gate electrode layer 920, a gate insulating film 930 in which an gate insulating film 931 and an gate insulating film 932 are stacked in this order, an oxide semiconductor layer 940, and a source electrode layer 950 and a drain electrode layer 960 in contact with part of the oxide semiconductor layer. In addition, an insulating film 970, an insulating film 980, and an insulating film 990 may be formed over the gate insulating film 930, the oxide semiconductor layer 940, the source electrode layer 950, and the drain electrode layer 960.

Figure 19B:
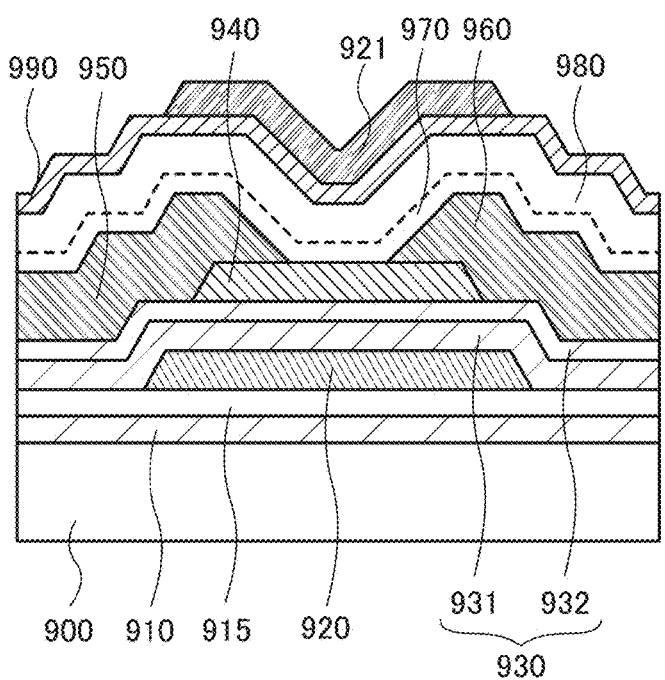

The transistor of one embodiment of the present invention may include, as illustrated in FIG. 19B, a conductive film 921 that overlaps with the gate electrode layer 920 and the oxide semiconductor layer 940 and is over the insulating film 980 or the insulating film 990. When the conductive film is used as a second gate electrode layer (back gate), the on-state current can be increased and the threshold voltage can be controlled. To increase the on-state current, for example, the gate electrode layer 920 and the conductive film 921 are set to have the same potential, and the transistor is driven as a dual-gate transistor. Further, to control the threshold voltage, a fixed potential that is different from a potential of the gate electrode layer 920 is supplied to the conductive film 921.

Figure 25A:
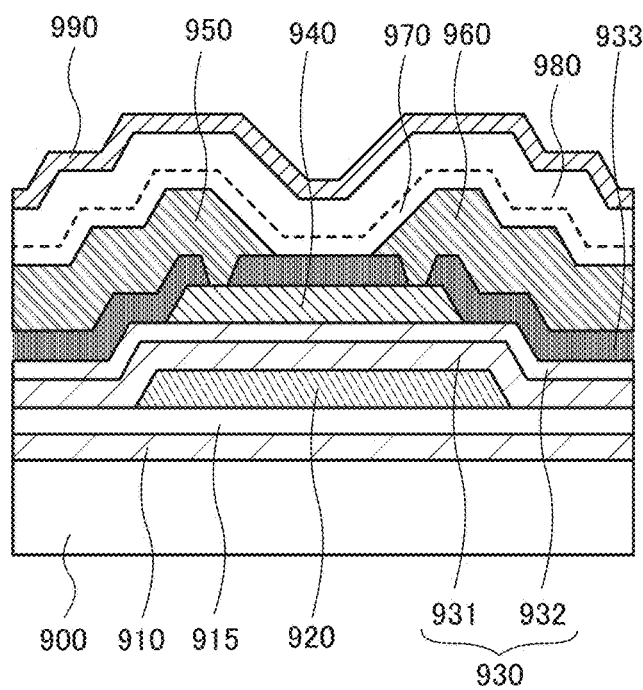
FIGS. 25A and 25B are each a cross-sectional view illustrating a transistor.
Figure 25B:
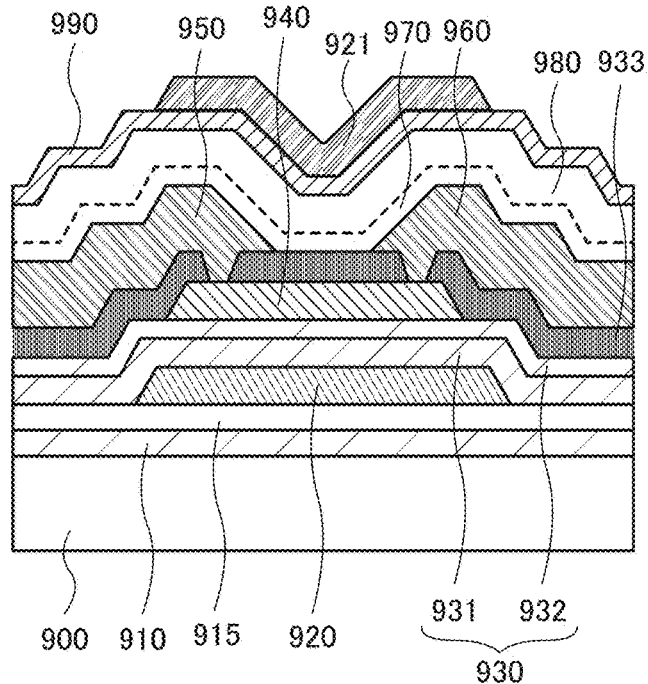

The transistor of one embodiment of the present invention may have a channel-protective bottom-gate structure as illustrated in FIGS. 25A and 25B. In this structure, an insulating film 933 has a function of protecting a channel region. Thus, the insulating film 933 may be provided only in a region overlapping with the channel region or provided in a region besides the region as illustrated in FIGS. 25A and 25B.

Figure 26A:
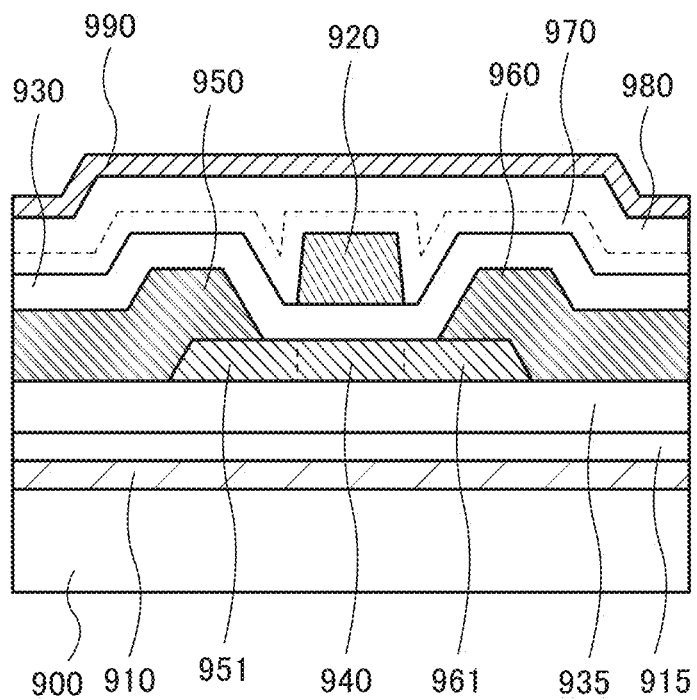
FIGS. 26A and 26B are each a cross-sectional view illustrating a transistor.
Figure 26B:
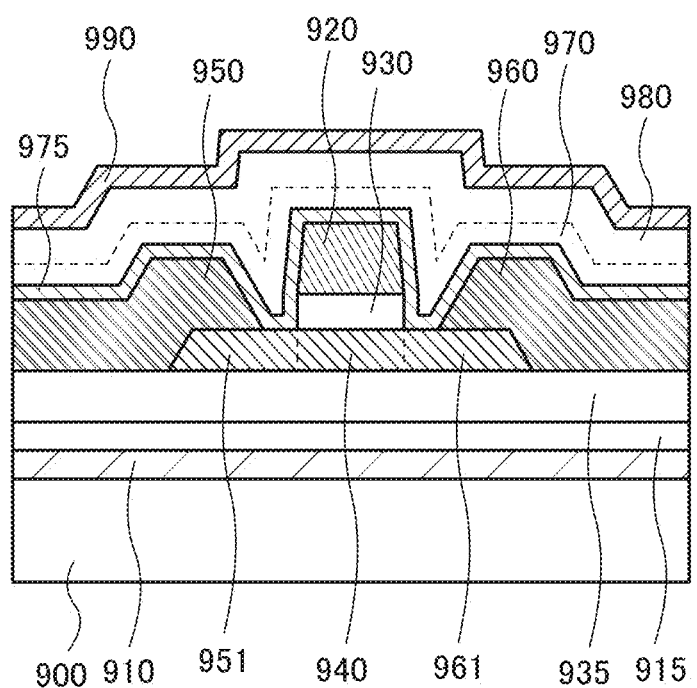

The transistor of one embodiment of the present invention may have a self-aligned top-gate structure as illustrated in FIGS. 26A and 26B. In the structure in FIG. 26A, a source region 951 and a drain region 961 can be formed in the following manner: oxygen vacancies are generated by making the source electrode layer 950 and the drain electrode layer 960 being in contact with an oxide semiconductor layer; or the oxide semiconductor layer is doped with impurities such as boron, phosphorus, or argon using the gate electrode layer 920 as a mask. In the structure in FIG. 26B, the source region 951 and the drain region 961 can be formed, instead of using the doping method, in the following manner: an insulating film 975 containing hydrogen, such as a silicon nitride film, is formed to be in contact with part of the oxide semiconductor layer 940 and the hydrogen is diffused to the part of the oxide semiconductor layer 940.

Figure 27A:
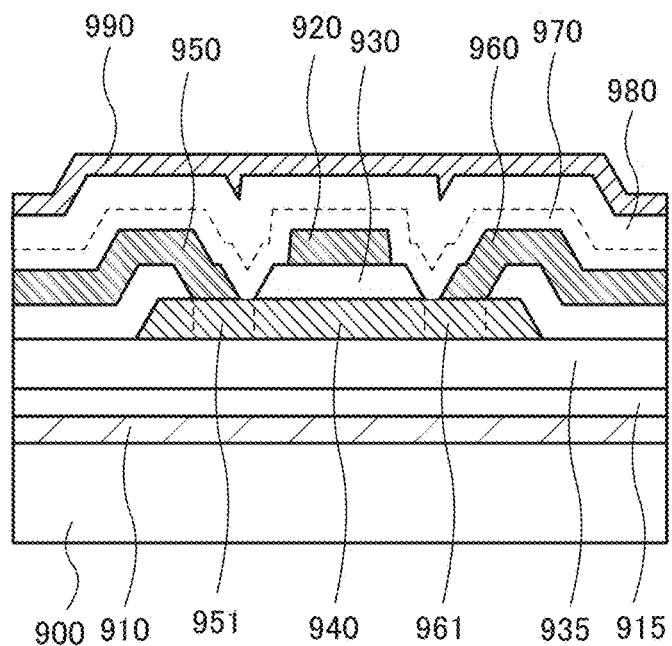
FIGS. 27A and 27B are each a cross-sectional view illustrating a transistor.

The transistor of one embodiment of the present invention may have a self-aligned top-gate structure as illustrated in FIG. 27A. In the structure in FIG. 27A, the source region 951 and the drain region 961 can be formed in the following manner: oxygen vacancies are generated by making the source electrode layer 950 and the drain electrode layer 960 being in contact with an oxide semiconductor layer; or the oxide semiconductor layer is doped with impurities such as boron, phosphorus, or argon using the gate insulating film 930 as a mask. In the structure in FIG. 27A, the source electrode layer 950, the drain electrode layer 960, and the gate electrode layer 920 can be formed in one process.

Figure 27B:
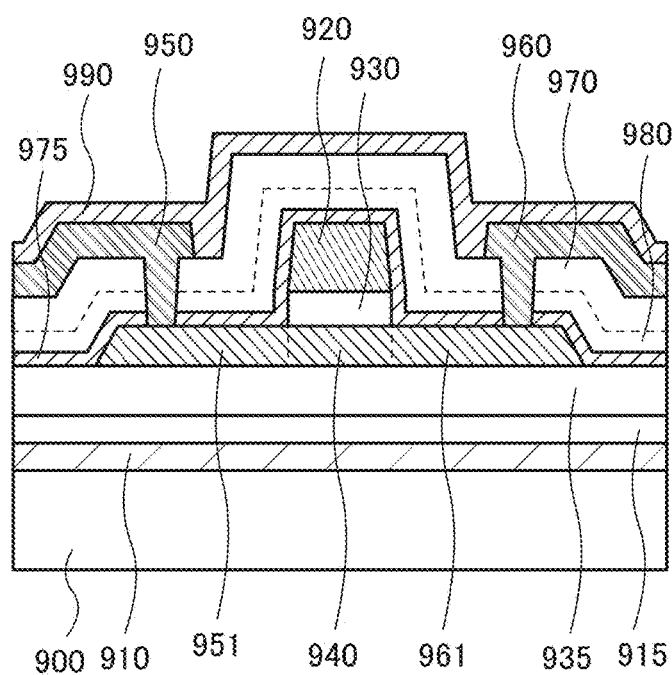

The transistor of one embodiment of the present invention may have a self-aligned top-gate structure as illustrated in FIG. 27B. In the structure in FIG. 27B, the source region 951 and the drain region 961 can be formed, besides using the doping method with impurities such as boron, phosphorus, or argon using the gate insulating film 930 as a mask, in the following manner: the insulating film 975 containing hydrogen, such as a silicon nitride film, is formed to be in contact with part of the oxide semiconductor layer 940 and the hydrogen is diffused to the part of the oxide semiconductor layer 940. In the structure, the source region 951 and the drain region 961 can have lower resistance. Alternatively, a structure in which doping with the impurities is not performed or a structure without the insulating film 975 can be formed.

Note that elements which form oxygen vacancies in the oxide semiconductor layer are described as impurities (impurity elements). Typical examples of impurity elements are boron, carbon, nitrogen, fluorine, aluminum, silicon, phosphorus, chlorine, and rare gas elements. Typical examples of rare gas elements are helium, neon, argon, krypton, and xenon.

When hydrogen is added to an oxide semiconductor in which an oxygen vacancy is generated by addition of an impurity element, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

The temperature dependence of resistivity in a film formed using an oxide conductor (hereinafter, referred to as oxide conductive layer) is described with reference to FIG. 36.

Here, a sample including an oxide conductive layer was formed. As the oxide conductive layer, the following oxide conductive layers were formed: an oxide conductive layer (OC_SiN$_x$) formed by making a silicon nitride film being in contact with an oxide semiconductor layer; an oxide conductive layer (OC_Ar dope+SiN$_x$) formed by adding argon to an oxide semiconductor layer with an doping apparatus and making the oxide semiconductor layer being in contact with a silicon nitride film; and an oxide conductive layer (OC_Ar plasma+SiN$_x$) formed by exposing an oxide semiconductor layer to argon plasma with a plasma treatment apparatus and making the oxide semiconductor layer being in contact with a silicon nitride film. The silicon nitride film contains hydrogen.

A method for forming a sample including the oxide conductive layer (OC_SiN$_x$) is described below. A 400-nm-thick silicon oxynitride film was deposited over a glass substrate by a plasma CVD method and then exposed to oxygen plasma so that an oxygen ion was added to the silicon oxynitride film, whereby an oxynitride silicon film from which oxygen is released by heating was formed. Next, over the oxynitride silicon film from which oxygen is released by heating, a 100-nm-thick In—Ga—Zn oxide film was deposited by a sputtering method using a sputtering target with an atomic ratio In:Ga:Zn=5:5:6, subjected to heat treatment in a nitrogen atmosphere at 450° C., and then subjected to heat treatment in a mixed gas of nitrogen and oxygen at 450° C. Next, a 100-nm-thick silicon nitride film was deposited by a plasma CVD method. Then, the film was subjected to heat treatment in a mixed gas of nitrogen and oxygen at 350° C.

A method for forming a sample including the oxide conductive layer (OC_Ar dope+SiN$_x$) is described below. A 400-nm-thick silicon oxynitride film was deposited over a glass substrate by a plasma CVD method and then exposed to oxygen plasma so that an oxygen ion was added to the silicon oxynitride film, whereby an oxynitride silicon film from which oxygen is released by heating was formed. Next, over the oxynitride silicon film from which oxygen is released by heating, a 100-nm-thick In—Ga—Zn oxide film was deposited by a sputtering method using a sputtering target with an atomic ratio In:Ga:Zn=5:5:6, subjected to heat treatment in a nitrogen atmosphere at 450° C., and then subjected to heat treatment in a mixed gas of nitrogen and oxygen at 450° C. Next, with a doping apparatus, argon with a dose of $5 \times 10^{14}/cm^2$ was added to the In—Ga—Zn oxide film at an accelerating voltage of 10 kV, whereby an oxygen vacancy was formed in the In—Ga—Zn oxide film. Next, a 100-nm-thick silicon nitride film was deposited by a plasma CVD method. Then, the film was subjected to heat treatment in a mixed gas of nitrogen and oxygen at 350° C.

A method for forming a sample including the oxide conductive layer (OC_Ar plasma+SiN$_x$) is described below. A 400-nm-thick silicon oxynitride film was deposited over a glass substrate by a plasma CVD method and then exposed to oxygen plasma, whereby an oxynitride silicon film from which oxygen is released by heating was formed. Next, over the oxynitride silicon film from which oxygen is released by heating, a 100-nm-thick In—Ga—Zn oxide film was deposited by a sputtering method using a sputtering target with an atomic ratio In:Ga:Zn=5:5:6, subjected to heat treatment in a nitrogen atmosphere at 450° C., and then subjected to heat treatment in a mixed gas of nitrogen and oxygen at 450° C. Next, argon plasma was generated with a plasma treatment apparatus, and an accelerated argon ion was made to collide against the In—Ga—Zn oxide film, whereby an oxygen vacancy was generated. Next, a 100-nm-thick silicon nitride film was deposited by a plasma CVD method. Then, the film was subjected to heat treatment in a mixed gas of nitrogen and oxygen at 350° C.

Figure 36:
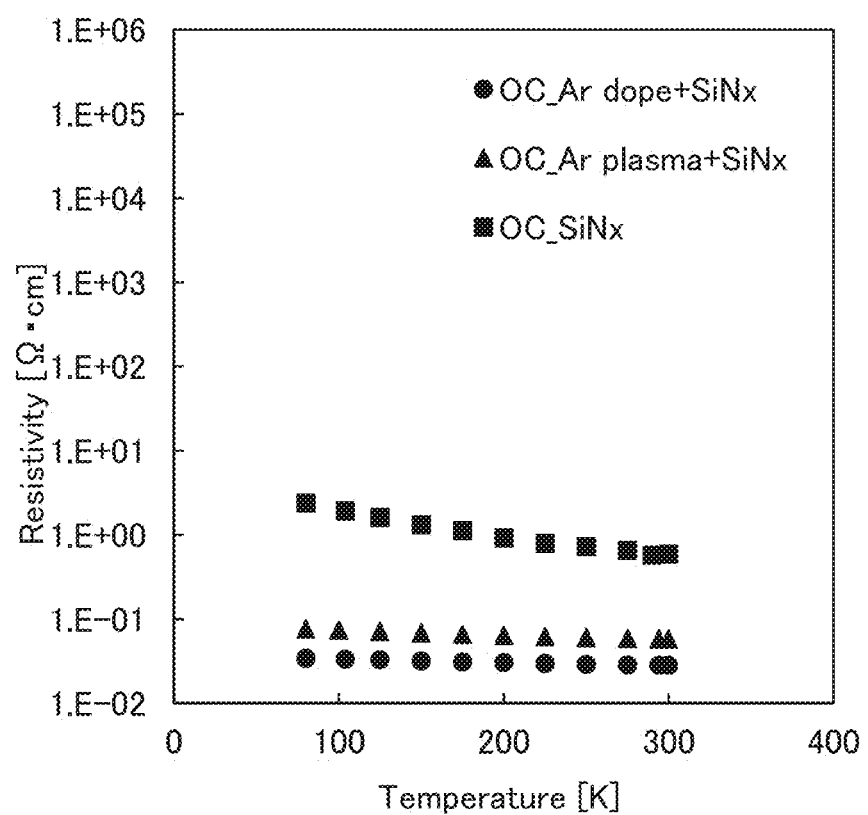
FIG. 36 shows temperature dependence of resistivity.

FIG. 36 shows the measured resistivity of each sample. The measurement of resistivity was performed by the four probe Van der Pauw method. In FIG. 36, the horizontal axis represents measurement temperature, and the vertical axis represents resistivity. Squares, triangles, and circles indicates the measurement results of oxide conductive layer (OC_SiN$_x$), the measurement results of oxide conductive layer (OC_Ar dope+SiN$_x$), and the measurement results of oxide conductive layer (OC_Ar plasma+SiN$_x$), respectively.

The oxide semiconductor layer that is not in contact with the silicon nitride film, though not shown, had high resistivity, and it was difficult to measure the resistivity. Thus, it is found that the oxide conductive layer has lower resistivity than the oxide semiconductor layer.

According to FIG. 36, in the case where the oxide conductive layer (OC_Ar dope+SiN$_x$) and the oxide conductive layer (OC_Ar plasma+SiN$_x$) contain oxygen vacancy and hydrogen, a variation in resistivity is small. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductive layer is used as a source region and a drain region of a transistor, an ohmic contact occurs at a portion where the oxide conductive layer is in contact with a conductive film functioning as a source electrode and a drain electrode, and the contact resistance of the oxide conductive layer and the conductive film functioning as a source electrode and a drain electrode can be reduced. Furthermore, the oxide conductor has low temperature resistance of resistivity; thus, a fluctuation of contact resistance of the oxide semiconductor layer and a conductive film functioning as a source electrode and a drain electrode is small, and a highly reliable transistor can be formed.

Figure 28A:
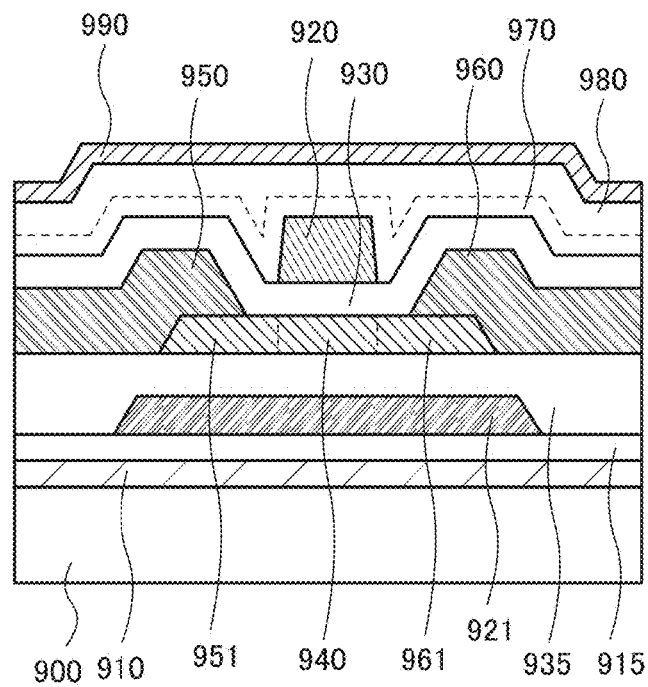
FIGS. 28A and 28B are each a cross-sectional view illustrating a transistor.
Figure 28B:
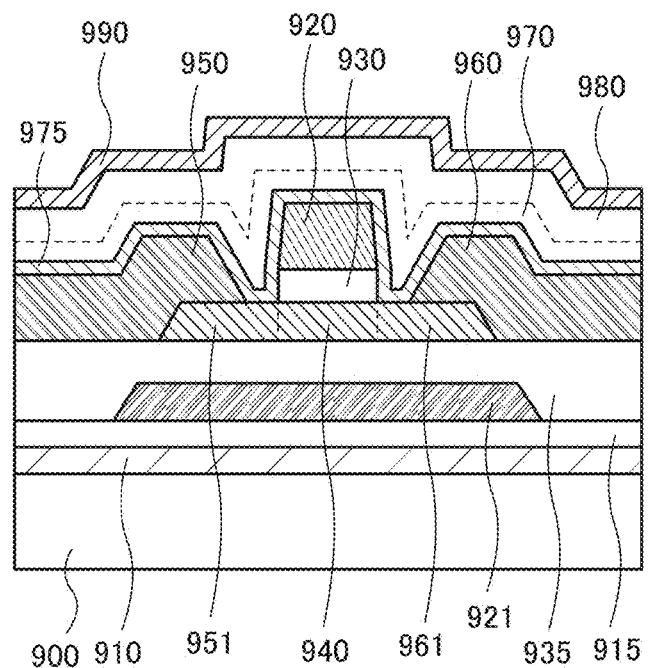

The transistor of one embodiment of the present invention may include a conductive film 921 overlapping with the oxide semiconductor layer 940 with the gate insulating film 935 interposed therebetween as illustrated in FIGS. 28A and 28B. Although FIGS. 28A and 28B illustrate examples where the conductive film 921 is provided in the transistors illustrated in FIGS. 26A and 26B, the conductive film 921 can be provided in the transistors illustrated in FIGS. 27A and 27B.

In the display device of one embodiment of the present invention, an oxide semiconductor is used in an active layer as described above. The transistor using an oxide semiconductor layer has a higher mobility than a transistor using amorphous silicon, and is thus easily reduced in size, resulting in a reduction in the size of a pixel. The transistor using an oxide semiconductor layer enables a flexible display device to have high reliability. Note that an embodiment of the present invention is not limited thereto. An active layer may include a semiconductor other than an oxide semiconductor depending on the case or condition.

Note that as illustrated in FIGS. 19A and 19B and the like, the width of the gate electrode layer 920 is preferably larger than that of the oxide semiconductor layer 940. In the display device having a backlight, the gate electrode layer functions as a light-blocking layer, and a deterioration of electric characteristics, caused by irradiation of the oxide semiconductor layer 940 with light, can be suppressed. In an EL display device, a gate electrode in a top-gate transistor can function as a light-blocking layer.

Next, the components of the transistor of one embodiment of the present invention will be described in detail.

The substrate 900 is preferably a rigid substrate because a step of transferring the component to a flexible substrate is easily performed. For example, a glass substrate, a ceramic substrate, a quartz substrate, a sapphire substrate, a metal substrate, or the like can be used. Note that the substrate 900 corresponds to the first substrate 462 in Embodiment 1.

As the organic resin layer 910, for example, an organic resin such as an epoxy resin, an aramid resin, an acrylic resin, a polyimide resin, a polyamide resin, or a polyamide-imide resin can be used. Note that the organic resin layer 910 corresponds to the organic resin layer 320a in Embodiment 1.

As the insulating film 915, for example, a single layer such as a silicon oxide film, a silicon oxynitride film, a silicon nitride film, or a silicon nitride oxide film, or a stacked film including any of the above films can be used. The insulating film 915 corresponds to the first insulating film 321a in Embodiment 1.

The gate electrode layer 920 and the conductive film 921 can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), or cobalt (Co), an alloy including the above metal element, an alloy in which any of the above metal elements are combined, or the like. Furthermore, the gate electrode layer 920 may have a single-layer structure or a stacked structure of two or more layers.

Alternatively, the gate electrode layer 920 and the conductive film 921 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode layer 920 and the gate insulating film 932.

As each of the gate insulating films 931 and 932 that are the gate insulating film 930, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked structure of the gate insulating films 931 and 932, the gate insulating film 930 may be an insulating film of a single layer formed using a material selected from the above or an insulating film of three or more layers.

Note that the gate insulating film 932 that is in contact with the oxide semiconductor layer 940 functioning as a channel formation region of the transistor is preferably an oxide insulating film and preferably has a region (oxygen-excess region) containing oxygen in excess of the stoichiometric composition. In other words, the gate insulating film 932 is an insulating film from which oxygen can be released. In order to provide the oxygen-excess region in the gate insulating film 932, the gate insulating film 932 is formed in an oxygen atmosphere, for example. Alternatively, oxygen may be introduced into the deposited gate insulating film 932 to provide the oxygen-excess region therein. Oxygen can be introduced by an ion implantation method, an ion doping method, a plasma immersion ion implantation method, plasma treatment, or the like.

In the case where hafnium oxide is used for the gate insulating films 931 and 932, the following effect is attained. Hafnium oxide has higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 931, and a silicon oxide film is formed as the gate insulating film 932. In addition, a silicon nitride film has a higher dielectric constant than a silicon oxide film and needs a larger thickness for capacitance equivalent to that of the silicon oxide. Thus, when a silicon nitride film is used for the gate insulating film 930 of the transistor, the physical thickness of the gate insulating film can be increased. From the above, the electrostatic breakdown of the transistor can be prevented by inhibiting a reduction in the withstand voltage of the transistor and further improving the withstand voltage of the transistor.

The oxide semiconductor layer 940 is typically formed using an In—Ga oxide, an In—Zn oxide, or an In-M-Zn oxide (M is Al, Ti, Ga, Y, Zr, La, Ce, Nd, Sn, or Hf). In particular, an In-M-Zn oxide (M is Al, Ti, Ga, Y, Zr, La, Ce, Nd, Sn, or Hf) is preferably used for the oxide semiconductor layer 940.

In the case where the oxide semiconductor layer 940 is an In-M-Zn oxide (M is Al, Ti, Ga, Y, Zr, La, Ce, Nd, Sn, or Hf), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=5:5:6, and In:M:Zn=3:1:2 are preferable. Note that the atomic ratio of metal elements in the formed oxide semiconductor layer 940 varies from the above atomic ratio of metal elements of the sputtering target within a range of ±40% as an error.

In the case of using an In-M-Zn oxide for the oxide semiconductor layer 940, when Zn and O are eliminated from consideration, the proportion of In and the proportion of M are preferably greater than or equal to 25 atomic % and less than 75 atomic %, respectively, further preferably greater than or equal to 34 atomic % and less than 66 atomic %, respectively.

The energy gap of the oxide semiconductor layer 940 is 2 eV or more, preferably 2.5 eV or more, and more preferably 3 eV or more. In this manner, the amount of off-state current of a transistor can be reduced by using an oxide semiconductor having a wide energy gap.

The oxide semiconductor layer 940 has a thickness greater than or equal to 3 nm and less than or equal to 200 nm, preferably 3 nm to 100 nm, and further preferably 3 nm to 50 nm.

An oxide semiconductor layer with low carrier density is used as the oxide semiconductor layer 940. For example, an oxide semiconductor layer whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$ is used as the oxide semiconductor layer 940.

However, the composition is not limited to those described above, and a material having the appropriate composition may be used depending on required semiconductor characteristics and electrical characteristics of the transistor (e.g., field-effect mobility and threshold voltage). Further, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layer 940 be set to appropriate values.

Further, in the oxide semiconductor layer, hydrogen, nitrogen, carbon, silicon, and metal elements except for main components are impurities. For example, hydrogen and nitrogen form donor levels to increase the carrier density. Silicon forms impurity levels in the oxide semiconductor layer. The impurity level becomes a trap, which might deteriorate the electric characteristics of the transistor. It is preferable to reduce the concentration of the impurities in the oxide semiconductor layer and at interfaces with other layers.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density which is lower than $1 \times 10^{17}/cm^3$, preferably lower than $1 \times 10^{15}/cm^3$, further preferably lower than $1 \times 10^{13}/cm^3$, particularly preferably lower than $8 \times 10^{11}/cm^3$, still further preferably lower than $1 \times 10^{11}/cm^3$, yet further preferably lower than $1 \times 10^{10}/cm^3$, and is $1 \times 10^{-9}/cm^3$ or higher.

In order to make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is lower than $1 \times 10^{19}$ atoms/cm$^3$, preferably lower than $5 \times 10^{18}$ atoms/cm$^3$, more preferably lower than $1 \times 10^{18}$ atoms/cm$^3$. Further, the concentration of hydrogen at a certain depth of the oxide semiconductor layer or in a region of the oxide semiconductor layer is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Further, the concentration of nitrogen at a certain depth of the oxide semiconductor layer or in a region of the oxide semiconductor layer is lower than $5 \times 10^{19}$ atoms/cm$^3$, preferably lower than or equal to $5 \times 10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$, for example.

Various experiments can prove low off-state current of a transistor including a highly purified oxide semiconductor layer for a channel formation region. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In this case, it can be seen that the off-state current normalized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor layer is used for a channel formation region of the transistor, and the off-state current density of the transistor is measured by a change in the amount of electric charge of the capacitor per unit time. As a result, it is found that in the case where the voltage between the source electrode and the drain electrode of the transistor is 3 V, lower off-state current of several tens of yoctoamperes per micrometer (yA/μm) can be obtained. Accordingly, the off-state current of the transistor including a channel formation region formed of the highly purified oxide semiconductor layer is considerably lower than that of a transistor including silicon having crystallinity.

For the source electrode layer 950 and the drain electrode layer 960, a conductive film having properties of extracting oxygen from the oxide semiconductor layer is preferably used. For example, Al, Cr, Cu, Ta, Ti, Mo, W, Ni, Mn, Nd, or Sc can be used. It is also possible to use an alloy or a conductive nitride of any of these materials. It is also possible to use a stack of a plurality of materials selected from these materials, alloys of these materials, and conductive nitrides of these materials. Typically, it is preferable to use Ti, which is particularly easily bonded to oxygen, or W, which has a high melting point and thus allows subsequent process temperatures to be relatively high. Alternatively, Cu or a Cu—X alloy (X indicates Mn, Ni, Cr, Fe, Co, Mo, Ta, or Ti), which has low resistance may be used. Further alternatively, a stacked layer including any of the above materials and Cu or Cu—X alloy may be used.

In the case of using Cu—X alloy (X indicates Mn, Ni, Cr, Fe, Co, Mo, Ta, or Ti), a covering film is formed in a region in contact with the oxide semiconductor layer or a region in contact with an insulating film by heat treatment, in some cases. The covering layer includes a compound containing X. Examples of compound containing X include an oxide of X, an In—X oxide, a Ga—X oxide, an In—Ga—X oxide, and In—Ga—Zn—X oxide. When the covering film is formed, the covering film functions as a blocking film, and Cu in the Cu—X alloy film can be prevented from entering the oxide semiconductor layer.

By the conductive film capable of extracting oxygen from the oxide semiconductor layer, oxygen in the oxide semiconductor layer is released to form oxygen vacancies in the oxide semiconductor film. Hydrogen slightly contained in the layer and the oxygen vacancy are bonded to each other, whereby the region is markedly changed to an n-type region. Accordingly, the n-type regions can serve as a source or a drain region of the transistor.

The insulating films 970, 980, and 990 each have a function of a protective insulating film. For example, the insulating film 970 is an insulating film through which oxygen can be transmitted. In addition, the insulating film 970 also has a function of lessening the damage to the oxide semiconductor layer 940 at the time of forming the insulating film 980.

As the oxide insulating film 970, a silicon oxide film, a silicon oxynitride film, or the like having a thickness greater than or equal to 5 nm and less than or equal to 150 nm, preferably greater than or equal to 5 nm and less than or equal to 50 nm can be used. Note that in this specification, "silicon oxynitride film" refers to a film that contains more oxygen than nitrogen, and "silicon nitride oxide film" refers to a film that contains more nitrogen than oxygen.

Further, it is preferable that the number of defects in the insulating film 970 be small and typically, the spin density of a signal that appears at g=2.001 due to a dangling bond of silicon be lower than or equal to $3\times10^{17}$ spins/cm$^3$ by electron spin resonance (ESR) measurement. This is because if the density of defects in the insulating film 970 is high, oxygen is bonded to the defects and the amount of oxygen that passes through the insulating film 970 is decreased.

The insulating film 980 is formed using an oxide insulating film whose oxygen content is in excess of that in the stoichiometric composition. Part of oxygen is released by heating from the oxide insulating film containing oxygen content than that in the stoichiometric composition. The oxide insulating film containing oxygen content than that in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis in which heat treatment is performed such that a temperature of a film surface is higher than or equal to 100° C. and lower than or equal to 700° C. or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used for the insulating film 980.

Further, it is preferable that the amount of defects in the insulating film 980 be small, typically the spin density of a signal which appears at g=2.001 originating from a dangling bond of silicon, be lower than $1.5\times10^{18}$ spins/cm$^3$, further preferably lower than or equal to $1\times10^{18}$ spins/cm$^3$ by ESR measurement. Note that the insulating film 980 is provided more apart from the oxide semiconductor layer 940 than the insulating film 970 is; thus, the insulating film 980 may have higher defect density than the insulating film 970.

Furthermore, since the insulating films 970 and 980 can be formed using the same kind of material, it may be difficult to clearly distinguish the boundary between the insulating film 970 and the insulating film 980. Thus, in this embodiment, the boundary between the insulating films 970 and 980 is shown by a dashed line. Although a two-layer structure of the insulating films 970 and 980 is described in this embodiment, the present invention is not limited to this. For example, a single-layer structure of the insulating film 970, a single-layer structure of the insulating film 980, or a stacked-layer structure including three or more layers may be used.

The insulating film 990 can have a function of blocking oxygen, hydrogen, water, an alkali metal, an alkaline earth metal, or the like. With the insulating film 990, oxygen diffusion from the oxide semiconductor layer 940 to the outside and entry of hydrogen, water, or the like from the outside to the oxide semiconductor layer 940 can be prevented. As the insulating film 990, a nitride insulating film can be used, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Figure 20A:
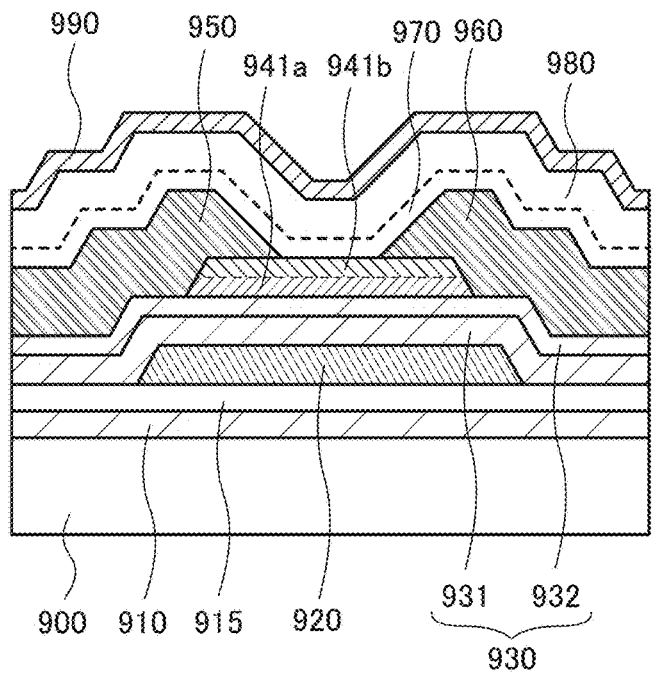
FIGS. 20A and 20B are each a cross-sectional view illustrating a transistor.

Note that the oxide semiconductor layer 940 may have a structure in which a plurality of oxide semiconductor layers are stacked. For example, as in a transistor illustrated in FIG. 20A, stacked layers of a first oxide semiconductor layer 941a and a second oxide semiconductor layer 941b may constitute the oxide semiconductor layer 940. The first oxide semiconductor layer 941a and the second oxide semiconductor layer 941b may include metal oxides having different atomic ratios. For example, one of the oxide semiconductor layers may include one of an oxide containing two kinds of metals, an oxide containing three kinds of metals, and an oxide containing four kinds of metals, and the other of the oxide semiconductor layers may include another one of the oxide containing two kinds of metals, the oxide containing three kinds of metals, and the oxide containing four kinds of metals.

Alternatively, the first oxide semiconductor layer 941a and the second oxide semiconductor layer 941b may include the same constituent elements with different atomic ratios. For example, one of the oxide semiconductor layers may contain In, Ga, and Zn at an atomic ratio of 1:1:1, 5:5:6, or 3:1:2, and the other of the oxide semiconductor layers may contain In, Ga, and Zn at an atomic ratio of 1:3:2, 1:3:4, 1:3:6, 1:4:5, 1:6:4, or 1:9:6. Note that the atomic ratio of each oxide semiconductor layer varies within a range of ±20% of the above atomic ratio as an error.

In the above, one of the oxide semiconductor layers, which is closer to the gate electrode (the oxide semiconductor layer on the channel side), has an atomic ratio of In≥Ga (in the atomic ratio, In is greater than or equal to Ga); and the other oxide semiconductor layer, which is farther from the gate electrode (the oxide semiconductor layer on the back channel side), has an atomic ratio of In<Ga. In that case, a transistor with a high field-effect mobility can be manufactured. On the other hand, when the oxide semiconductor layer on the channel side has an atomic ratio of In<Ga and the oxide semiconductor layer on the back channel side has an atomic ratio of In≥Ga (in the atomic ratio, In is greater than or equal to Ga), it is possible to reduce the amount of change in the threshold voltage of a transistor due to change over time or a reliability test.

Further alternatively, the semiconductor film of the transistor may have a three-layer structure of a first oxide semiconductor layer, a second oxide semiconductor layer, and a third oxide semiconductor layer. In that case, the first to third oxide semiconductor layers may include the same constituent elements with different atomic ratios. A transistor including a three-layer semiconductor film will be described with reference to FIG. 20B and FIGS. 29A and 29B. Note that a structure in which a semiconductor film has a multilayer structure can be employed for the other transistor described in this embodiment.

Figure 20B:
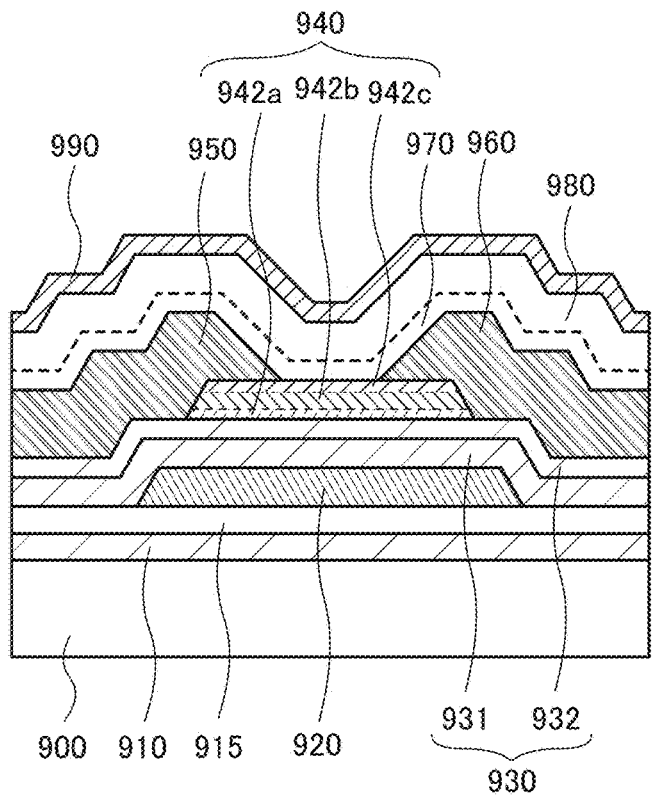
Figure 29A:
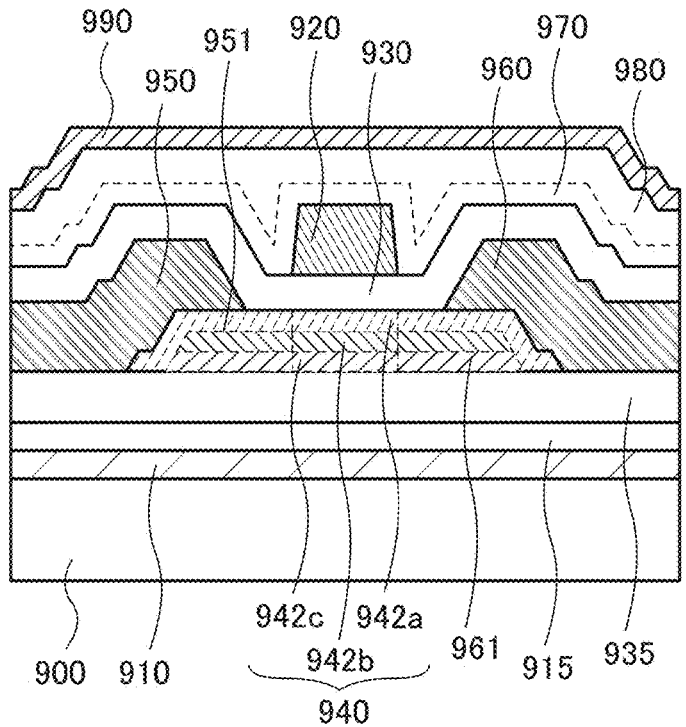
FIGS. 29A and 29B are each a cross-sectional view illustrating a transistor.
Figure 29B:
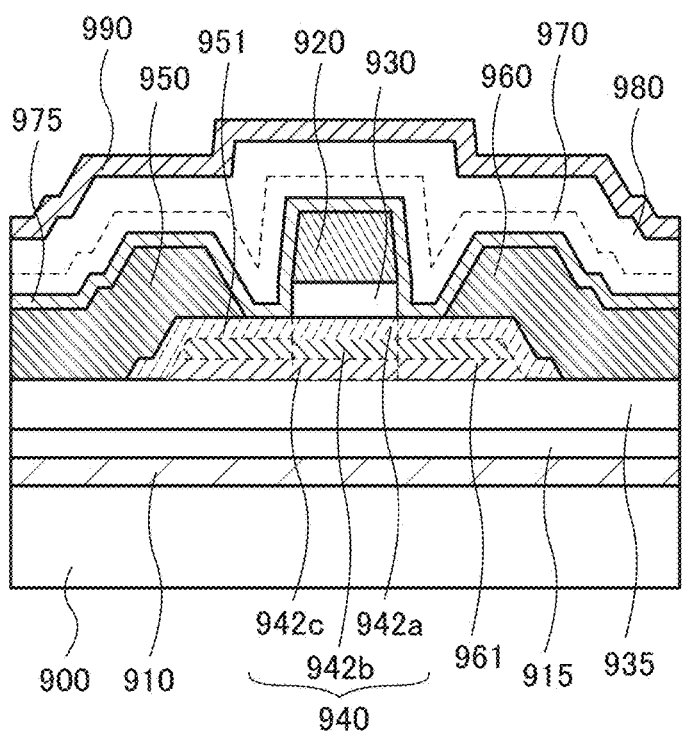

Each transistor illustrated in FIG. 20B and FIGS. 29A and 29B includes the third oxide semiconductor layer 942a, the second oxide semiconductor layer 942b, and the first oxide semiconductor layer 942c which are stacked in this order from the gate insulating film side.

The first oxide semiconductor layer 942c and the third oxide semiconductor layer 942a are formed using a material represented by $InM_{1x}Zn_yO_z$ (x≥1, y>1, z>0, $M_1$=Ga, Hf, or the like, where x is greater than or equal to 1). The second oxide semiconductor layer 942b is formed using a material which can be represented by $InM_{2x}Zn_yO_z$ (x≥1, y≥x, z>0, $M_2$=Ga, Sn, or the like, where x is greater than or equal to 1 and y is greater than or equal to x).

Materials of the first to third oxide semiconductor layers are selected as appropriate so as to form a well-shaped structure in which the conduction band minimum in the second oxide semiconductor layer 942b is deeper from the vacuum level than the conduction band minimum in the first and third oxide semiconductor layers 942c and 942a.

For example, the first oxide semiconductor layer 942c and the third oxide semiconductor film 942a may each have an atomic ratio of In:Ga:Zn=1:1:1, 1:3:2, 1:3:4, 1:3:6, 1:4:5, 1:6:4, or 1:9:6; the second oxide semiconductor layer 942b may have an atomic ratio of In:Ga:Zn=1:1:1, 5:5:6, or 3:1:2.

Since the first to third oxide semiconductor layers 942c to 942a include the same constituent elements, the second oxide semiconductor layer 942b has few defect states (trap levels) at the interface with the third oxide semiconductor layer 942a. Specifically, the defect states (trap levels) are fewer than those at the interface between the gate insulating film and the third oxide semiconductor layer 942a. For this reason, when the oxide semiconductor layers are stacked in the above manner, the amount of change in the threshold voltage of a transistor due to a change over time or a reliability test can be reduced.

Further, materials of the first to third oxide semiconductor layers are selected as appropriate so as to form a well-shaped structure in which the conduction band minimum in the second oxide semiconductor layer 942b is deeper from the vacuum level than the conduction band minimum in the first and third oxide semiconductor layers 942c and 942a. As a result, the field-effect mobility of the transistor can be increased and the amount of change in the threshold voltage of the transistor due to change over time or a reliability test can be reduced.

Further, the first to third oxide semiconductor layers 942c to 942a may be formed using oxide semiconductors having different crystallinities. Note that at least the second oxide semiconductor layer 942b that can function as a channel formation region is preferably a film with crystallinity, further preferably a film in which c-axes are aligned perpendicularly to a surface.

Figure 35A:
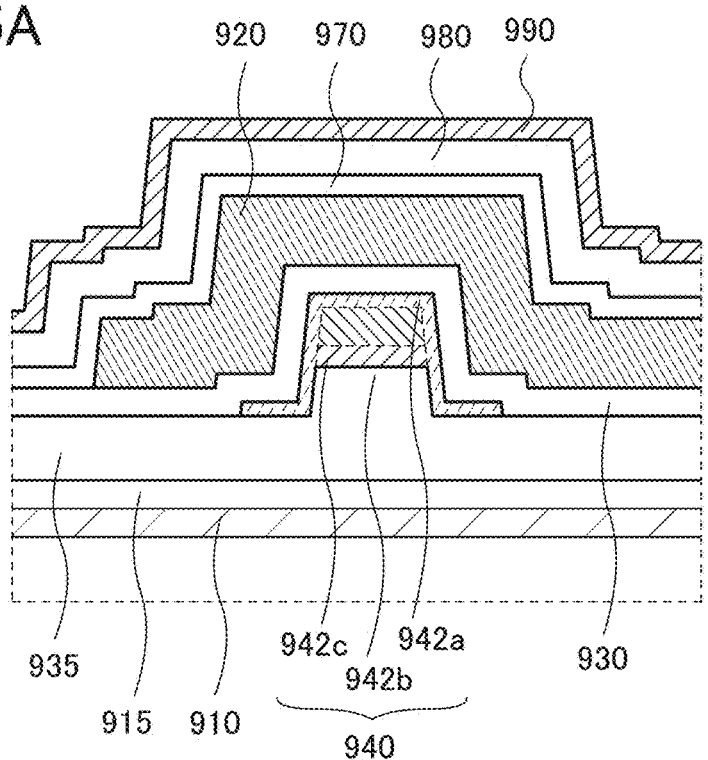
FIGS. 35A and 35B are cross-sectional views each illustrating a transistor.
Figure 35B:
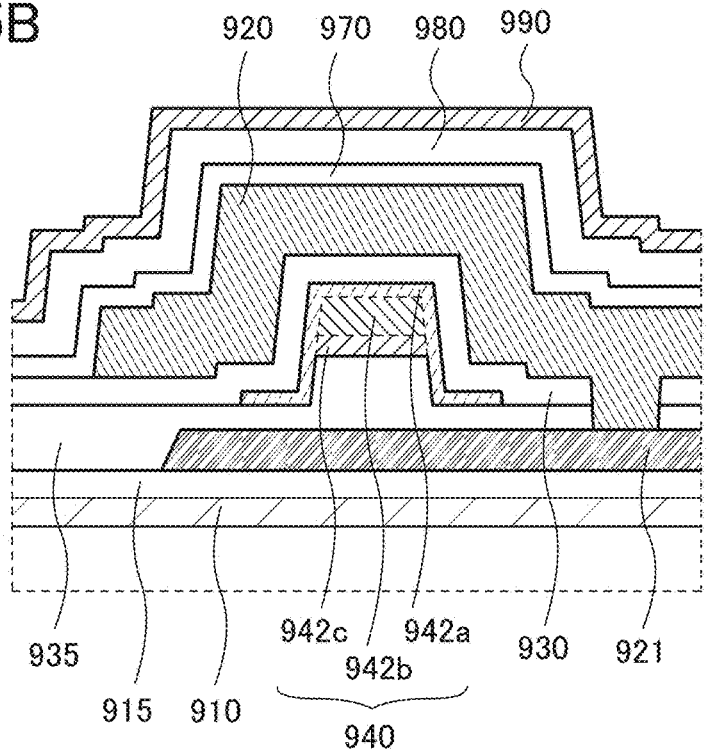

Structures illustrated in FIGS. 35A and 35B are preferably for a cross section in the channel width direction, of a channel formation region in a top-gate transistor illustrated in FIG. 29A or the like. In each of the above structures, the gate electrode layer 920 electrically surrounds the oxide semiconductor layer 940 in the channel width direction. Such a transistor structure is referred to as a surrounded channel (s-channel) structure.

In the structure including the conductive film 921 as illustrated in FIGS. 28A and 28B, the gate electrode layer 920 and the conductive film 921 may be connected to each other through a contact hole, as illustrated in FIG. 35B, so as to have the same potential.

The structure described in this embodiment can be used in appropriate combination with the structure described in any of the other embodiments.

Embodiment 6

In this embodiment, a transistor included in a display device of one embodiment of the present invention will be described.

The transistors included in the display device of one embodiment of the present invention do not necessarily have a uniform structure. For example, a transistor in a pixel portion in the display device and a transistor used in a driver circuit portion for driving the pixel portion have different structures; thus, the transistors can have electric characteristics appropriate to the respective portions, and the reliability of the display device can be improved.

When the transistor included in the driver circuit has a double gate structure, the transistor has high field-effect mobility.

Furthermore, the transistor in the driver circuit portion and the transistor in the pixel portion may have different channel lengths. Typically, the channel length of a transistor 194 in the driver circuit portion is less than 2.5 µm, or greater than or equal to 1.45 µm and less than or equal to 2.2 µm. The channel length of a transistor 190 in the pixel portion is greater than or equal to 2.5 µm, or greater than or equal to 2.5 µm and less than or equal to 20 µm.

When the channel length of the transistor in the driver circuit portion is less than 2.5 µm or greater than or equal to 1.45 µm and less than or equal to 2.2 µm, as compared with the transistor in the pixel portion, the field-effect mobility can be increased, and the amount of on-state current can be increased. As a result, a driver circuit portion that can operate at high speed can be formed.

When the transistor in the driver circuit portion has high field-effect mobility, the number of input terminals can be made small.

Figure 30:
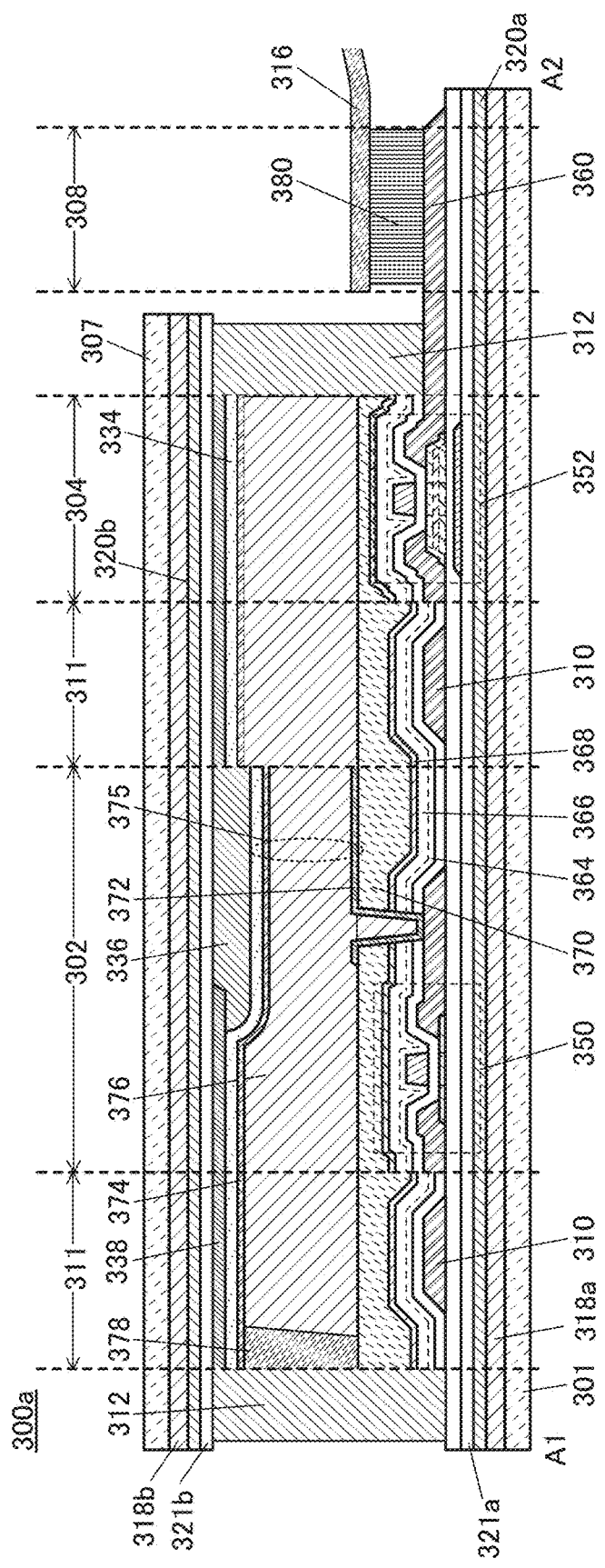
FIG. 30 is a cross-sectional view illustrating a display device.
Figure 31:
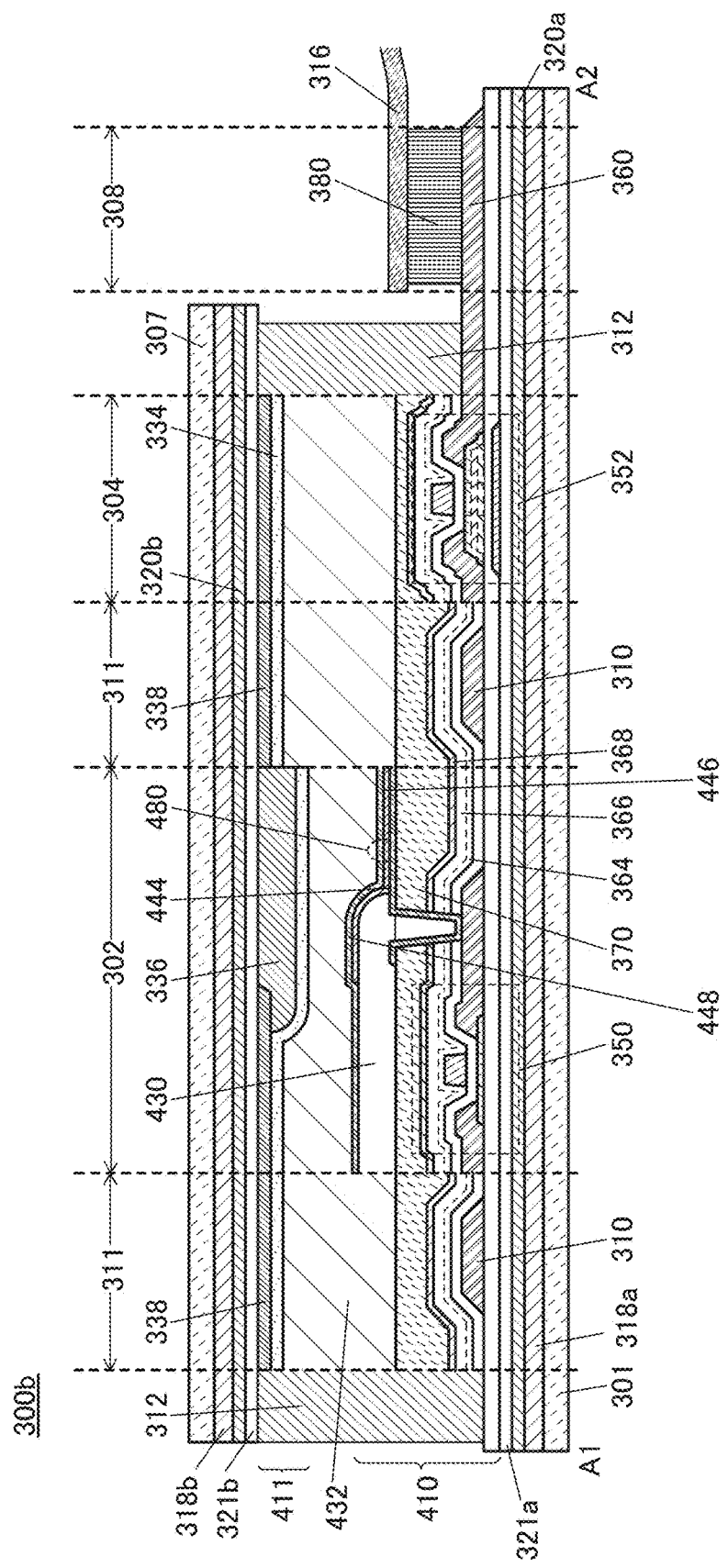
FIG. 31 is a cross-sectional view illustrating a display device.

FIG. 30 illustrates an example in which the transistor illustrated in FIG. 26A is used as the transistor in the pixel portion in the liquid crystal display device in FIG. 2, and the transistor illustrated in FIG. 29A is used as the transistor in the driver circuit portion. FIG. 31 illustrates an example in which the transistor in the pixel portion and the transistor in the driver circuit portion have different structures in the EL display device in FIG. 3. Note that as the transistor in the pixel portion, any of the transistors illustrated in FIG. 26B and FIGS. 27A and 27B can be used. As the transistor in the driver circuit portion, any of the transistors in which an oxide semiconductor layer has a multi-layer structure in FIGS. 29A and 29B and FIGS. 27A and 27B can be used.

For the transistor in the pixel portion, a transistor with high reliability for light irradiation from the backlight or an EL element is preferable. For example, an oxide semiconductor layer deposited by a sputtering method using a material with an atomic ratio In:Ga:Zn=1:1:1 as a target is used for a channel formation region, whereby a transistor with high reliability for light irradiation can be formed.

In contrast, for the transistor in the driver circuit portion, a transistor with high field-effect mobility is preferable. Besides the above structure, an oxide semiconductor layer deposited by a sputtering method using a material with an atomic ratio In:Ga:Zn=3:1:2 as a target is used for a channel formation region, whereby a transistor with high field-effect mobility can be formed.

In this embodiment, a method for forming the above two types of transistors over one substrate is described with reference to FIGS. 32A to 32D and FIGS. 33A to 33D. When one of the transistors has an oxide semiconductor layer with a stacked structure, the two types of transistors can be formed over one substrate with simple process. On the left side of the drawing, a cross section in the channel length direction of a transistor A whose structure is similar to that of the transistor in FIG. 26A is shown, as the transistor in the pixel portion. On the right side of the drawing, a cross section in the channel length direction of a transistor B whose structure is similar to that of the transistor in FIG. 29A is shown, as the transistor in the driver circuit portion. Note that the reference numerals common in the transistor A and the transistor B are given in only one of the transistors. In the method for forming the transistor described in this embodiment, a method for forming components (such as an organic resin layer) that are transferred to a flexible substrate, which is described in Embodiment 1, is included.

As the substrate 900, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

For the organic resin layer 910, an organic resin such as an epoxy resin, an aramid resin, an acrylic resin, a polyimide resin, a polyamide resin, or a polyamide-imide resin can be used. Above all, the polyimide resin is preferably used because it has high heat resistance. When the polyimide resin is used, the thickness of the polyimide resin is greater than or equal to 3 nm and less than or equal to 20 µm, preferably, greater than or equal to 500 nm and less than or equal to 2 µm. The polyimide resin can be formed by a spin coating method, a dip coating method, a doctor blade method, or the like.

The insulating film 915 can be formed using a silicon oxide film, a silicon oxynitride film, a silicon nitride film, a silicon nitride oxide film, or the like by a sputtering method, a CVD method, or the like.

An insulating layer 935 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these. Alternatively, a stack including any of the above materials may be used, and at least an upper layer which is in contact with the oxide semiconductor layer is preferably formed using a material containing excess oxygen that might serve as a supply source of oxygen to the oxide semiconductor layer.

Oxygen may be added to the insulating layer 935 by an ion implantation method, an ion doping method, a plasma immersion ion implantation method, plasma treatment, or the like. Adding oxygen enables the insulating layer 935 to supply oxygen much easily to the oxide semiconductor layer.

In the case where a surface of the substrate 900 is made of an insulator and there is no influence of impurity diffusion to the oxide semiconductor layer to be formed later, the insulating layer 935 is not necessarily provided. Furthermore, as illustrated in FIGS. 28A and 28B, the conductive film 921 is formed over the insulating film 915, and the insulating layer 935 may be formed over the conductive film.

Next, over the insulating layer 935, a first oxide semiconductor film 940c that is to be a first oxide semiconductor layer 942c and a second oxide semiconductor film 940b that is to be a second oxide semiconductor layer 942b in driver circuit transistors are deposited by a sputtering method, a CVD method, an MBE method, or the like.

Figure 32A:
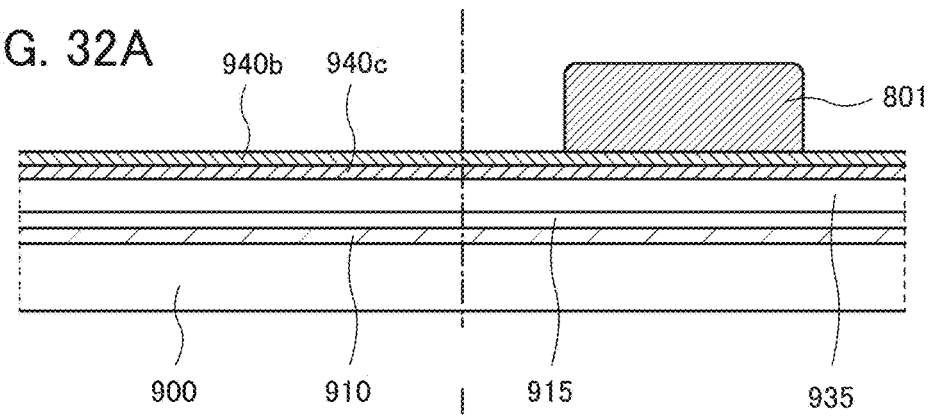
FIGS. 32A to 32D are cross-sectional views illustrating a method for manufacturing a transistor.
Figure 32B:
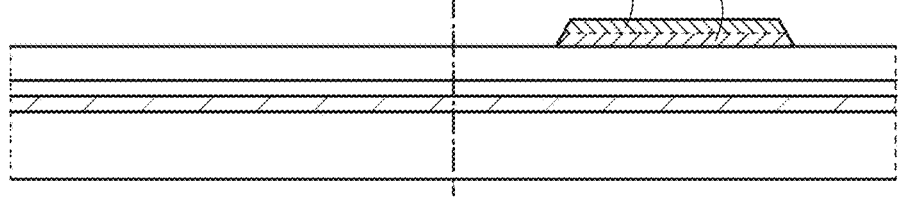
Figure 32C:
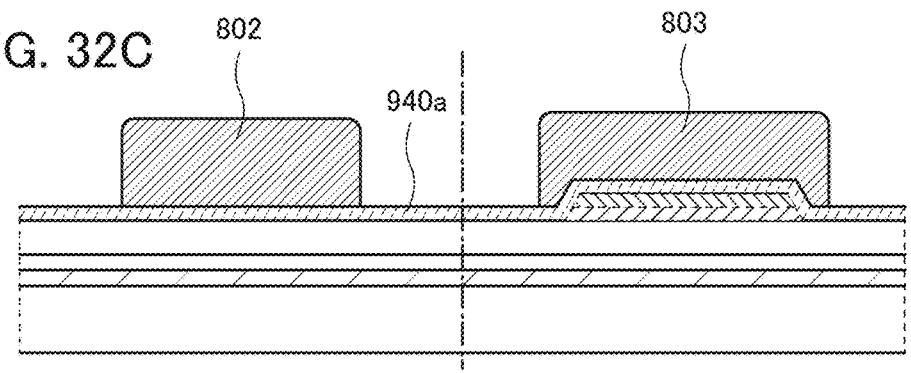
Figure 32D:
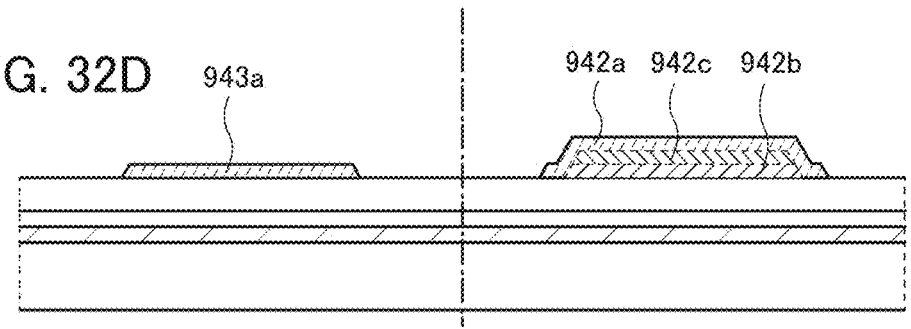

Next, a resist mask 801 is formed in a driver circuit region using a resist mask 801 by a lithography method (see FIG. 32A). With use of the resist mask, the first oxide semiconductor film 940c and the second oxide semiconductor film 940b are selectively etched, a stacked layer including the first oxide semiconductor layer 942c and the second oxide semiconductor layer 942b is formed (see FIG. 32B).

Next, a third oxide semiconductor film 940a that is to be a third oxide semiconductor layer 942a is formed to cover the stacked layer.

The materials described in Embodiment 5 can be used for the first oxide semiconductor film 940c, the second oxide semiconductor film 940b, and the third oxide semiconductor film 940a. In this embodiment, for example, an In—Ga—Zn-oxide (In:Ga:Zn=1:1:1 [atomic ratio]) is used for the first oxide semiconductor film 940c and the third oxide semiconductor film 940a, and an In—Ga—Zn-oxide (In:Ga:Zn=3:1:2 [atomic ratio]) is used for the second oxide semiconductor film 940b. The proportion of each atom in the atomic ratio of the first oxide semiconductor film 940c, the second oxide semiconductor film 940b, and the third oxide semiconductor film 940a may vary within a range of ±20% as an error. In the case where a sputtering method is used for deposition, the above material can be used as a target.

An oxide semiconductor that can be used for each of the first oxide semiconductor film 940c, the second oxide semiconductor film 940b, and the third oxide semiconductor film 940a preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that here, for example, an "In—Ga—Zn oxide" means an oxide containing In, Ga, and Zn as its main components. The In—Ga—Z-based oxide may contain another metal element in addition to In, Ga, and Zn. Further, in this specification, a film formed using an In—Ga—Zn oxide is also referred to as an IGZO film.

Alternatively, a material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

Note that a material of the second oxide semiconductor film 940b is selected so that the second oxide semiconductor film 940b has an electron affinity higher than that of the first oxide semiconductor film 940c and that of the third oxide semiconductor film 940a.

Note that the oxide semiconductor film is preferably formed by a sputtering method. As a sputtering method, an RF sputtering method, a DC sputtering method, an AC sputtering method, or the like can be used. To improve uniformity of film thickness of the oxide semiconductor film, film composition, and crystallinity, a DC sputtering method or an AC sputtering method is preferably used rather than an RF sputtering method.

The indium content in the second oxide semiconductor film 940b is preferably higher than those in the first and third oxide semiconductor films 940c and 940a. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. For this reason, with use of an oxide having a high indium content for the channel formation region, a transistor having high mobility can be achieved.

First heat treatment may be performed after the third oxide semiconductor film 940a is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. The first heat treatment can increase the crystallinity of the first to third oxide semiconductor films 940c to 940a and remove impurities such as water and hydrogen from the first to third oxide semiconductor films 940c to 940a and the insulating layer 935. Note that the first heat treatment may be performed after an etching step of the third oxide semiconductor film 940a described below.

Next, a resist mask 802 is formed in a pixel region by a lithography method. A resist mask 803 is formed over a stacked layer including the first oxide semiconductor layer 942c and the second oxide semiconductor layer 942b in the driver circuit region (see FIG. 32C).

Next, with use of the resist mask, the third oxide semiconductor film 940a is selectively etched to form an oxide semiconductor layer 943a in a pixel region. In addition, a stacked layer including the first oxide semiconductor layer 942c, the second oxide semiconductor layer 942b, and the third oxide semiconductor layer 942a is formed in the driver circuit region (see FIG. 32D).

Next, a first conductive film is formed over the oxide semiconductor layer 943a and the above stacked layer. As the first conductive film, a single layer or a stacked layer can be formed using a material selected from Al, Cr, Cu, Ta, Ti, Mo, W, Ni, Mn, Nd, and Sc and alloys of any of these metal materials.

Figure 33A:
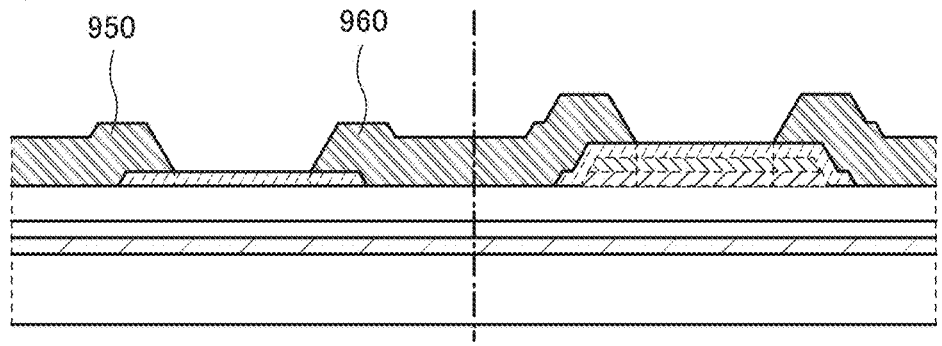
FIGS. 33A to 33D are cross-sectional views illustrating a method for manufacturing a transistor.

Next, a resist mask is formed over the first conductive film, and with use of the resist mask, the first conductive film is selectively etched, so that the source electrode layer 950 and the drain electrode layer 960 are formed (see FIG. 33A). In this step, the oxide semiconductor layer 943a and part of the stacked layer including the first to third oxide semiconductor layers becomes n-type.

Figure 33B:
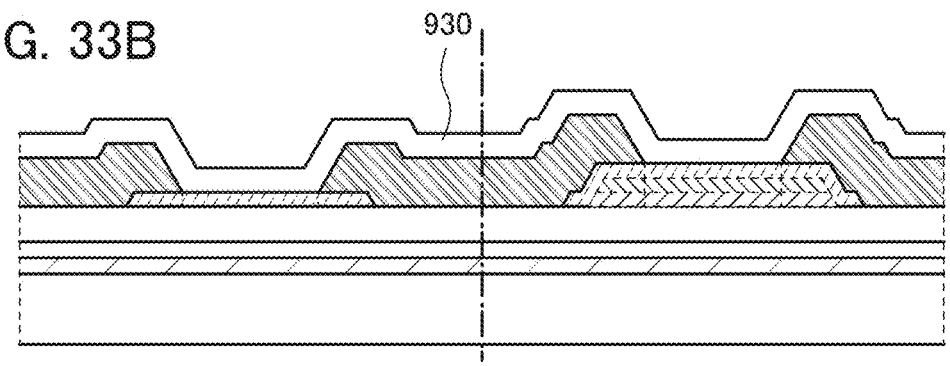

Next, the gate insulating film 930 is formed to cover the pixel region and the driver circuit region (see FIG. 33B). The gate insulating film 930 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 930 may be a stack including any of the above materials. The gate insulating film 930 can be formed by a sputtering method, a CVD method, an MBE method, or the like.

Then, a second conductive film to be the gate electrode layer 920 is formed over the gate insulating film 930. For the second conductive film, a single layer, a stack, or an alloy of any of Al, Ti, Cr, Co, Ni, Cu, Y, Zr, Mo, Ru, Ag, Mn, Nd, Sc, Ta, and W can be used. The second conductive film can be formed by a sputtering method, a CVD method, or the like. The second conductive film may be formed using a conductive film containing nitrogen or a stack including the conductive film and a conductive film containing nitrogen.

After that, a resist mask is formed over the second conductive film, and the second conductive film is selectively etched using the resist mask to form the gate electrode layer 920.

Figure 33C:
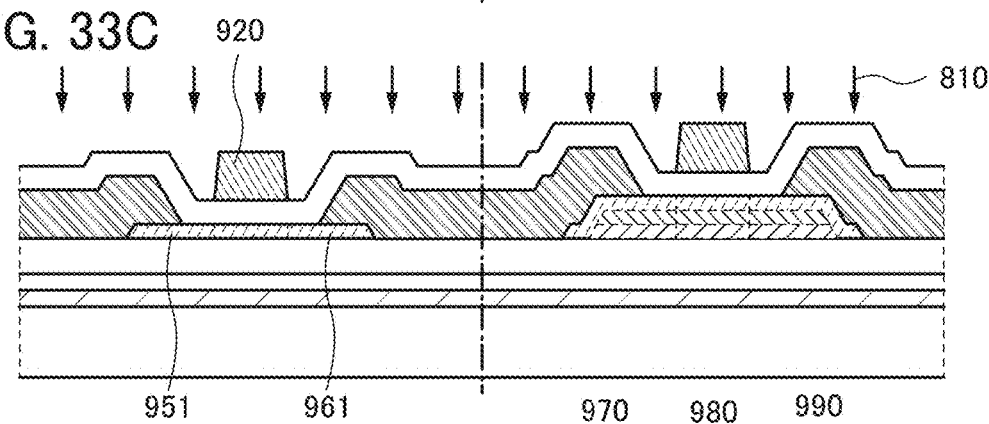

Next, an impurity 810 is added to regions that are not covered with the source electrode layer 950, the drain electrode layer 960, and the gate electrode layer 920, in the oxide semiconductor layer 943a and the stacked layer including the first to third oxide semiconductor layers 942c to 942a, so that the regions are made to be n-type regions and the source region 951 and the drain region 961 are formed (see FIG. 33C).

As a method for adding the impurity, plasma treatment, an ion implantation method, an ion doping method, a plasma immersion ion implantation method, or the like can be used. Note that the addition of the impurity may be performed after the gate insulating film 930 is selectively etched using the gate electrode layer 920 as a mask.

As an impurity added to increase the conductivity of an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon.

When a rare gas is added as an impurity element to the oxide semiconductor layer, a bond between a metal element and oxygen in the oxide semiconductor layer is cut, whereby an oxygen vacancy is generated. Interaction between an oxygen vacancy in the oxide semiconductor layer and hydrogen that remains in the oxide semiconductor layer or is added to the oxide semiconductor layer later can increase the conductivity of the oxide semiconductor layer. Specifically, hydrogen enters into the oxygen vacancies in the oxide semiconductor layer, whereby an electron serving as a carrier is produced. As a result, the conductivity is increased.

In FIG. 33C, when the width of a so-called offset region (a region in the oxide semiconductor layer, which does not overlap with the gate electrode layer 920, and the source and drain electrode layers) is less than 0.1 µm, doping with the above impurity is not necessarily performed. In the case where the offset region is less than 0.1 µm, a difference of the amount of off-state current of the transistor whether the doping with the impurity is performed or not is significantly small.

Figure 33D:
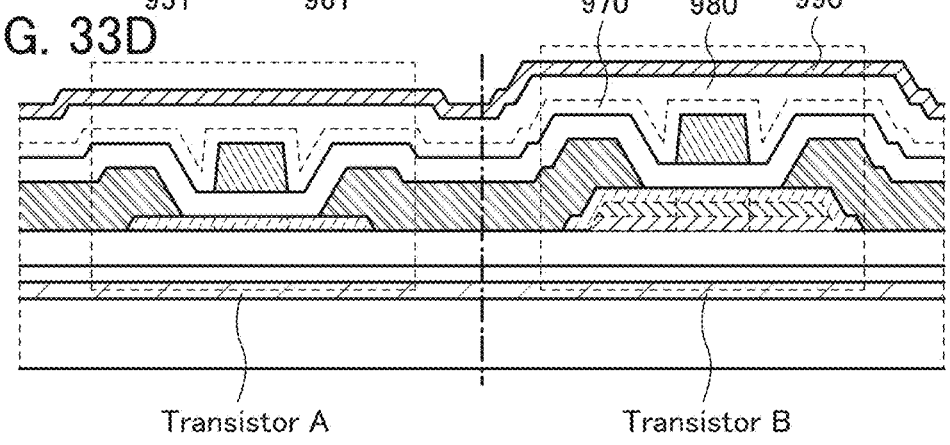

Next, over the gate insulating film 930 and a gate electrode layer 920, the insulating film 970, the insulating film 980, and the insulating film 990 are formed (see FIG. 33D).

Oxygen may be added to the insulating film 970 and/or the insulating film 980 by an ion implantation method, an ion doping method, a plasma immersion ion implantation method, plasma treatment, or the like. By adding oxygen, oxygen can be easily supplied from the insulating film 970 and/or the insulating film 980 to the oxide semiconductor layer 943a and the first to third oxide semiconductor layers 942c to 942a.

After that, second heat treatment may be performed. The second heat treatment can be performed in a condition similar to that of the first heat treatment. By the second heat treatment, excess oxygen is easily released from the insulating layer 935, the insulating film 970, and the insulating film 980, and oxygen vacancies in the oxide semiconductor layer 943a and the stacked layer including the first to third oxide semiconductor layers 942c to 942a can be reduced.

Furthermore, FIG. 34A to 34D illustrate a method for forming the following structure: as a transistor in the pixel portion, a transistor C whose structure is similar to that of the transistor in FIG. 26B is used, and as a transistor in the driver circuit portion, a transistor D whose structure is similar to that of the transistor in FIG. 29B is used.

Figure 34A:
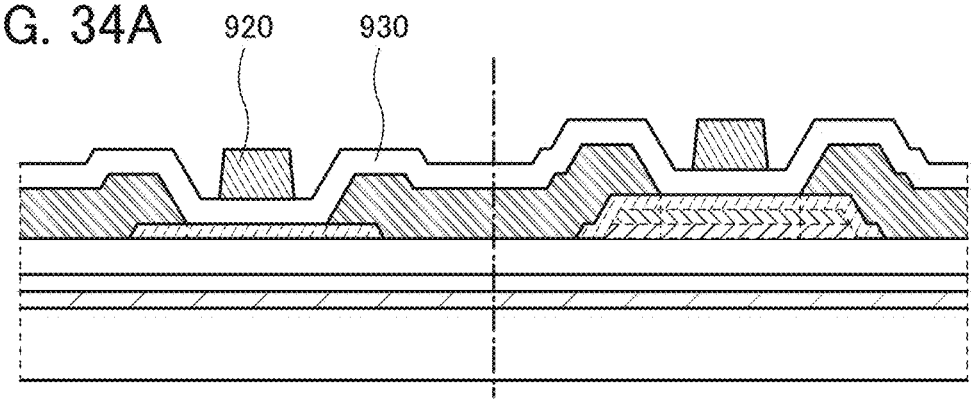
FIGS. 34A to 34D are cross-sectional views illustrating a method for manufacturing a transistor.

Up to the step illustrated in FIG. 33B, the steps similar to those in the above method for forming the transistor described above are performed, whereby the gate electrode layer 920 is formed (see FIG. 34A).

Figure 34B:
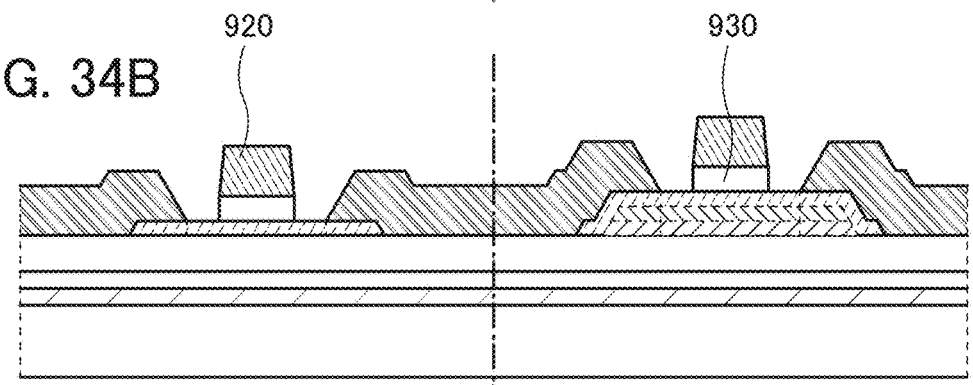

Next, the gate insulating film 930 is etched using the gate electrode layer 920 as a mask (see FIG. 34B).

Figure 34C:
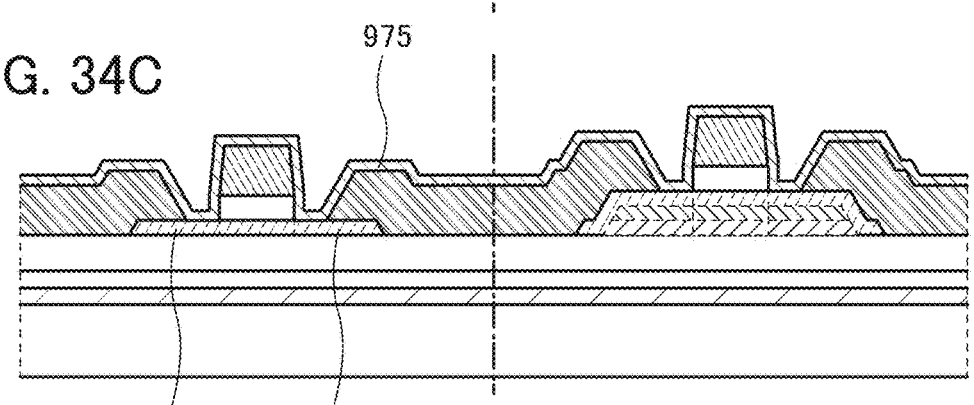

Next, the insulating film 975 containing hydrogen, such as a silicon nitride film or an aluminum nitride film, is formed to be in contact with part of the oxide semiconductor layer 940, so that hydrogen is diffused to the part of the oxide semiconductor layer 940 (see FIG. 34C). The diffused hydrogen is bonded to the oxygen vacancy in the oxide semiconductor layer 940 and serves as a donor; accordingly, the low-resistance source region 951 and the low-resistance drain region 961 can be formed. In the structure in FIG. 34C, the oxide semiconductor layer may be doped with the above impurity.

Figure 34D:
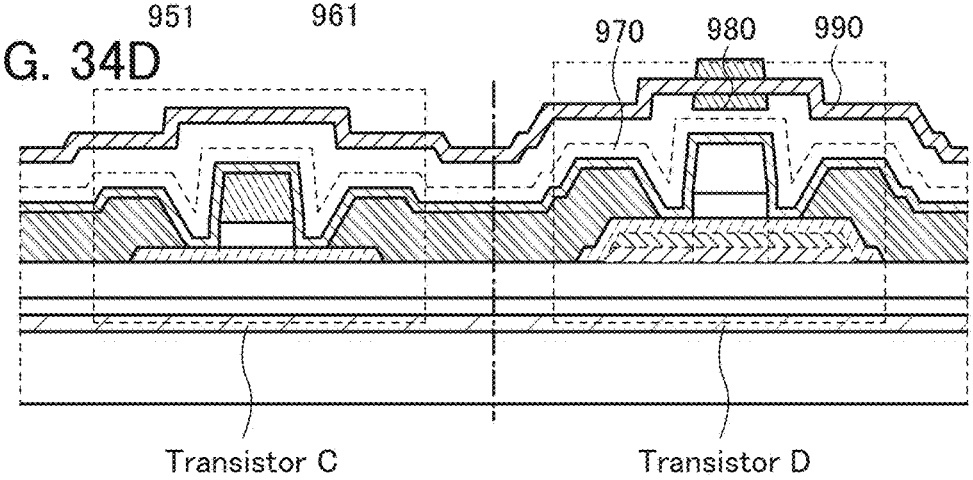

Next, over the insulating film 975, the insulating film 970, the insulating film 980, and the insulating film 990 are formed (see FIG. 34D).

Through the above steps, the transistor including an oxide semiconductor layer with a single-layer structure and the transistor including an oxide semiconductor layer with a stacked structure can be easily formed over one substrate. In addition, a display device which can operate at high speed, less deteriorates due to light irradiation, and includes a pixel portion with excellent display quality can be formed.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn-Ox (x>0) film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an $InGaZnO_x$ (x>0) film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Further, a $Zn(CH_3)_2$ gas may be used.

This embodiment can be combined with any of the other embodiments in this specification as appropriate.

Embodiment 7

In this embodiment, an oxide semiconductor film that can be used for a transistor according to one embodiment of the present invention is described.

<Structure of Oxide Semiconductor>

The structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 21A:
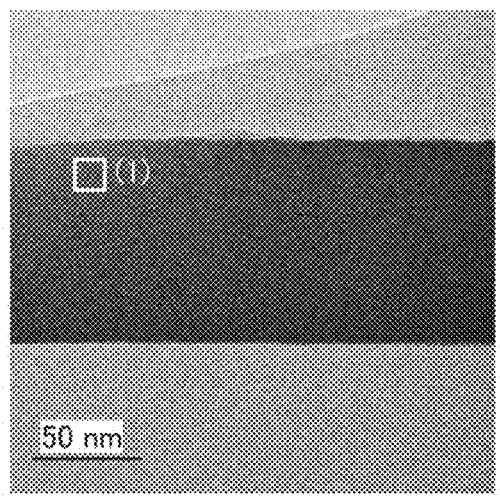
FIGS. 21A to 21D are Cs-corrected high-resolution TEM images of a cross section of a CAAC-OS and a cross-sectional schematic view of the CAAC-OS.

The CAAC-OS observed with a TEM is described below. FIG. 21A shows an example of a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

Figure 21B:
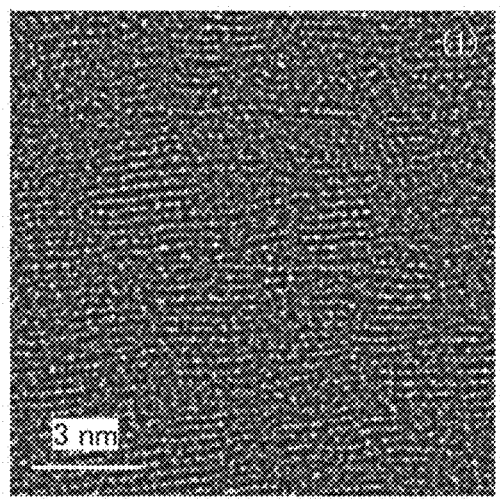

FIG. 21B is an enlarged Cs-corrected high-resolution TEM image of a region (1) in FIG. 21A. FIG. 21B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 21C:
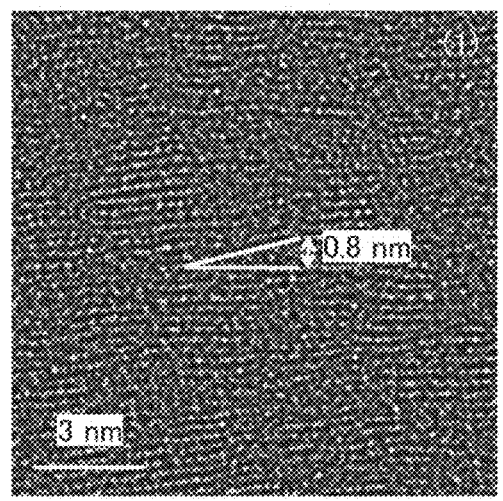

As shown in FIG. 21B, the CAAC-OS film has a characteristic atomic arrangement. The characteristic atomic arrangement is denoted by an auxiliary line in FIG. 21C. FIGS. 21B and 21C prove that the size of a pellet is approximately 1 nm to 3 nm, and the size of a space caused by tilt of the pellets is approximately 0.8 nm. Therefore, the pellet can also be referred to as a nanocrystal (nc).

Figure 21D:
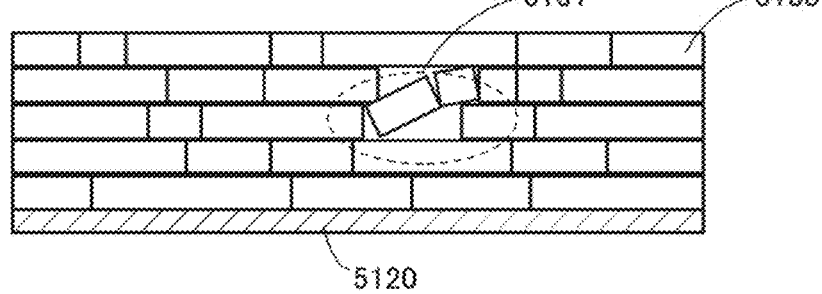

Here, according to the Cs-corrected high-resolution TEM images, the schematic arrangement of pellets 5100 of a CAAC-OS layer over a substrate 5120 is illustrated by such a structure in which bricks or blocks are stacked (see FIG. 21D). The part in which the pellets are tilted as observed in FIG. 21C corresponds to a region 5161 shown in FIG. 21D.

FIG. 22A shows a Cs-corrected high-resolution TEM image of a plane of the CAAC-OS observed from a direction substantially perpendicular to the sample surface. FIGS. 22B, 22C, and 22D are enlarged Cs-corrected high-resolution TEM images of regions (1), (2), and (3) in FIG. 22A, respectively. FIGS. 22B, 22C, and 22D indicate that metal atoms are arranged in a triangular, quadrangular, or hexagonal configuration in a pellet. However, there is no regularity of arrangement of metal atoms between different pellets.

Figure 23A:
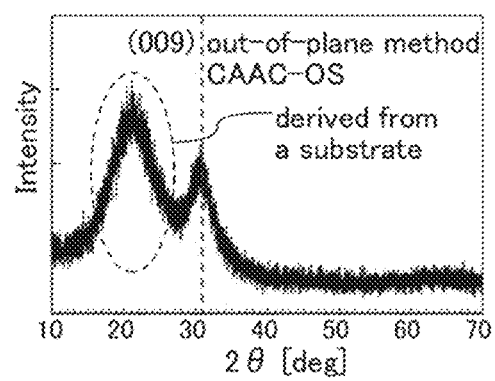
FIGS. 23A to 23C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 23A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 23B:
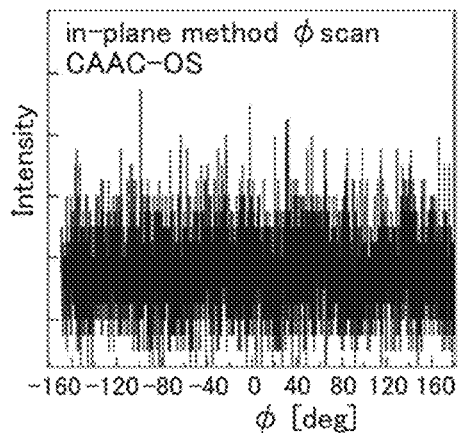
Figure 23C:
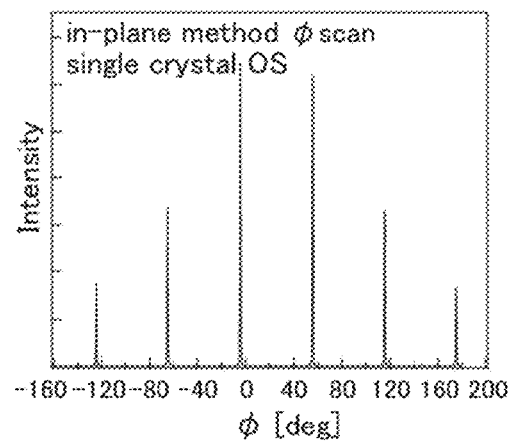

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 23B, a peak is not clearly observed. In contrast, in the case of a single crystal oxide semiconductor of $InGaZnO_4$, when φ scan is performed with 2θ fixed at around 56°, as shown in FIG. 23C, six peaks which are derived from crystal planes equivalent to the (110) plane are observed. Accordingly, the structural analysis using XRD shows that the directions of a-axes and b-axes are different in the CAAC-OS.

Figure 40A:
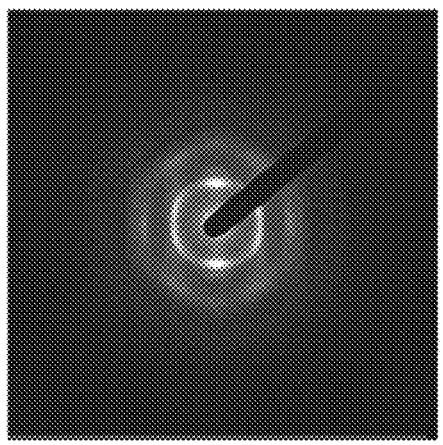
FIGS. 40A and 40B show electron diffraction patterns of a CAAC-OS.
Figure 40B:
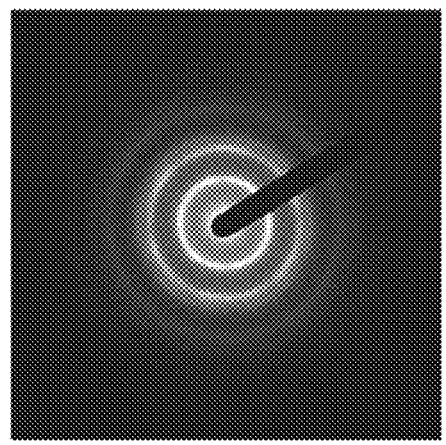

Next, a CAAC-OS analyzed by electron diffraction is described. For example, when an electron beam with a probe diameter of 300 nm is incident on a CAAC-OS layer including an $InGaZnO_4$ crystal in a direction parallel to the sample surface, a diffraction pattern (also referred to as a selected-area transmission electron diffraction pattern) shown in FIG. 40A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 40B shows a diffraction pattern obtained in such a manner that an electron beam with a probe diameter of 300 nm is incident on the same sample in a direction perpendicular to the sample surface. As shown in FIG. 40B, a ring-like diffraction pattern is observed. Thus, the electron diffraction also indicates that the a-axes and b-axes of the pellets included in the CAAC-OS do not have regular alignment. It is supposed that the first ring in FIG. 40B is derived from the (010) plane, the (100) plane, and the like of the crystals of InGaZnO$_4$. The second ring in FIG. 40B is considered to be derived from the (110) plane and the like.

Moreover, the CAAC-OS is an oxide semiconductor having a low density of defect states. Defects in the oxide semiconductor are, for example, a defect due to impurity and oxygen vacancies. Thus, the CAAC-OS can be referred to as an oxide semiconductor having a low impurity concentration. Furthermore, the CAAC-OS can be referred to as an oxide semiconductor with few oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductors. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

Thus, the nc-OS is an oxide semiconductor that has high regularity as compared to an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is such an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

<Amorphous-Like Oxide Semiconductor Layer>

Note that an oxide semiconductor may have a structure between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (Sample A), an nc-OS (Sample B), and a CAAC-OS (Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 41:
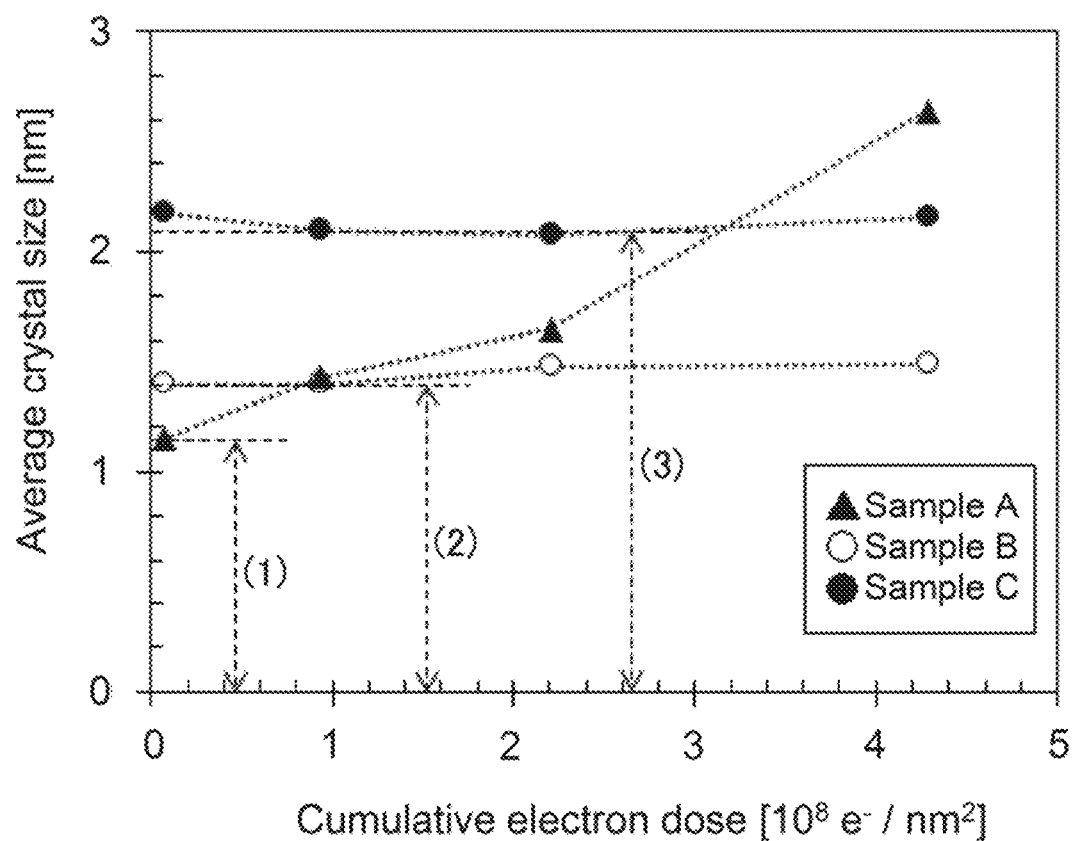
FIG. 41 shows a change in crystal parts of In—Ga—Zn oxides induced by electron irradiation.

FIG. 41 shows the change in the average size of crystal parts (at 22 points to 45 points) in each sample. Note that the crystal part size corresponds to the length of a lattice fringe. FIG. 41 indicates that the crystal part size in the a-like OS increases with an increase in the cumulative electron dose. Specifically, as shown by (1) in FIG. 41, a crystal part of approximately 1.2 nm at the start of TEM observation (the crystal part is also referred to as an initial nucleus) grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 41, the average crystal sizes in an nc-OS layer and a CAAC-OS layer are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor film.

For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

FIG. 42A is a schematic view of the inside of a deposition chamber where a CAAC-OS film is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition speed is increased by utilizing a magnetic field of magnets is referred to as a magnetron sputtering method.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 43A:
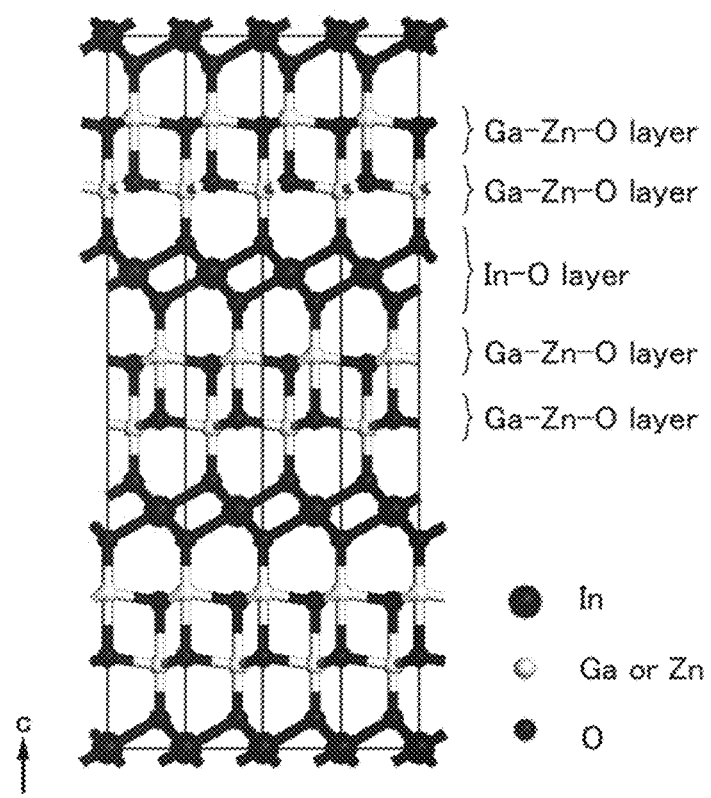
FIGS. 43A to 43C show an InGaZnO$_4$ crystal and a pellet.

Here, the target 5130 has a polycrystalline structure which includes a plurality of crystal grains and in which a cleavage plane exists in at least one crystal grain. FIG. 43A shows a structure of an $InGaZnO_4$ crystal included in the target 5130 as an example. Note that FIG. 43A shows a structure of the case where the $InGaZnO_4$ crystal is observed from a direction parallel to the b-axis. FIG. 43A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100*a* and a pellet 5100*b* which are flat-plate-like (pellet-like) sputtered particles are separated and sputtered from the cleavage plane. Note that structures of the pellet 5100*a* and the pellet 5100*b* may be distorted by an impact of collision of the ion 5101.

The pellet 5100*a* is a flat-plate-like (pellet-like) sputtered particle having a triangle plane, e.g., regular triangle plane. The pellet 5100*b* is a flat-plate-like (pellet-like) sputtered particle having a hexagon plane, e.g., regular hexagon plane. Note that flat-plate-like (pellet-like) sputtered particles such as the pellet 5100*a* and the pellet 5100*b* are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 43B:
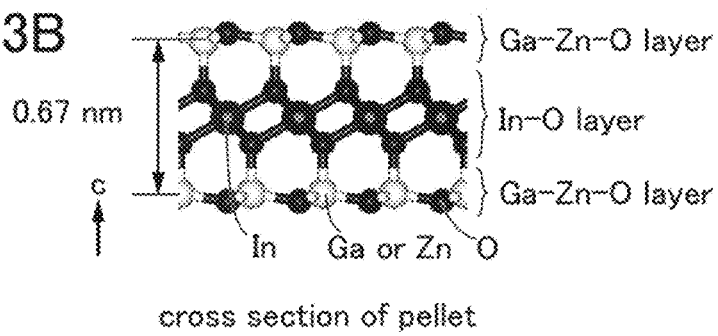
Figure 43C:
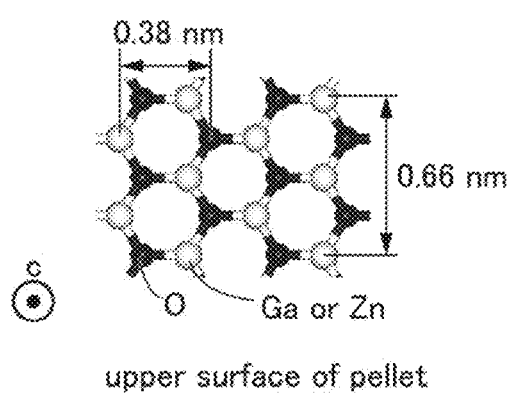

The thickness of the pellet 5100 is determined depending on the kind of deposition gas and the like. The thicknesses of the pellets 5100 are preferably uniform; the reasons thereof are described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 41. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 43B is separated. Note that FIG. 43C shows the structure of the separated pellet 5100 which is observed from a direction parallel to the c-axis. Therefore, the pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 41 corresponds to the amount of growth in plasma. Here, in the case where the temperature of the substrate 5120 is at around room temperature, the pellet 5100 on the substrate 5120 hardly grows; thus, an nc-OS film is formed (see FIG. 42B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

As shown in FIGS. 42A and 42B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 42A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where the flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS is filled in some cases; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 44A to 44D are cross-sectional schematic views.

Figure 44A:
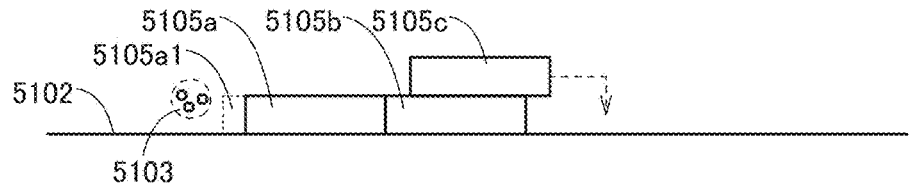
FIGS. 44A to 44D are schematic diagrams illustrating a deposition model of a CAAC-OS.

As illustrated in FIG. 44A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 44B:
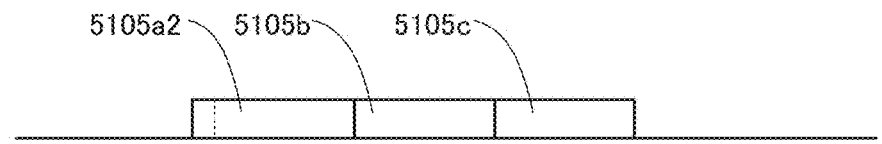

Then, as illustrated in FIG. 44B, the region 5105a1 grows to part of the pellet 5105a to form a pellet 5105a2. In addition, a side surface of the pellet 5105c is in contact with another side surface of the pellet 5105b.

Figure 44C:
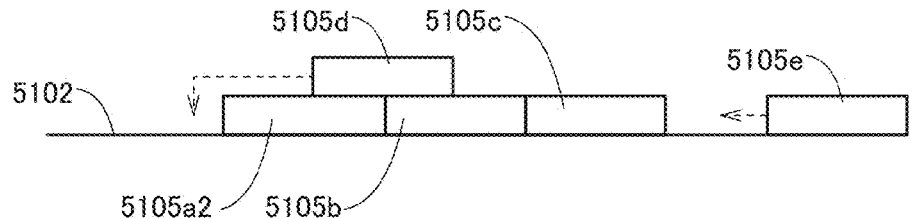

Next, as illustrated in FIG. 44C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 44D:
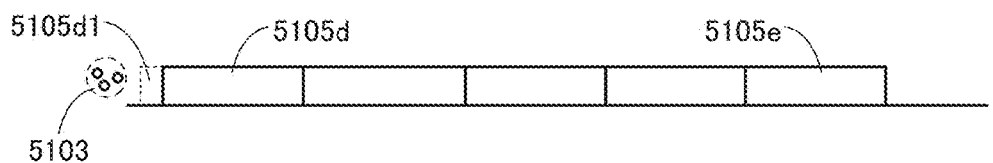

Then, as illustrated in FIG. 44D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 41 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. Therefore, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

It is considered that as shown in such a model, the pellets 5100 are deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since the CAAC-OS film is deposited in accordance with such a model, the sputtered particle preferably has a pellet shape with a small thickness. Note that when the sputtered particles has a dice shape with a large thickness, planes facing the substrate 5120 vary, which may lead to formation of a film whose thickness or crystal alignment is not uniformed.

According to the deposition model described above, a CAAC-OS with high crystallinity can be formed even on a film formation surface with an amorphous structure.

The structure described in this embodiment can be used in appropriate combination with the structure described in any of the other embodiments.

Embodiment 8

In this embodiment, electronic devices to which one embodiment of the present invention is applied will be described with reference to FIGS. 24A to 24D.

Highly reliable flexible electronic devices can be manufactured by adopting the device of one embodiment of the present invention.

Examples of the electronic devices are a television device, a monitor of a computer or the like, a camera such as a digital camera or a digital video camera, a digital photo frame, a mobile phone (also referred to as a cellular phone or a cellular phone device), a portable game console, a portable information terminal, an audio reproducing device, a large-sized game machine, and the like.

The display device of one embodiment of the present invention has flexibility and thus can be incorporated along a curved inside/outside wall surface of a house or a building or a curved interior/exterior surface of a car.

Figure 24A:
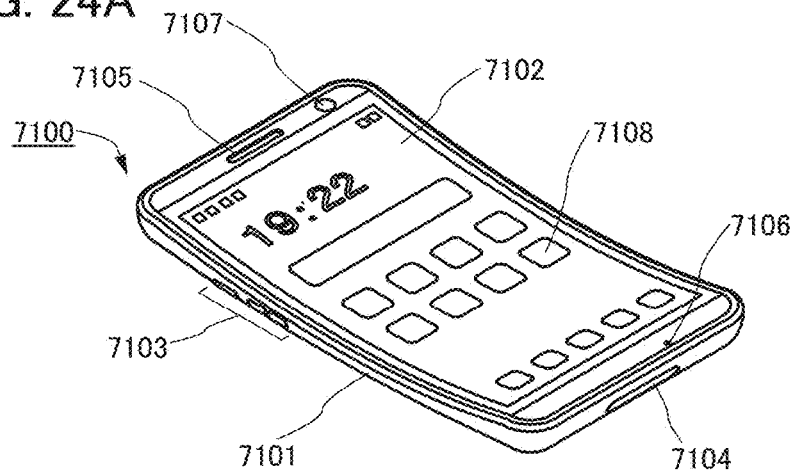
FIGS. 24A to 24D each illustrate an electronic device.

FIG. 24A illustrates an example of a mobile phone. A mobile phone 7100 includes a display portion 7102 incorporated in a housing 7101, operation buttons 7103, an external connection port 7104, a speaker 7105, a microphone 7106, a camera 7107, and the like. Note that the mobile phone 7100 is manufactured using the display device of one embodiment of the present invention for the display portion 7102. According to one embodiment of the present invention, a highly reliable mobile phone having a curved display portion can be provided.

When the display portion 7102 of the mobile phone 7100 illustrated in FIG. 24A is touched with a finger or the like, data can be input to the mobile phone 7100. Operations such as making a call and entering a character can be performed by touch on the display portion 7102 with a finger or the like. For example, by touching an icon 7108 displayed on the display portion 7102, application can be started.

The power can be turned on or off with the operation buttons 7103. In addition, types of images displayed on the display portion 7102 can be switched; switching images from a mail creation screen to a main menu screen.

Figure 24B:
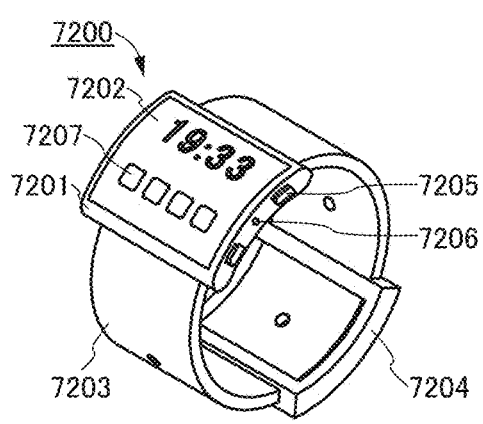

FIG. 24B illustrates an example of a wrist-watch-type portable information terminal. A portable information terminal 7200 includes a housing 7201, a display portion 7202, a band 7203, a buckle 7204, an operation button 7205, an input output terminal 7206, and the like.

The portable information terminal 7200 is capable of executing a variety of applications such as mobile phone calls, e-mailing, viewing and editing texts, music reproduction, Internet communication, and a computer game.

The display surface of the display portion 7202 is bent, and images can be displayed on the bent display surface. Further, the display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as power ON/OFF, ON/OFF of wireless communication, setting and cancellation of manner mode, and setting and cancellation of power saving mode can be performed. For example, the functions of the operation button 7205 can be set freely by setting the operation system incorporated in the portable information terminal 7200.

The portable information terminal 7200 can employ near field communication that is a communication method in accordance with an existing communication standard. In that case, for example, mutual communication between the portable information terminal 7200 and a headset capable of wireless communication can be performed, and thus handsfree calling is possible.

Moreover, the portable information terminal 7200 includes the input output terminal 7206, and data can be directly transmitted to and received from another information terminal via a connector. Power charging through the input output terminal 7206 is possible. Note that the charging operation may be performed by wireless power feeding without using the input output terminal 7206.

The display device of one embodiment of the present invention can be used in the display portion 7202 of the portable information terminal 7200.

Figure 24C:
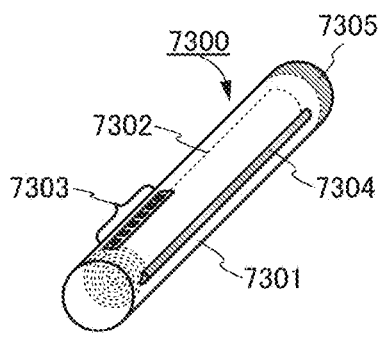

FIG. 24C illustrates an example of a portable display device. A display device 7300 includes a housing 7301, a display portion 7302, operation buttons 7303, a display portion pull 7304, and a control portion 7305.

The display device 7300 includes a rolled flexible display portion 7102 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, power ON/OFF, switching of displayed videos, and the like can be performed.

Figure 24D:
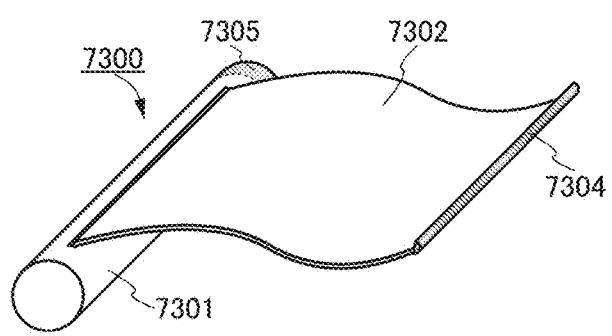

FIG. 24D illustrates a display device 7300 in a state where the display portion 7302 is pulled out with the display portion pull 7304. Videos can be displayed on the display portion 7302 in this state. Further, the operation buttons 7303 on the surface of the housing 7301 allow one-handed operation. The operation button 7303 is provided not in the center of the housing 7301 but on one side of the housing 7301 as illustrated in FIG. 24C, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the light-emitting device of one embodiment of the present invention. According to one embodiment of the present invention, a lightweight and highly reliable light-emitting device can be provided.

This embodiment can be implemented in an appropriate combination with any of the structures described in the other embodiments.

Embodiment 9

In this embodiment, modification examples of the transistor described in the above embodiment will be described with reference to FIGS. 37A to 37F, FIGS. 38A to 38F, and FIGS. 39A to 39E. The transistors illustrated in FIGS. 37A to 37F each includes, over a substrate 821, an oxide semiconductor layer 828 over an insulating film 824, an insulating film 837 in contact with the oxide semiconductor layer 828, and a conductive film 840 in contact with the insulating film 837 and overlapping with the oxide semiconductor layer 828. The insulating film 837 functions as a gate insulating film. The conductive film 840 functions as a gate electrode layer.

In addition, the transistors are provided with an insulating film 846 in contact with the oxide semiconductor layer 828 and an insulating film 847 in contact with the insulating film 846. Moreover, conductive films 856 and 857 in contact with the oxide semiconductor layer 828 through the openings in the insulating film 846 and the insulating film 847 are provided. The conductive films 856 and 857 function as a source electrode layer and a drain electrode layer. Furthermore, an insulating film 862 in contact with the insulating film 847 and the conductive films 856 and 857 is provided.

As the structures of the transistor described in this embodiment and the conductive film and the insulating film in contact with the structures, the structures of the transistor described in the above embodiment and the conductive film and the insulating film in contact with the structures can be used as appropriate.

Figure 37A:
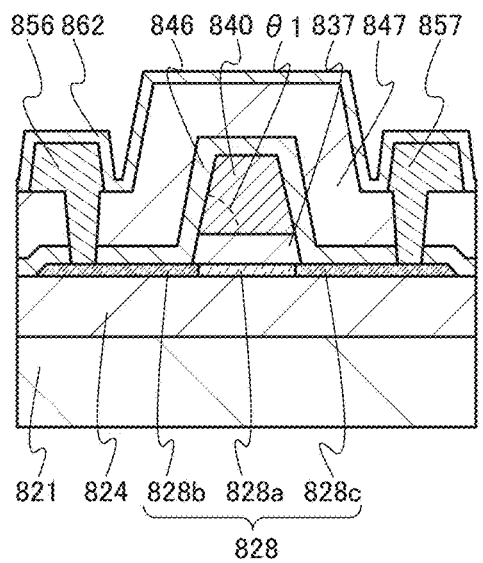
FIGS. 37A to 37F are each a cross-sectional view illustrating a transistor.

In the transistor illustrated in FIG. 37A, the oxide semiconductor layer 828 includes a region 828a overlapping with the conductive film 840 and regions 828b and 828c containing an impurity element. The regions 828b and 828c are formed so that the region 828a is sandwiched therebetween. The conductive films 856 and 857 are in contact with the regions 828b and 828c respectively. The region 828a functions as a channel region. The regions 828b and 828c have lower resistivity than the region 828a and can be referred to as low resistance regions. The regions 828b and 828c function as a source region and a drain region.

Figure 37B:
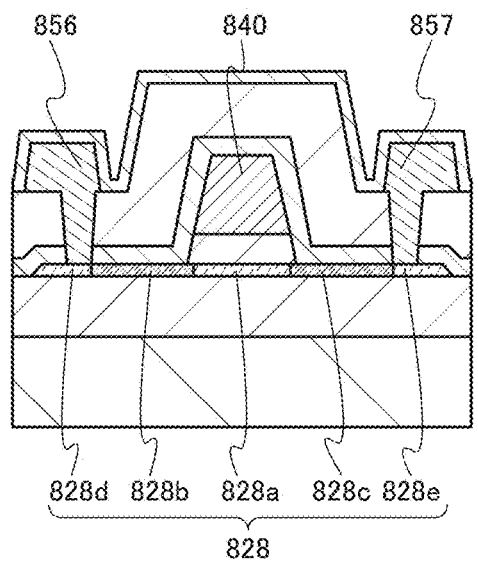

Alternatively, as in the transistor illustrated in FIG. 37B, the oxide semiconductor layer 828 may have a structure in which an impurity element is not added to regions 828d and 828e in contact with the conductive films 856 and 857. In this case, the regions 828b and 828c containing an impurity element are provided between the region 828a and the regions 828d and 828e in contact with the conductive films 856 and 857. The regions 828d and 828e have conductivity when the voltage is applied to the conductive films 856 and 857; thus, the regions 828d and 828e function as a source region and a drain region.

Note that the transistor illustrated in FIG. 37B can be formed in such a manner that after the conductive films 856 and 857 are formed, an impurity element is added to the oxide semiconductor layer using the conductive film 840 and the conductive films 856 and 857 as masks.

An end portion of the conductive film 840 may have a tapered shape. The angle θ1 formed between a surface where the insulating film 837 and the conductive film 840 are in contact with each other and a side surface of the conductive film 840 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ1 is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating film 837 and the conductive film 840 with the insulating film 846 can be improved.

Next, modification examples of the regions 828b and 828c are described. FIGS. 37C to 37F are each an enlarged view of the vicinity of the oxide semiconductor layer 828 illustrated in FIG. 37A. The channel length L indicates a distance between a pair of regions containing an impurity element.

Figure 37C:
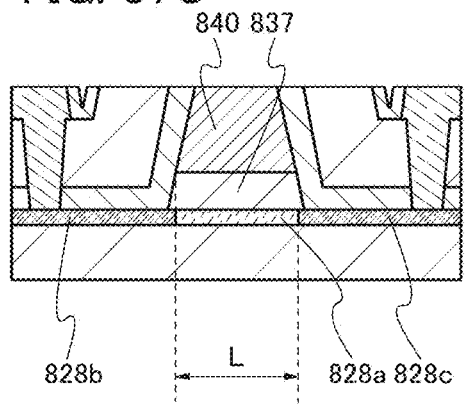

As illustrated in FIG. 37C in a cross-sectional view in the channel length direction, the boundaries between the region 828a and the regions 828b and 828c are aligned or substantially aligned with the end portion of the conductive film 840 with the insulating film 837 interposed therebetween. In other words, the boundaries between the region 828a and the regions 828b and 828c are aligned or substantially aligned with the end portion of the conductive film 840, seen in a top view.

Figure 37D:
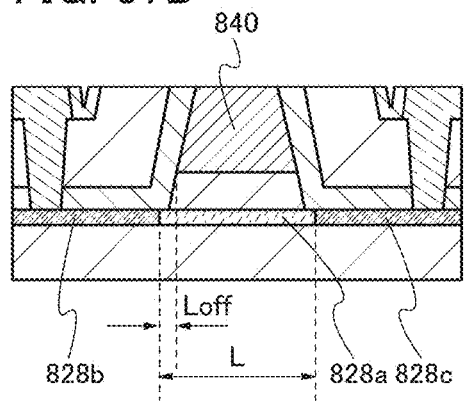

Alternatively, as illustrated in FIG. 37D in a cross-sectional view in the channel length direction, the region 828a has a region that does not overlap with the end portion of the conductive film 840. The region functions as an offset region. The length of the offset region in the channel length direction is referred to as $L_{off}$. Note that when a plurality of offset regions are provided, $L_{off}$ indicates the length of one offset region. $L_{off}$ is included in the channel length L. Note that $L_{off}$ is smaller than 20%, smaller than 10%, smaller than 5%, or smaller than 2% of the channel length L.

Figure 37E:
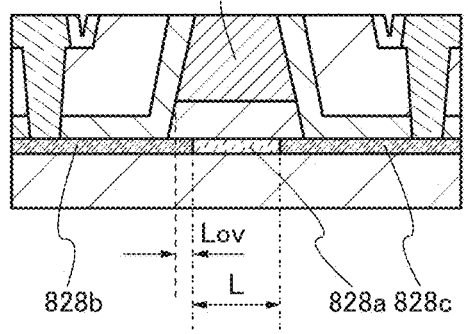

Alternatively, as illustrated in FIG. 37E in a cross-sectional view in the channel length direction, the regions 828b and 828c each have a region overlapping with the conductive film 840 with the insulating film 837 interposed therebetween. The regions function as an overlap region. The overlap region in the channel length direction is referred to as $L_{ov}$. $L_{ov}$ is smaller than 20%, smaller than 10%, smaller than 5%, or smaller than 2% of the channel length L.

Figure 37F:
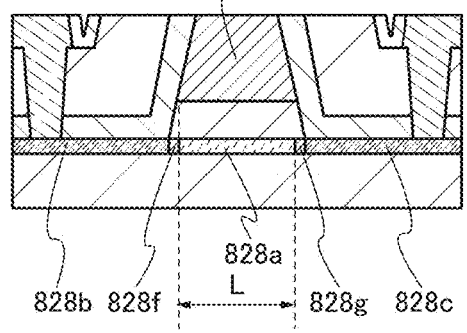

Alternatively, as illustrated in FIG. 37F in a cross-sectional view in the channel length direction, a region 828f is provided between the region 828a and the region 828b, and a region 828g is provided between the region 828a and the region 828c. The regions 828f and 828g have lower concentration of an impurity element and higher resistivity than the regions 828b and 828c. Although the regions 828f and 828g overlap with the insulating film 837 in this case, they may overlap with the insulating film 837 and the conductive film 840.

Note that in FIGS. 37C to 37F, the transistor illustrated in FIG. 37A is described; however, the transistor illustrated in FIG. 37B can employ any of the structures in FIGS. 37C to 37F as appropriate.

In the transistor illustrated in FIG. 38A, the end portion of the insulating film 837 is positioned on an outer side than the end portion of the conductive film 840. In other words, the insulating film 837 has a shape such that the end portion extends beyond the end portion of the conductive film 840. The insulating film 846 can be kept away from the region 828a; thus, nitrogen, hydrogen, and the like contained in the insulating film 846 can be prevented from entering the region 828a functioning as a channel region.

In the transistor illustrated in FIG. 38B, the insulating film 837 and the conductive film 840 each have a tapered shape, and the angles of the tapered shapes are different from each other. In other words, the angle θ1 formed between a surface where the insulating film 837 and the conductive film 840 are in contact with each other and a side surface of the conductive film 840 is different from an angle θ2 formed between a surface where the oxide semiconductor layer 828 and the insulating film 837 are in contact with each other and the side surface of the insulating film 837. The angle θ2 may be less than 90°, greater than or equal to 30° and less than or equal to 85°, or greater than or equal to 45° and less than or equal to 70°. For example, when the angle θ2 is less than the angle θ1, the coverage with the insulating film 846 is improved. Alternatively, when the angle θ2 is greater than the angle θ1, the insulating film 846 can be kept away from the region 828a; thus, nitrogen, hydrogen, or the like contained in the insulating film 846 can be prevented from entering the region 828a functioning as a channel region.

Next, modification examples of the regions 828b and 828c are described with reference to FIGS. 38C to 38F. Note that FIGS. 38C to 38F are each an enlarged view of the vicinity of the oxide semiconductor layer 828 illustrated in FIG. 38A.

As illustrated in FIG. 38C in a cross-sectional view in the channel length direction, the boundaries between the region 828a and the regions 828b and 828c are aligned or substantially aligned with the end portion of the conductive film 840 with the insulating film 837 interposed therebetween. In other words, seen in the top view, the boundaries between the region 828a and the regions 828b and 828c are aligned or substantially aligned with the end portion of the conductive film 840.

As illustrated in FIG. 38D in a cross-sectional view in the channel length direction, the region 828a has a region that does not overlap with the conductive film 840. The region functions as an offset region. In other words, seen in the top view, the end portions of the regions 828b and 828c are aligned or substantially aligned with the end portion of the insulating film 837 and do not overlap with the end portion of the conductive film 840.

As illustrated in FIG. 38E in a cross-sectional view in the channel length direction, the regions 828b and 828c each have a region overlapping with the conductive film 840 with the insulating film 837 interposed therebetween. Such a region is referred to as an overlap region. In other words, seen in the top view, the end portions of the regions 828b and 828c overlap with the conductive film 840.

As illustrated in FIG. 38F in a cross-sectional view in the channel length direction, the region 828f is provided between the region 828a and the region 828b, and the region 828g is provided between the region 828a and the region 828c. The regions 828f and 828g have lower concentration of an impurity element and higher resistivity than the regions 828b and 828c. Although the regions 828f and 828g overlap with the insulating film 837 in this case, they may overlap with the insulating film 837 and the conductive film 840.

Note that in FIGS. 38C to 38F, the transistor illustrated in FIG. 38A is described; however, the transistor illustrated in FIG. 38B can employ any of the structures in FIGS. 38C to 38F as appropriate.

Figure 39A:
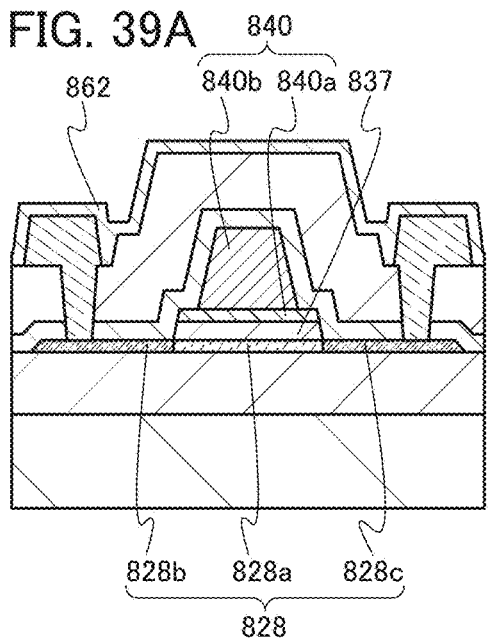
FIGS. 39A to 39E are each a cross-sectional view illustrating a transistor.

In the transistor illustrated in FIG. 39A, the conductive film 840 has a stacked structure including a conductive film 840a in contact with the insulating film 837 and a conductive film 840b in contact with the conductive film 840a. The end portion of the conductive film 840a is positioned on an outer side than the end portion of the conductive film 840b. In other words, the conductive film 840a has such a shape that the end portion extends beyond the end portion of the conductive film 840b.

Next, modification examples of the regions 828b and 828c are described. Note that FIGS. 39B to 39E are each an enlarged view in the vicinity of the oxide semiconductor layer 828 illustrated in FIG. 39A.

Figure 39B:
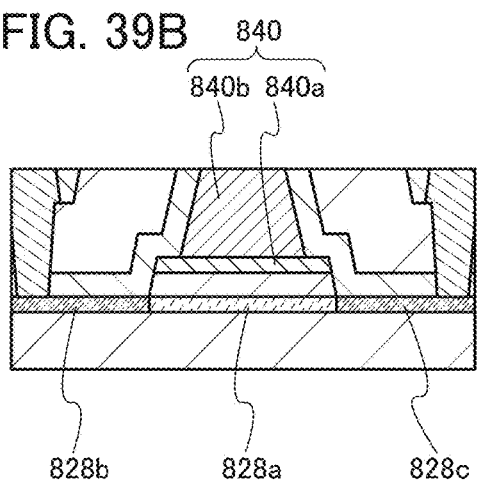

As illustrated in FIG. 39B in a cross-sectional view in the channel length direction, the boundaries between the region 828a and the regions 828b and 828c are aligned or substantially aligned with the end portion of the conductive film 840a in the conductive film 840 with the insulating film 837 interposed therebetween. In other words, seen in the top view, the boundaries between the region 828a and the regions 828b and 828c are aligned or substantially aligned with the end portion of the conductive film 840.

Figure 39C:
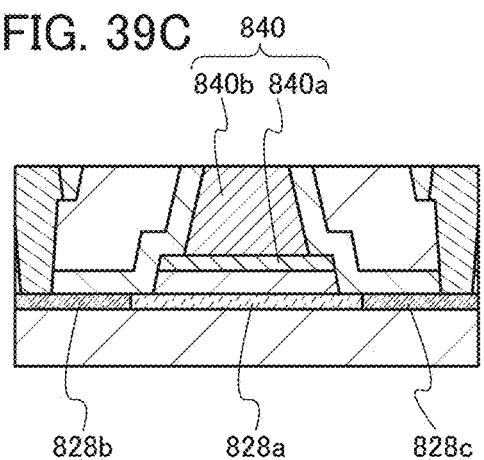

As illustrated in FIG. 39C in a cross-sectional view in the channel length direction, the region 828a has a region that does not overlap with the conductive film 840. The region functions as an offset region. The structure may have such a structure that, seen in the top view, the end portions of the regions 828b and 828c are aligned or substantially aligned with the end portion of the insulating film 837 and do not overlap with the end portion of the conductive film 840.

Figure 39D:
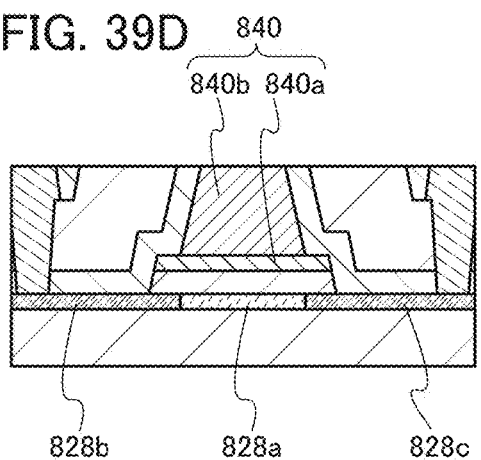

As illustrated in FIG. 39D in a cross-sectional view in the channel length direction, the regions 828b and 828c each have a region overlapping with the conductive film 840, specifically the conductive film 840a. Such a region is referred to as an overlap region. In other words, seen in a top view, the end portions of the regions 828b and 828c overlap with the conductive film 840a.

Figure 39E:
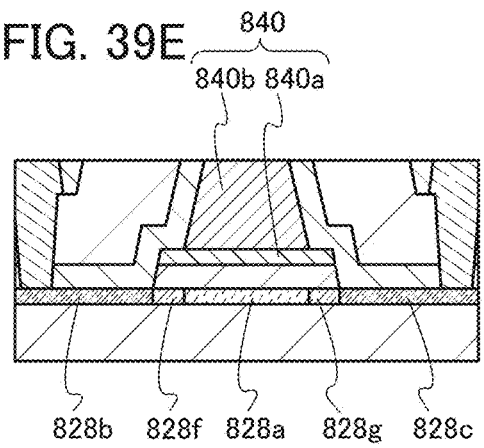

As illustrated in FIG. 39E in a cross-sectional view in the channel length direction, the region 828f is provided between the region 828a and the region 828b, and the region 828g is provided between the region 828a and the region 828c. The impurity element is added to the regions 828f and 828g through the conductive film 840a; thus, the regions 828f and 828g have lower concentration of impurity element and higher resistivity than the regions 828b and 828c. Although the regions 828f and 828g overlap with the conductive film 840a, they may overlap with both the conductive film 840a and the conductive film 840b.

The end portion of the insulating film 837 may be positioned on the outer side than the end portion of the conductive film 840a.

Alternatively, the side surface of the insulating film 837 may be curved.

Alternatively, the insulating film 837 may have a tapered shape. In other words, an angle formed between a surface where the oxide semiconductor layer 828 and the insulating film 837 are in contact with each other and a side surface of the insulating film 837 may be less than 90°, preferably greater than or equal to 30° and less than 90°.

As described with FIGS. 39A to 39E, the oxide semiconductor layer 828 includes the regions 828f and 828g having lower concentration of an impurity element and higher resistivity than the regions 828b and 828c, whereby the electric field of the drain region can be relaxed. Thus, a deterioration of the transistor due to the electric field of the drain region, such as a shift of the threshold voltage of the transistor, can be inhibited.

This embodiment can be implemented in an appropriate combination with any of the structures described in the other embodiments.

EXPLANATION OF REFERENCE

101: structure body, 101a: rotator, 101b: member, 102: trigger, 103: processed member, 103a: member, 103b: member, 104: portion, 105: stage, 107: guide, 108: arrow, 109: rotation axis, 111: member, 151: structure body, 152: structure body, 153: processed member, 153*a*: member, 153*b*: member, 155: stage, 156: stage, 157: support, 158: transfer roller, 159: rotation axis, 160: gate insulating film, 161: member, 162: trigger, 170: gate electrode layer, 190: transistor, 194: transistor, 300: display device, 300*a*: display device, 300*b*: display device, 301: flexible substrate, 302: pixel portion, 304: circuit portion, 305: circuit portion, 307: flexible substrate, 308: FPC terminal portion, 310: signal line, 311: wiring portion, 312: sealant, 316: FPC, 318*a*: bonding layer, 318*b*: bonding layer, 320*a*: organic resin layer, 320*b*: organic resin layer, 321*a*: insulating film, 321*b*: insulating film, 334: insulating film, 336: coloring layer, 338: light-blocking layer, 350: transistor, 352: transistor, 360: connection electrode, 364: insulating film, 366: insulating film, 368: insulating film, 370: planarization insulating film, 372: conductive film, 374: conductive film, 375: liquid crystal element, 376: liquid crystal layer, 378: spacer, 380: anisotropic conductive film, 400: display device, 408: FPC, 410: element layer, 411: element layer, 430: insulating film, 432: sealing layer, 434: insulating film, 444: conductive film, 446: EL layer, 448: conductive film, 462: substrate, 463: substrate, 468: ultraviolet light, 480: light-emitting element, 501: pixel circuit, 502: pixel portion, 504: driver circuit portion, 504*a*: gate driver, 504*b*: source driver, 506: protection circuit, 507: terminal portion, 550: transistor, 552: transistor, 554: transistor, 560: capacitor, 562: capacitor, 570: liquid crystal element, 572: light-emitting element, 600: excimer laser device, 610*a*: laser light, 610*b*: laser light, 610*c*: laser light, 610*d*: linear beam, 630: optical system, 650: mirror, 670: lens, 700: processing object, 710: processing region, 720: substrate, 801: resist mask, 802: resist mask, 803: resist mask, 810: impurity, 821: substrate, 824: insulating film, 828: oxide semiconductor layer, 828*a*: region, 828*b*: region, 828*c*: region, 828*d*: region, 828*e*: region, 828*f*: region, 828*g*: region, 828*h*: region, 828*i*: region, 837: insulating film, 840: conductive film, 840*a*: conductive film, 840*b*: conductive film, 846: insulating film, 847: insulating film, 856: conductive film, 857: conductive film, 862: insulating film, 900: substrate, 910: organic resin layer, 915: insulating film, 920: gate electrode layer, 921: conductive film, 930: gate insulating film, 931: insulating film, 932: insulating film, 933: insulating film, 935: insulating layer, 940: oxide semiconductor layer, 940*a*: oxide semiconductor film, 940*b*: oxide semiconductor film, 940*c*: oxide semiconductor film, 941*a*: oxide semiconductor layer, 941*b*: oxide semiconductor layer, 942*a*: oxide semiconductor layer, 942*b*: oxide semiconductor layer, 942*c*: oxide semiconductor layer, 943*a*: oxide semiconductor layer, 950: source electrode layer, 951: source region, 960: drain electrode layer, 961: drain region, 970: insulating film, 975: insulating film, 980: insulating film, 990: insulating film, 7100: mobile phone, 7101: housing, 7102: display portion, 7103: operation button, 7104: external connection port, 7105: speaker, 7106: microphone, 7107: camera, 7108: icon, 7200: portable information terminal, 7201: housing, 7202: display portion, 7203: band, 7204: buckle, 7205: operation button, 7206: input output terminal, 7207: icon, 7300: display device, 7301: housing, 7302: display portion, 7303: operation button, 7304: display portion pull, 7305: control portion, 5100: pellet, 5100*a*: pellet, 5100*b*: pellet, 5101: ion, 5102: zinc oxide layer, 5103: particle, 5105*a*: pellet, 5105*a*1: region, 5105*a*2: pellet, 5105*b*: pellet, 5105*c*: pellet, 5105*d*: pellet, 5105*d*1: region, 5105*e*: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, 8011: battery This application is based on Japanese Patent Application serial no. 2013-249631 filed with Japan Patent Office on Dec. 2, 2013, Japanese Patent Application serial no. 2013-256872 filed with Japan Patent Office on Dec. 12, 2013, Japanese Patent Application serial no. 2013-272176 filed with Japan Patent Office on Dec. 27, 2013, and Japanese Patent Application serial no. 2014-047348 filed with Japan Patent Office on Mar. 11, 2014, the entire contents of which are hereby incorporated by reference.

What is claimed is:

1. A method for manufacturing a display device, the method comprising the steps of:
    forming a first organic resin layer over a first substrate;
    forming a first insulating film over the first organic resin layer;
    forming a transistor comprising a channel formation region over the first insulating film, the channel formation region comprising an oxide semiconductor material;
    forming a second insulating film over the transistor;
    forming a light emitting element over the second insulating film, the light emitting element being electrically connected to the transistor;
    disposing a second substrate over the light emitting element, the second substrate being provided with a second organic resin layer so that the second organic resin layer is disposed between the light emitting element and the second substrate;
    irradiating the first organic resin layer with a first laser through the first substrate;
    separating the first substrate from the first organic resin layer after the irradiation with the first laser;
    bonding a first flexible substrate and the first organic resin layer after separating the first substrate from the first organic resin layer;
    irradiating the second organic resin layer with a second laser through the second substrate;
    separating the second substrate from the second organic resin layer after the irradiation with the second laser; and
    bonding a second flexible substrate and the second organic resin layer after separating the second substrate from the second organic resin layer.

2. The method for manufacturing a display device according to claim 1,
    wherein each of the first organic resin layer and the second organic resin layer comprises at least one of an epoxy resin, an acrylic resin, a polyimide resin, a polyimide resin, and a polyamide-imide resin.

3. The method for manufacturing a display device according to claim 1,
    wherein each of the first organic resin layer and the second organic resin layer is formed by using any one of a spin coating method, a dip coating method, and a doctor blade method.

4. The method for manufacturing a display device according to claim 1,
    wherein each of the first laser and the second laser is emitted from an excimer laser device.

5. The method for manufacturing a display device according to claim 1,
    wherein the first substrate is moved in one direction while irradiating the first organic resin layer with the first laser.

6. The method for manufacturing a display device according to claim 1,
wherein the oxide semiconductor material comprises indium and zinc.

7. The method for manufacturing a display device according to claim 1,
wherein the channel formation region comprises a crystalline region.

8. The method for manufacturing a display device according to claim 1,
wherein the step of bonding the first flexible substrate and the first organic resin layer is performed by using a bonding layer, and
wherein the bonding layer comprises any one of an epoxy resin, an acrylic resin, a silicone resin, and a phenol resin.

9. The method for manufacturing a display device according to claim 1,
wherein the light emitting element is an organic EL element.

10. A method for manufacturing a display device, the method comprising the steps of:
forming a first organic resin layer over a first substrate;
forming a first insulating film over the first organic resin layer;
forming a transistor comprising a channel formation region over the first insulating film, the channel formation region comprising an oxide semiconductor material;
forming a second insulating film over the transistor;
forming a light emitting element over the second insulating film, the light emitting element being electrically connected to the transistor;
disposing a second substrate over the light emitting element, the second substrate being provided with a second organic resin layer so that the second organic resin layer is disposed between the light emitting element and the second substrate;
irradiating the first organic resin layer with a first ultraviolet light through the first substrate;
separating the first substrate from the first organic resin layer after the irradiation with the first ultraviolet light;
bonding a first flexible substrate and the first organic resin layer after separating the first substrate from the first organic resin layer;
irradiating the second organic resin layer with a second ultraviolet light through the second substrate;
separating the second substrate from the second organic resin layer after the irradiation with the second ultraviolet light; and
bonding a second flexible substrate and the second organic resin layer after separating the second substrate from the second organic resin layer,
wherein each of the first organic resin layer and the second organic resin layer comprises at least one of an epoxy resin, an acrylic resin, a polyimide resin, a polyamide resin, and a polyamide-imide resin, and
wherein a thickness of each of the first organic resin layer and the second organic resin layer is less than or equal to 20 µm.

11. The method for manufacturing a display device according to claim 10,
wherein each of the first organic resin layer and the second organic resin layer is formed by using any one of a spin coating method, a dip coating method, and a doctor blade method.

12. The method for manufacturing a display device according to claim 10,
wherein each of the first ultraviolet light and the second ultraviolet light is emitted from an excimer laser device.

13. The method for manufacturing a display device according to claim 10,
wherein the first substrate is moved in one direction while irradiating the first organic resin layer with the first ultraviolet light.

14. The method for manufacturing a display device according to claim 10,
wherein the oxide semiconductor material comprises indium and zinc.

15. The method for manufacturing a display device according to claim 10,
wherein the channel formation region comprises a crystalline region.

16. The method for manufacturing a display device according to claim 10,
wherein the step of bonding the first flexible substrate and the first organic resin layer is performed by using a bonding layer, and
wherein the bonding layer comprises any one of an epoxy resin, an acrylic resin, a silicone resin, and a phenol resin.

17. The method for manufacturing a display device according to claim 10,
wherein the light emitting element is an organic EL element.

18. A method for manufacturing a display device, the method comprising the steps of:
forming an organic resin layer over a substrate;
forming an insulating film over the organic resin layer;
forming a transistor comprising a channel formation region over the insulating film, the channel formation region comprising an oxide semiconductor layer over the insulating film; and
reducing adhesion between the organic resin layer and the substrate by irradiating the organic resin layer with a linear beam through the substrate,
wherein a thickness of the organic resin layer is less than or equal to 20 µm.

19. The method for manufacturing a display device according to claim 18,
wherein the substrate is separated from the organic resin layer by reducing adhesion between the organic resin layer and the substrate.

20. The method for manufacturing a display device according to claim 18,
wherein the organic resin layer comprises at least one of an epoxy resin, an acrylic resin, a polyimide resin, a polyamide resin, and a polyamide-imide resin.

21. The method for manufacturing a display device according to claim 18,
wherein the oxide semiconductor layer comprises indium and zinc.

22. The method for manufacturing a display device according to claim 18,
wherein the linear beam is emitted from an excimer laser device.

23. The method for manufacturing a display device according to claim 18,
wherein the substrate is moved in one direction while irradiating the organic resin layer with the linear beam.

24. The method for manufacturing a display device according to claim 18, further comprising a light emitting element over the oxide semiconductor layer,
wherein the light emitting element is an organic EL element.

25. A method for manufacturing a display device, the method comprising the steps of:
forming an organic resin layer over a substrate;
forming an insulating film over the organic resin layer;
forming an element layer over the insulating film;
extending a laser light by an optical system;
condensing the laser light to form a linear beam;
irradiating an interface as a processing region with the linear beam through the substrate, the interface being between the organic resin layer and the substrate;
moving the substrate relative to the linear beam during irradiation with the linear beam; and
separating the substrate from the organic resin layer.

26. The method for manufacturing a display device according to claim 25,
wherein the organic resin layer comprises at least one of an epoxy resin, an acrylic resin, a polyimide resin, a polyamide resin, and a polyamide-imide resin.

27. The method for manufacturing a display device according to claim 25,
wherein a thickness of the organic resin layer is less than or equal to 20 μm.

28. The method for manufacturing a display device according to claim 25,
wherein the insulating film is a single layer or a stacked layer comprising at least one of a silicon oxide film, a silicon oxynitride film, a silicon nitride film, and a silicon nitride oxide film.

29. The method for manufacturing a display device according to claim 25,
wherein the laser light is emitted from an excimer laser device.

30. The method for manufacturing a display device according to claim 25,
wherein the substrate is moved in one direction while irradiating the organic resin layer with the linear beam.

31. The method for manufacturing a display device according to claim 25, further comprising a light emitting element over the organic resin layer,
wherein the light emitting element is an organic EL element.

32. The method for manufacturing a display device according to claim 25, wherein the substrate is a glass substrate.

33. A method for manufacturing a display device, the method comprising the steps of:
forming an organic resin layer over a substrate;
forming an insulating film over the organic resin layer;
forming an element layer over the insulating film;
extending a laser light by an optical system;
condensing the laser light to form a linear beam;
irradiating a processing region including an interface between the organic resin layer and the substrate with the linear beam through the substrate;
moving the substrate relative to the linear beam during irradiation with the linear beam; and
separating the substrate from the organic resin layer at the interface between the organic resin layer and the substrate and/or a vicinity of the interface.

34. The method for manufacturing a display device according to claim 33,
wherein the organic resin layer comprises at least one of an epoxy resin, an acrylic resin, a polyimide resin, a polyamide resin, and a polyamide-imide resin.

35. The method for manufacturing a display device according to claim 33,
wherein a thickness of the organic resin layer is less than or equal to 20 μm.

36. The method for manufacturing a display device according to claim 33,
wherein the insulating film is a single layer or a stacked layer comprising at least one of a silicon oxide film, a silicon oxynitride film, a silicon nitride film, and a silicon nitride oxide film.

37. The method for manufacturing a display device according to claim 33,
wherein the laser light is emitted from an excimer laser device.

38. The method for manufacturing a display device according to claim 33,
wherein the substrate is moved in one direction while irradiating the organic resin layer with the linear beam.

39. The method for manufacturing a display device according to claim 33, further comprising a light emitting element over the organic resin layer,
wherein the light emitting element is an organic EL element.

40. The method for manufacturing a display device according to claim 33, wherein the substrate is a glass substrate.

41. A method for manufacturing a display device, the method comprising the steps of:
forming an organic resin layer over a substrate;
forming an insulating film over the organic resin layer;
forming an element layer over the insulating film;
extending a laser light by an optical system;
condensing the laser light to form a linear beam;
irradiating an interface as a processing region with the linear beam through the substrate, the interface being between the organic resin layer and the substrate;
moving the substrate relative to the linear beam during irradiation with the linear beam; and
separating the substrate from the organic resin layer so that a portion of the organic resin layer remains on the substrate.

42. The method for manufacturing a display device according to claim 41,
wherein the organic resin layer comprises at least one of an epoxy resin, an acrylic resin, a polyimide resin, a polyamide resin, and a polyamide-imide resin.

43. The method for manufacturing a display device according to claim 41,
wherein a thickness of the organic resin layer is less than or equal to 20 μm.

44. The method for manufacturing a display device according to claim 41,
wherein the insulating film is a single layer or a stacked layer comprising at least one of a silicon oxide film, a silicon oxynitride film, a silicon nitride film, and a silicon nitride oxide film.

45. The method for manufacturing a display device according to claim 41,
wherein the laser light is emitted from an excimer laser device.

46. The method for manufacturing a display device according to claim 41,
wherein the substrate is moved in one direction while irradiating the organic resin layer with the linear beam.

47. The method for manufacturing a display device according to claim 41, further comprising a light emitting element over the organic resin layer,
wherein the light emitting element is an organic EL element.

48. The method for manufacturing a display device according to claim 41, wherein the substrate is a glass substrate.

49. A method for manufacturing a display device, the method comprising the steps of:
forming an organic resin layer over a substrate;
forming an insulating film over the organic resin layer;
forming an element layer over the insulating film;
condensing a laser light to form a linear beam;
irradiating a processing region including an interface between the organic resin layer and the substrate with the linear beam through the substrate;
moving the substrate relative to the linear beam during irradiation with the linear beam; and
separating the substrate from the organic resin layer,
wherein the element layer comprises an oxide semiconductor layer comprising a channel formation region, and
wherein the channel formation region comprises an oxide semiconductor material.

50. The method for manufacturing a display device according to claim 49,
wherein the organic resin layer comprises at least one of an epoxy resin, an acrylic resin, a polyimide resin, a polyamide resin, and a polyamide-imide resin.

51. The method for manufacturing a display device according to claim 49,
wherein a thickness of the organic resin layer is less than or equal to 20 μm.

52. The method for manufacturing a display device according to claim 49,
wherein the insulating film is a single layer or a stacked layer comprising at least one of a silicon oxide film, a silicon oxynitride film, a silicon nitride film, and a silicon nitride oxide film.

53. The method for manufacturing a display device according to claim 49,
wherein the laser light is emitted from an excimer laser device.

54. The method for manufacturing a display device according to claim 49,
wherein the substrate is moved in one direction while irradiating the organic resin layer with the linear beam.

55. The method for manufacturing a display device according to claim 49, further comprising a light emitting element over the organic resin layer,
wherein the light emitting element is an organic EL element.

56. The method for manufacturing a display device according to claim 49, wherein the substrate is a glass substrate.

* * * * *

UNITED STATES PATENT AND TRADEMARK OFFICE
CERTIFICATE OF CORRECTION

PATENT NO. : 9,559,316 B2  
APPLICATION NO. : 15/145246  
DATED : January 31, 2017  
INVENTOR(S) : Shunpei Yamazaki et al.

Page 1 of 1

It is certified that error appears in the above-identified patent and that said Letters Patent is hereby corrected as shown below:

At Column 8, Line 10, "display that" should be --display device 300 that--;

At Column 50, Line 3, "(03)" should be --($O_3$)--;

At Column 52, Line 27, "2θ is" should be --2θ is--;

At Column 52, Line 28, "2θ of" should be --2θ of--;

At Column 52, Line 29, "2θ at" should be --2θ at--;

At Column 52, Line 32, "2θ is" should be --2θ is--;

In Claim 2, at Column 68, Line 52, "polyimide resin, and" should be --polyamide resin, and--.

Signed and Sealed this  
Sixth Day of June, 2017

Michelle K. Lee  
*Director of the United States Patent and Trademark Office*